United States Patent
Kanda et al.

(10) Patent No.: US 8,871,421 B2
(45) Date of Patent: Oct. 28, 2014

(54) POSITIVE RESIST COMPOSITION AND METHOD OF PATTERN FORMATION WITH THE SAME

(75) Inventors: Hiromi Kanda, Shizuoka (JP);
Schinichi Kanna, Shizuoka (JP);
Haruki Inabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 534 days.

(21) Appl. No.: 11/492,123

(22) Filed: Jul. 25, 2006

(65) Prior Publication Data

US 2007/0178405 A1    Aug. 2, 2007

(30) Foreign Application Priority Data

| Jul. 26, 2005 | (JP) | ................... P2005-215412 |
| Dec. 9, 2005 | (JP) | ................... P2005-356714 |
| Jan. 16, 2006 | (JP) | ................... P2006-007762 |
| Apr. 10, 2006 | (JP) | ................... P2006-107727 |
| Jul. 21, 2006 | (JP) | ................... P2006-198897 |

(51) Int. Cl.
*G03F 7/004* (2006.01)
*G03F 7/028* (2006.01)

(52) U.S. Cl.
USPC ........................ 430/270.1; 430/913

(58) Field of Classification Search
USPC .............................. 430/270.1, 322
See application file for complete search history.

(56) References Cited

U.S. PATENT DOCUMENTS

| 5,665,527 | A | 9/1997 | Allen et al. | |
| 7,531,287 | B2* | 5/2009 | Kanda et al. ............... | 430/270.1 |
| 8,012,665 | B2* | 9/2011 | Kodama et al. ............ | 430/270.1 |
| 2001/0038969 | A1 | 11/2001 | Hatakeyama et al. | |
| 2002/0051936 | A1 | 5/2002 | Harada et al. | |
| 2002/0081520 | A1 | 6/2002 | Sooriyakumaran | |
| 2003/0099901 | A1 | 5/2003 | Hatakeyama et al. | |
| 2003/0129531 | A1 | 7/2003 | Oberlander et al. | |
| 2003/0129831 | A1 | 7/2003 | Hu | |
| 2003/0171490 | A1 | 9/2003 | Breyta et al. | |
| 2004/0048190 | A1* | 3/2004 | Momota ..................... | 430/270.1 |
| 2004/0191676 | A1* | 9/2004 | Nakao et al. ............... | 430/270.1 |
| 2005/0069819 | A1 | 3/2005 | Shiobara | |

(Continued)

FOREIGN PATENT DOCUMENTS

| EP | 1 126 322 A2 | 8/2001 |
| EP | 1341038 A2 * | 9/2003 |
| EP | 1 557 718 A1 | 7/2005 |
| EP | 1720072 A1 | 11/2006 |

(Continued)

OTHER PUBLICATIONS

European Search Report dated Jun. 23, 2009.

(Continued)

*Primary Examiner* — Amanda C. Walke
(74) *Attorney, Agent, or Firm* — Sughrue Mion, PLLC

(57) ABSTRACT

A positive resist composition comprising: (A) a resin which comes to have an enhanced solubility in an alkaline developing solution by an action of an acid; (B) a compound which generates an acid upon irradiation with actinic rays or a radiation; (C) a fluorine-containing compound containing at least one group selected from the groups (x) to (z); and (F) a solvent, and a method of pattern formation with the composition: (x) an alkali-soluble group; (y) a group which decomposes by an action of an alkaline developing solution to enhance a solubility in an alkaline developing solution; and (z) a group which decomposes by an action of an acid.

66 Claims, 2 Drawing Sheets

DYNAMIC CONTACT ANGLE

STATIC CONTACT ANGLE

(56) References Cited

U.S. PATENT DOCUMENTS

| | | | |
|---|---|---|---|
| 2005/0186503 A1* | 8/2005 | Nishiyama et al. | 430/270.1 |
| 2005/0260523 A1* | 11/2005 | Juan et al. | 430/270.1 |
| 2006/0057489 A1* | 3/2006 | Sumida et al. | 430/270.1 |
| 2006/0078823 A1* | 4/2006 | Kanda et al. | 430/270.1 |
| 2006/0246373 A1* | 11/2006 | Wang | 430/270.1 |
| 2007/0254235 A1 | 11/2007 | Allen et al. | |

FOREIGN PATENT DOCUMENTS

| | | |
|---|---|---|
| EP | 1 739 483 A2 | 1/2007 |
| JP | 57-153433 A | 9/1982 |
| JP | 7-220990 A | 8/1995 |
| JP | 9-43848 A | 2/1997 |
| JP | 2003-292716 A | 10/2003 |
| JP | 2004-4697 A | 1/2004 |
| JP | 2004-61857 A | 2/2004 |
| JP | 2005-43852 A | 2/2005 |
| JP | 2005 128146 A | 5/2005 |
| JP | 2005-146252 A | 6/2005 |
| JP | 2005 173468 A | 6/2005 |
| JP | 2006 063025 A | 3/2006 |
| JP | 2006-309245 A | 11/2006 |
| KR | 10-2004-0002450 A | 1/2004 |
| WO | 02/44811 A2 | 6/2002 |
| WO | WO 02/077710 A2 | 10/2002 |
| WO | 03/102694 A1 | 12/2003 |
| WO | WO 2004/040376 A1 | 5/2004 |
| WO | WO 2004053593 A2 | 6/2004 |
| WO | WO 2004/068242 A1 | 8/2004 |
| WO | 2004/074937 A1 | 9/2004 |
| WO | WO 2004/077158 A1 | 9/2004 |
| WO | WO 2004/088428 A1 | 10/2004 |
| WO | 2005/108444 A1 | 11/2005 |

OTHER PUBLICATIONS

European Search Report dated Jun. 26, 2009.
Office Action dated Mar. 8, 2011 on Japanese Patent Application No. 2006-198897.
Partial European Search Report dated Jan. 17, 2007.
Office Action dated Jul. 3, 2012 in Japanese Application No. 2011-103878.
Office Action dated Jul. 3, 2012 in Japanese Application No. 2011-103879.
Communication dated Dec. 14, 2011, issued by the European Patent Office in corresponding European Patent Application No. 08 165 714.0.
S. Takechi et al, Impact of 2-Methyl-2-Adamantyl Group Used for 193-nm Single-Layer Resist, Journal of Photopolymer Science and Technology, vol. 9. No. 3, pp. 475-488 (1996).
Office Action dated Apr. 25, 2013 from the Korean Intellectual Property Office in a counterpart Korean Application No. 10-2006-0070464.
Office Action dated Apr. 25, 2013 from the Korean Intellectual Property Office in a counterpart Korean Application No. 10-2013-0009521.
Office Action dated May 14, 2013, issued by the Taiwan Patent and Trademark Office in counterpart Taiwanese Patent Application No. 095126930.
European Search Report issued on Dec. 14, 2011 in the related European Patent Application No. 08165715.7.
Office Action dated Sep. 7, 2011 in European Application No. 06015449.9.
Office Action dated Nov. 26, 2012 in Korean Patent Application No. 10-2006-0070464.
Communication dated Feb. 28, 2014 from the Korean Intellectual Property Office in a counterpart Korean application No. 10-2013-0054371.
Office Action dated Dec. 26, 2013 from the Korean Intellectual Property Office in counterpart Korean Application No. 10-2013-0009521.
Office Action dated Dec. 26, 2013 from the Korean Intellectual Property Office in counterpart Korean Application No. 10-2006-0070464.
Office Action dated Jul. 14, 2014 in Taiwanese Patent Application No. 095126930.

* cited by examiner

US 8,871,421 B2

POSITIVE RESIST COMPOSITION AND METHOD OF PATTERN FORMATION WITH THE SAME

BACKGROUND OF THE INVENTION

1. Field of the Invention

The present invention relates to a positive resist composition for use in lithographic steps in the production of semiconductors, e.g., IC's, in the production of circuit boards for liquid crystals, thermal heads, etc., and in other photofabrication processes, and further relates to a method of pattern formation with the same. In particular, the invention relates to a positive resist composition suitable for exposure with an immersion type projection exposure apparatus employing far ultraviolet rays having a wavelength of 300 nm or shorter as an exposure light, and to a method of pattern formation with the composition.

2. Description of the Related Art

With the trend toward size reduction in semiconductor elements, the wavelengths of exposure lights are decreasing and the numerical apertures (NA) of projection lenses are increasing. An exposure apparatus which has an NA of 0.84 and employs an ArF excimer laser having a wavelength of 193 nm as a light source has been developed so far. As is generally well known, resolution and focal depth can be expressed by the following equations:

(Resolution)=$k_1 \cdot (\lambda/NA)$ (Focal depth)=$\pm k_2 \cdot \lambda/NA^2$ wherein $\lambda$ is the wavelength of the exposure light, NA is the numerical aperture of the projection lens; and $k_1$ and $k_2$ are coefficients relating to the process.

An exposure apparatus employing an $F_2$ excimer laser having a wavelength of 157 nm as a light source is being investigated for the purpose of enhancing resolution by using a shorter wavelength. However, use of this apparatus is disadvantageous in that materials for the lens to be used in the exposure apparatus and materials for resists are considerably limited due to the use of such a shorter wavelength. Because of this, the cost of apparatus and material production is high and it is exceedingly difficult to stabilize quality. There is hence a possibility that an exposure apparatus and a resist which have sufficient performances and stability might be not available in a desired period.

The so-called immersion method has been known as a technique for enhancing resolution in examinations with optical microscopes. In this method, the space between the projection lens and the sample is filled with a liquid having a high refractive index (hereinafter referred to also as "immersion liquid").

This "immersion" has the following effects. In the immersion, the resolution and the focal depth can be expressed by the following equations on the assumption that $NA_0 = \sin \theta$:

(Resolution)=$k_1 \cdot (\lambda_0/n)/NA_0$ (Focal depth)=$\pm k_2 \cdot (\lambda_0/n)/NA_0^2$ wherein $\lambda_0$ is the wavelength of the exposure light in air; n is the refractive index of the immersion liquid relative to that of air; and $\theta$ is the convergence half angle of the light.

Namely, the immersion produces the same effect as the use of an exposure light having a wavelength reduced to 1/n. In other words, in the case of an optical projection system having the same NA, the focal depth can be increased to n times by the immersion. This is effective in all pattern shapes and can be used in combination with a super resolution technique such as the phase shift method or deformation illumination method which is being investigated at present.

Examples of apparatus in which this effect is applied to the transfer of fine image patterns for semiconductor elements are shown in JP-A-57-153433, JP-A-7-220990, etc.

Recent progress in the immersion exposure technique is reported in *SPIE Proc*, 4688, 11(2002), *J. Vac. Sci. Technol.*, B 17(1999), *SPIE Proc.*, 3999, 2(2000), International Publication WO 2004-077158, pamphlet, etc. In the case where an ArF excimer laser is used as a light source, pure water (refractive index at 193 nm, 1.44) is thought to be most promising from the standpoints of safety in handling and transmittance and refractive index at 193 nm. Although solutions containing fluorine are being investigated for use in the case of using an $F_2$ excimer laser as a light source from the standpoint of a balance between transmittance and refractive index at 157 nm, no immersion liquid has been found which is sufficient from the standpoints of environmental safety and refractive index. In view of the degree of the effect of the immersion and the degree of completion of resists, the technique of immersion exposure is thought to be employed first in ArF exposure apparatus.

Since the advent of resists for KrF excimer lasers (248 nm), the technique of image formation called chemical amplification has been used as a resist image formation method for compensating for a sensitivity decrease caused by light absorption. For example, the chemical amplification type method for forming a positive image comprises exposing a resist film to light to thereby cause an acid generator in the exposed areas to decompose and generate an acid, subjecting the resist film to post-exposure bake (PEB) to utilize the resultant acid as a reaction catalyst to convert alkali-insoluble groups into alkali-soluble groups, and removing the exposed areas by alkali development.

Resists for an ArF excimer laser (wavelength, 193 nm) which work by the chemical amplification mechanism are coming to be mainly used presently. However, use of these resists has a problem that a line pattern formed falls to give defects in device production. An improvement in this respect has been desired.

It has been pointed out that application of a chemical amplification type resist to immersion exposure arouses troubles that since the resist layer is in contact with an immersion liquid during exposure, the resist layer alters and that components which exert an adverse influence on the immersion liquid are released from the resist layer. International Publication WO 2004-068242, pamphlet described an example in which a resist for ArF exposure changes in resist performance upon immersion in water before and after exposure. It is pointed out therein that this change is a problem in immersion exposure.

In the case where exposure in an immersion exposure process is conducted with a scanning type immersion exposure machine, the immersion liquid should follow the movement of the lens. However, in case where the immersion liquid does not follow the lens, there is a fear that the speed of exposure may decrease to influence productivity. When the immersion liquid is water, the resist film desirably is hydrophobic because water on a hydrophobic resist film is more satisfactory in following-up properties. However, impartation of hydrophobicity to a resist film, on the other hand, results in adverse influences on the image-forming performance of the resist, such as an increased scum amount. An improvement in this respect has been desired.

SUMMARY OF THE INVENTION

An object of the invention is to provide a positive resist composition improved in pattern profile and pattern falling and inhibited from generating a scum. Other objects of the invention are to provide a positive resist composition which is satisfactory in the receding contact angle of an immersion liquid and is suitable also for immersion exposure and to provide a method of pattern formation with this composition.

The invention provides a positive resist composition having the following constitutions and a method of pattern formation with the same. Those objects of the invention are accomplished with these.

(1) A positive resist composition comprising:

(A) a resin which comes to have an enhanced solubility in an alkaline developing solution by an action of an acid;

(B) a compound which generates an acid upon irradiation with actinic rays or a radiation;

(C) a fluorine-containing compound containing at least one group selected from the groups (x) to (z):

(x) an alkali-soluble group;

(y) a group which decomposes by an action of an alkaline developing solution to enhance a solubility in an alkaline developing solution; and (z) a group which decomposes by an action of an acid; and (F) a solvent.

(2) The positive resist composition as described in (1) above, wherein the fluorine-containing compound (C) is an alkali-soluble compound containing an alkyl group having a fluorine atom and 1 to 4 carbon atoms, a cycloalkyl group having a fluorine atom or an aryl group having a fluorine atom.

(3) The positive resist composition as described in (1) or (2) above, wherein the fluorine-containing compound (C) has an alcoholic hydroxyl group, and an alcohol moiety for the alcoholic hydroxyl group is a fluorinated alcohol.

(4) The positive resist composition as described in any of (1) to (3) above, wherein the fluorine-containing compound (C) has a structure represented by formula (F3):

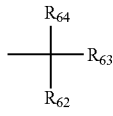

(F3)

wherein $R_{62}$ and $R_{63}$ each independently represents a fluoroalkyl group, provided that $R_{62}$ and $R_{63}$ may be bonded to each other to form a ring; and $R_{64}$ represents a hydrogen atom, a fluorine atom or an alkyl group.

(5) The positive resin composition as described in any of (1) to (4) above, wherein the group (y) which decomposes by an action of an alkaline developing solution to enhance a solubility in an alkaline developing solution has a lactone structure.

(6) The positive resist composition as described in any of (1) to (5) above, wherein the fluorine-containing compound (C) is one of (C-1) to (C-13):

(C-1) a resin comprising:
a repeating unit (a) having a fluoroalkyl group; and
a repeating unit (X) containing an alkali-soluble group (x);

(C-2) a resin comprising:
a repeating unit (a) having a fluoroalkyl group; and
a repeating unit (Y) containing a group (y) decomposing by an action of an alkaline developing solution to enhance a solubility in an alkaline developing solution;

(C-3) a resin comprising:
a repeating unit (a) having a fluoroalkyl group; and
a repeating unit (Z) containing a group (z) decomposing by an action of an acid;

(C-4) a resin comprising:
a repeating unit (a) having a fluoroalkyl group;
a repeating unit (X) containing an alkali-soluble group (x); and
a repeating unit (Y) containing a group (y) decomposing by an action of an alkaline developing solution to enhance a solubility in an alkaline developing solution;

(C-5) a resin comprising:
a repeating unit (a) having a fluoroalkyl group;
a repeating unit (X) containing an alkali-soluble group (x); and
a repeating unit (Z) containing a group (z) decomposing by an action of an acid;

(C-6) a resin comprising:
a repeating unit (a) having a fluoroalkyl group;
a repeating unit (Y) containing a group (y) decomposing by an action of an alkaline developing solution to enhance a solubility in an alkaline developing solution; and
a repeating unit (Z) containing a group (z) decomposing by an action of an acid;

(C-7) a resin comprising:
a repeating unit (a) having a fluoroalkyl group;
a repeating unit (X) containing an alkali-soluble group (x);
a repeating unit (Y) containing a group (y) decomposing by an action of an alkaline developing solution to enhance a solubility in an alkaline developing solution; and
a repeating unit (Z) containing a group (z) decomposing by an action of an acid;

(C-8) a resin comprising:
a repeating unit (aX) containing both an alkali-soluble group (x) and a fluoroalkyl group;

(C-9) a resin comprising:
a repeating unit (bY) containing both a group (y) decomposing by an action of an alkaline developing solution to enhance a solubility in an alkaline developing solution and a fluoroalkyl group;

(C-10) a resin comprising:
a repeating unit (aX) containing both an alkali-soluble group (x) and a fluoroalkyl group having 1 to 4 carbon atoms; and
a repeating unit (Y) containing a group (y) decomposing by an action of an alkaline developing solution to enhance a solubility in an alkaline developing solution;

(C-11) a resin comprising:
a repeating unit (aX) containing both an alkali-soluble group (x) and a fluoroalkyl group; and
a repeating unit (Z) containing a group (z) decomposing by an action of an acid;

(C-12) a resin comprising:
a repeating unit (a) having a fluoroalkyl group; and
a repeating unit (aX) containing both an alkali-soluble group (x) and a fluoroalkyl group; and (C-13) a resin comprising:
a repeating unit (a) having a fluoroalkyl group; and
a repeating unit (aY) containing both a group (y) decomposing by an action of an alkaline developing solution to enhance a solubility in an alkaline developing solution and a fluoroalkyl group.

(7) The positive resist composition as described in any of (1) to (6) above, wherein the fluorine-containing compound (C) has a molecular weight of from 1,000 to 100,000.

(8) The positive resist composition as described in any of (1) to (7) above,
wherein an amount of the fluorine-containing compound (C) added is from 0.1 to 5% by mass.

(9) The positive resist composition as described in any of (1) to (8) above, which provides a film with which water has a receding contact angle of 65° or larger.

(10) The positive resist composition as described in any of (1) to (9) above, which provides a film with which water has a receding contact angle of 70° or larger.

(11) The positive resist composition as described in any of (1) to (10) above.
wherein the resin (A) contains a repeating unit having a polycyclic hydrocarbon group substituted by a hydroxyl group or a cyano group.

(12) The positive resist composition as described in any of (1) to (11) above,
wherein the resin (A) is a copolymer comprising at least three components: a (meth)acrylate repeating unit having a lactone ring; a (meth)acrylate repeating unit having an organic group having at least one of a hydroxyl group and a cyano group; and a (meth)acrylate repeating unit having an acid-decomposable group.

(13) The positive resist composition as described in any of (1) to (12) above,
wherein the resin (A) has no fluorine atom.

(14) The positive resist composition as described in any of (1) to (13) above,
wherein the compound (B) which generates an acid upon irradiation with actinic rays or a radiation is a compound which generates an acid having a fluoroalkyl chain or a benzenesulfonic acid having a fluorine atom upon irradiation with actinic rays.

(15) The positive resist composition as described in any of (1) to (14) above,
wherein the compound (B) which generates an acid upon irradiation with actinic rays or a radiation is a triphenylsulfonium salt compound having an alkyl or cycloalkyl residue which has not been substituted by fluorine in a cation part.

(16) The positive resist composition as described in any of (1) to (15) above,
wherein the solvent (F) is a mixed solvent comprising two or more solvents including propylene glycol monomethyl ether acetate.

(17) The positive resist composition as described in any of (1) to (16) above, which further comprises at least one of a fluorochemical surfactant and a silicone surfactant.

(18) The positive resist composition as described in any of (1) to (17) above, which has a total solid concentration of from 1.0 to 6.0% by mass.

(19) A method of pattern formation, which comprises:
forming a resist film from a positive resist composition as described in any of (1) to (18) above;
exposing the resist film to light; and
developing the resist film.

(20) The method of pattern formation as described in (19) above,
wherein the resist film is exposed to light having a wavelength of from 1 to 200 nm.

(21) The method of pattern formation as described in (19) or (20) above,
wherein the exposure is immersion exposure in which the resist film is exposed to light through an immersion liquid.

(22) A resin having structures represented by formulae (CI) to (CIII):

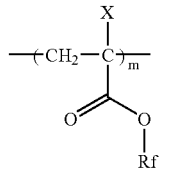
(CI)

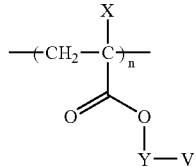
(CII)

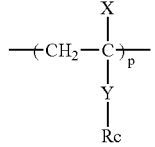
(CIII)

wherein X represents a hydrogen atom, a halogen atom or an alkyl group;

Rf represents an alkyl group having a fluorine atom, a cycloalkyl group having a fluorine atom or an aryl group having a fluorine atom;

Y represents an alkylene group, a di-valent connecting group having an alicyclic hydrocarbon structure, a single bond, an ether group, an ester group, a carbonyl group, a carboxyl group or a di-valent group obtained by these groups;

V represents a group having a lactone ring;

Rc represents an unsubstituted hydrocarbon group, provided that Rc does not contain a hetero-atom; and m, n and p each represents a numeral satisfying following relationships:
m+n+p=100, 0<m<100, 0<n<100 and 0≤p<100.

(23) A resin having structures represented by formulae (CI), (CIV) and (CIII):

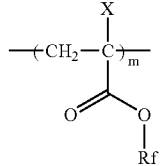
(CI)

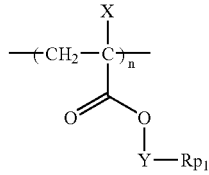
(CIV)

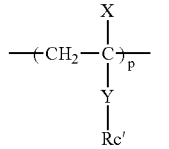
(CIII')

wherein X represents a hydrogen atom, a halogen atom or an alkyl group;

Rf represents an alkyl group having a fluorine atom, a cycloalkyl group having a fluorine atom or an aryl group having a fluorine atom;

Y represents an alkylene group, a di-valent connecting group having an alicyclic hydrocarbon structure, a single bond, an ether group, an ester group, a carbonyl group, a carboxyl group or a di-valent group obtained by these groups;

$Rp_1$ represents a group which decomposes by an action of an acid;

Rc represents an unsubstituted hydrocarbon group, provided that Rc does not contain a hetero-atom; and m, n and p each represents a numeral satisfying following relationships:

m+n+p=100, 0<m<100, 0<n<100 and 0≦p<100.

DETAILED DESCRIPTION OF THE INVENTION

Figure 1:
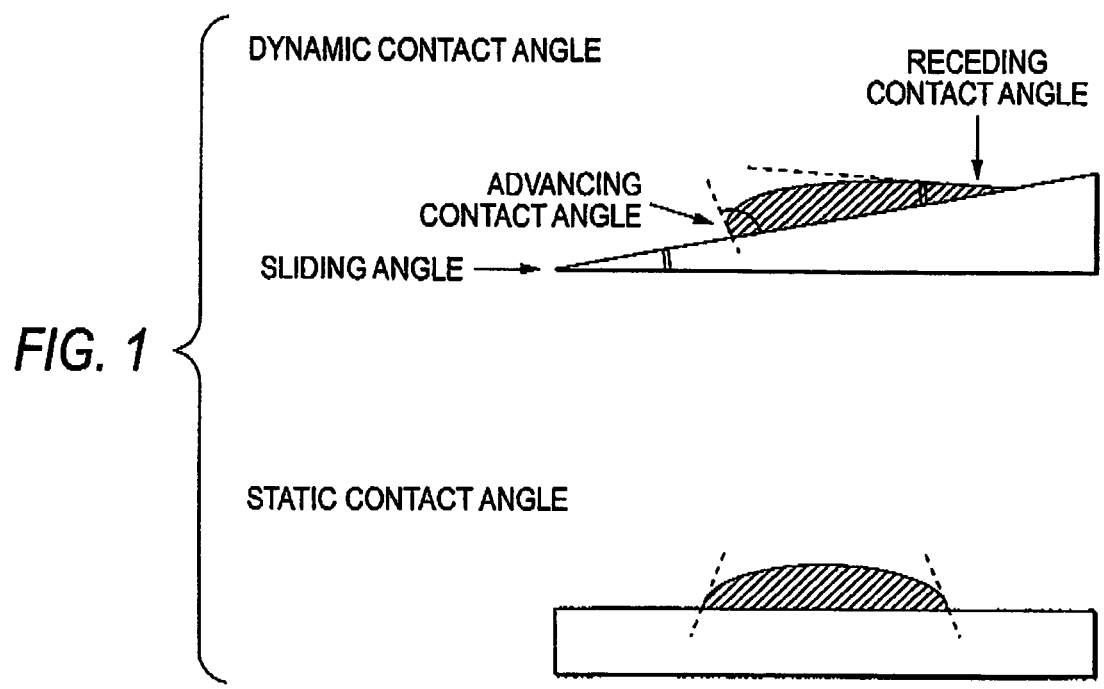
FIG. 1 is a diagrammatic view showing a receding contact angle.

The invention will be explained below in detail.

With respect to expressions of groups (atomic groups) in this specification, the expressions which include no statement as to whether the groups are substituted or unsubstituted imply both of groups having no substituents and groups having one or more substituents. For example, the term "alkyl group" implies not only an alkyl group having no substituents (unsubstituted alkyl group) but also an alkyl group having one or more substituents (substituted alkyl group).

(A) Resin Coming to Have Enhanced Solubility in Alkaline Developing Solution by Action of Acid The resist composition of the invention contains a resin which decomposes by the action of an acid to come to have enhanced solubility in an alkaline developing solution (acid-decomposable resin). This resin is one in which the main chain or side chains thereof or both the main chain and side chains thereof have groups (hereinafter referred to also as "acid-decomposable groups") which decompose by the action of an acid to generate alkali-soluble groups (this resin is hereinafter referred to also as "resin (A)"). The resin (A) preferably is an alicyclic-hydrocarbon-based acid-decomposable resin having an alicyclic hydrocarbon structure which is monocyclic or polycyclic.

Examples of the alkali-soluble groups include phenolic hydroxyl, carboxy, fluorinated alcohol, sulfo, sulfonamide, sulfonylimide, (alkylsulfonyl)(alkylcarbonyl)methylene, (alkylsulfonyl)(alkylcarbonyl)imide, bis(alkylcarbonyl)methylene, bis(alkylcarbonyl)imide, bis(alkylsulfonyl)methylene, bis(alkylsulfonyl)imide, and tris(alkylcarbonyl)methylene groups and groups having a tris(alkylsulfonyl)methylene group.

Preferred examples of the alkali-soluble groups include carboxy, fluorinated alcohol (preferably hexafluoroisopropanol), and sulfo groups.

The groups decomposable with an acid (acid-decomposable groups) preferably are those alkali-soluble groups in which the hydrogen atom has been replaced by a group eliminable with an acid.

Preferred examples of the acid-decomposable groups include cumyl ester, enol ester, acetal ester, and tertiary alkyl ester groups. More preferred are tertiary alkyl ester groups.

The resin (A) preferably is a resin containing at least one kind of repeating units selected from the group consisting of repeating units having a partial structure which includes an alicyclic hydrocarbon and is represented by any of the following general formulae (pI) to (pV) and repeating units represented by the following general formula (II-AB).

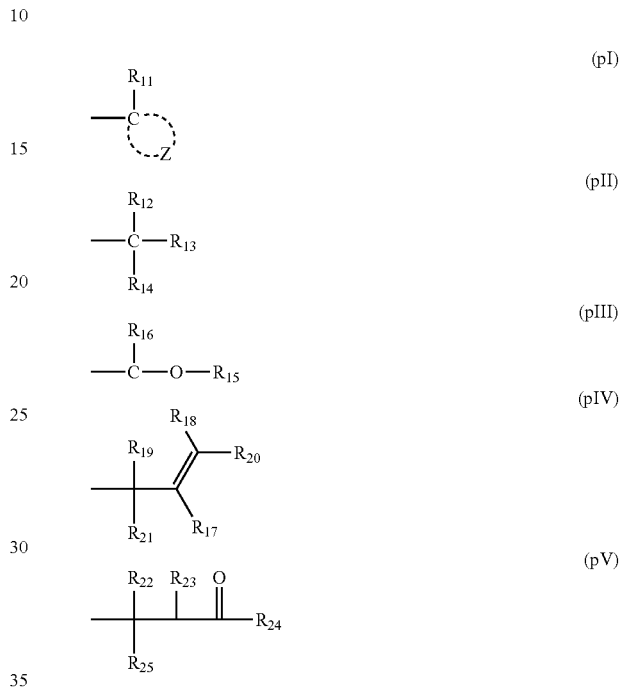

In general formulae (pI) to (pV), $R_{11}$ represents methyl, ethyl, n-propyl, isopropyl, n-butyl, isobutyl, or sec-butyl, and Z represents an atomic group necessary for forming a cycloalkyl group in cooperation with the carbon atom.

$R_{12}$ to $R_{16}$ each independently represents a linear or branched alkyl group having 1-4 carbon atoms or a cycloalkyl group, provided that at least one of $R_{12}$ to $R_{14}$ or either of $R_{15}$ and $R_{16}$ represents a cycloalkyl group.

$R_{17}$ to $R_{21}$ each independently represents a hydrogen atom, a linear or branched alkyl group having 1-4 carbon atoms, or a cycloalkyl group, provided that at least one of $R_{17}$ to $R_{21}$, represents a cycloalkyl group and that either of $R_{19}$ and $R_{21}$ represents a linear or branched alkyl group having 1-4 carbon atoms or a cycloalkyl group.

$R_{22}$ to $R_{25}$ each independently represents a hydrogen atom, a linear or branched alkyl group having 1-4 carbon atoms, or a cycloalkyl group, provided that at least one of $R_{22}$ to $R_{25}$ represents a cycloalkyl group and that $R_{23}$ and $R_{24}$ may be bonded to each other to form a ring.

In formula (II-AB), $R_{11}'$ and $R_{12}'$ each independently represents a hydrogen atom, cyano, halogen atom, or alkyl group.

Z' represents an atomic group which forms an alicyclic structure in cooperation with the two carbon atoms (C—C) bonded thereto.

General formula (II-AB) preferably is the following general formula (II-AB1) or general formula (II-AB2).

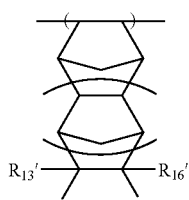
(II-AB1)

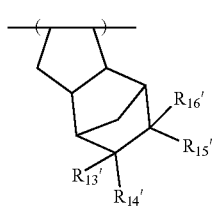
(II-AB2)

In formulae (II-AB1) and (II-AB2), $R_{13}'$ to $R_{16}'$ each independently represents a hydrogen atom, halogen atom, cyano, —COOH, —COOR$_5$, group which decomposes by the action of an acid, —C(=O)—X-A'-R$_{17}'$, alkyl group, or cycloalkyl group, wherein $R_5$ represents an alkyl group, cycloalkyl group, or group having a lactone structure, X represents an oxygen atom, sulfur atom, —NH—, —NHSO$_2$—, or —NHSO$_2$NH—, and A' represents a single bond or a divalent connecting group, provided that at least two of $R_{13}'$ to $R_{16}'$ may be bonded to each other form a ring.

Symbol n represents 0 or 1.

$R_{17}'$ represents —COOH, —COOR$_5$, —CN, hydroxy, alkoxy, —CO—NH—R$_6$, —CO—NH—SO$_2$—R$_6$, or group having a lactone structure.

$R_6$ represents an alkyl group or a cycloalkyl group.

In general formulae (pI) to (pV), the alkyl groups represented by $R_{12}$ to $R_{25}$ are linear or branched alkyl groups having 1-4 carbon atoms.

The cycloalkyl groups represented by $R_{11}$ to $R_{25}$ and the cycloalkyl group formed by Z and a carbon atom may be monocyclic or polycyclic. Examples thereof include groups having a monocyclic, bicyclic, tricyclic, or tetracyclic structure having 5 or more carbon atoms, preferably 6-30 carbon atoms, especially preferably 7-25 carbon atoms. These cycloalkyl groups may have substituents.

Preferred examples of the cycloalkyl groups include adamantyl, noradamantyl, decalin residues, tricyclodecanyl, tetracyclododecanyl, norbornyl, cedrol, cyclopentyl, cyclohexyl, cycloheptyl, cyclooctyl, cyclodecanyl, and cyclododecanyl. More preferred examples thereof include adamantyl, norbornyl, cyclohexyl, cyclopentyl, tetracyclododecanyl, and tricyclodecanyl.

Those alkyl and cycloalkyl groups may have substituents. Examples of the substituents which may be optionally possessed include alkyl groups (having 1-4 carbon atoms), halogen atoms, hydroxyl, alkoxy groups (having 1-4 carbon atoms), carboxyl, and alkoxycarbonyl groups (having 2-6 carbon atoms). These alkyl, alkoxy, alkoxycarbonyl groups and the like may have substituents, examples of which include hydroxyl, halogen atoms, and alkoxy groups.

The structures represented by general formulae (pI) to (pV) in the resin can be used for the protection of the alkali-soluble groups.

Repeating units having an alkali-soluble group protected by a structure represented by any of general formulae (pI) to (pV) preferably are repeating units represented by the following general formula (pA).

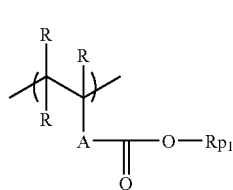
(pA)

In general formula (pA),

R represents a hydrogen atom, a halogen atom, or a linear or branched alkyl group having 1-4 carbon atoms. The R's may be the same or different.

Symbol A represents one member or a combination of two or more members selected from the group consisting of a single bond and alkylene, ether, thioether, carbonyl, ester, amide, sulfonamide, urethane, and urea groups. Preferably, A is a single bond.

Rp$_1$ represents a group represented by any of formulae (pI) to (pV).

The repeating units represented by general formula (pA) most preferably are repeating units derived from a 2-alkyl-2-adamantyl(meth)acrylate or a dialkyl(1-adamantyl)methyl (meth)acrylate.

Specific examples of the repeating units represented by general formula (pA) are shown below.

(In the formulae, Rx is H, CH$_3$, CF$_3$, or CH$_2$OH, and Rxa and Rxb each are an alkyl group having 1-4 carbon atoms.)

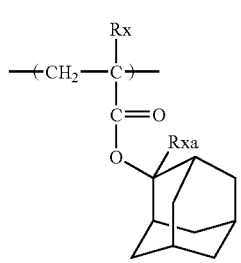
1

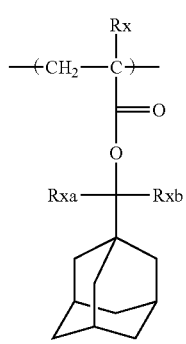
2

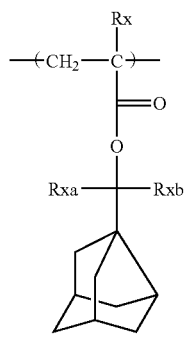
3
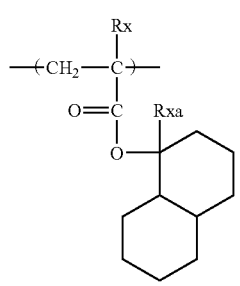
4
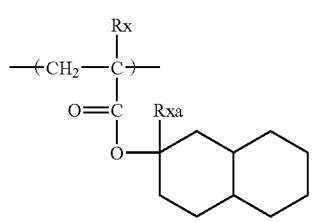
5
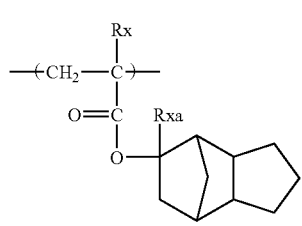
6
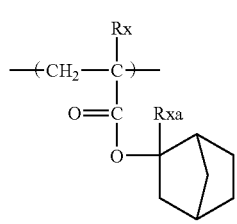
7
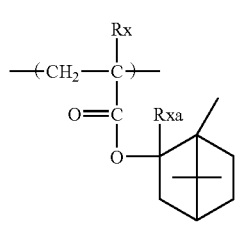
8
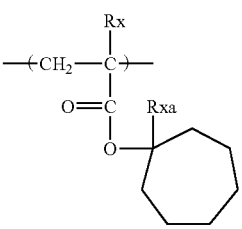
9
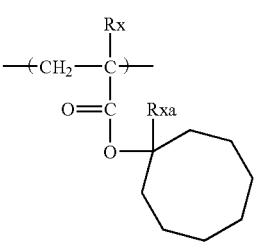
10
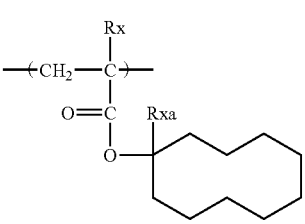
11
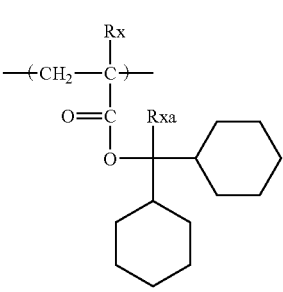
12
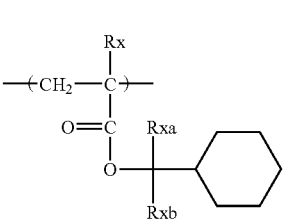
13
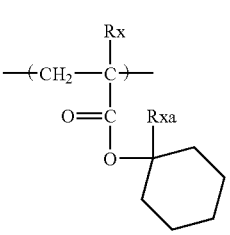
14
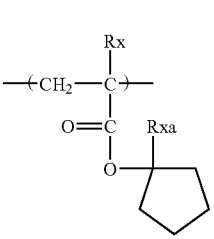
15

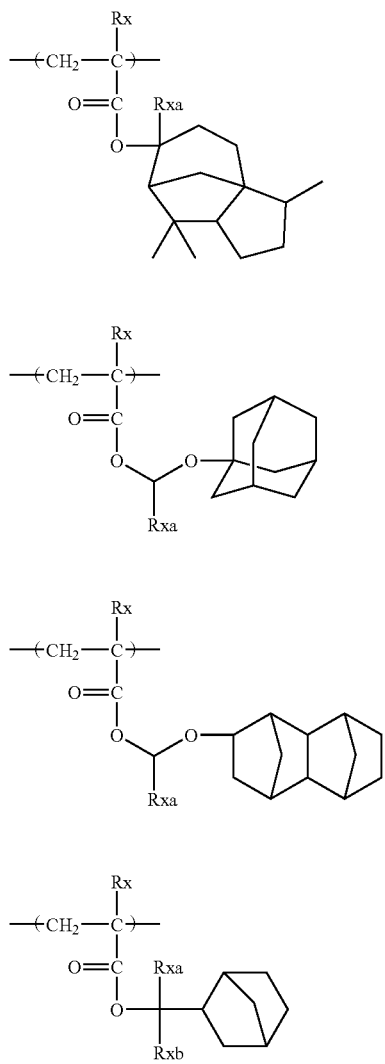

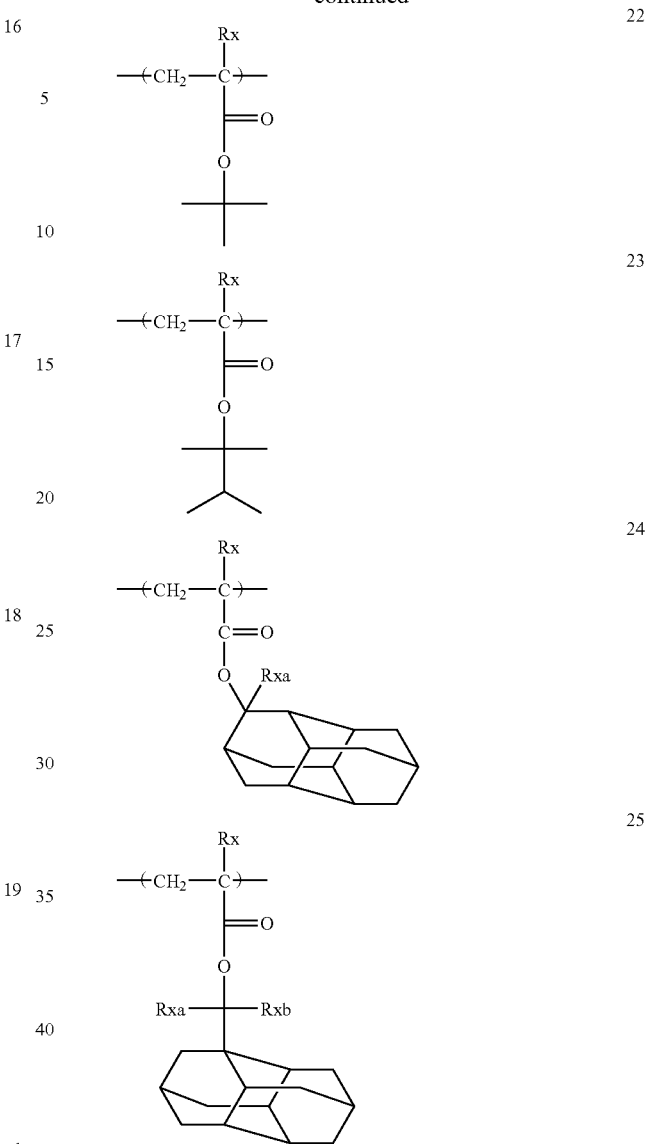

(In the formulae, Rx is H, CH$_3$, CF$_3$, or CH$_2$OH, and Rxa and Rxb each are an alkyl group having 1-4 carbon atoms.)

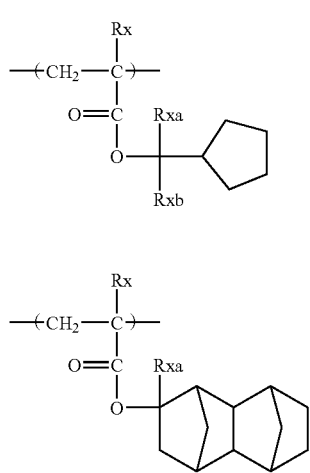

Examples of the halogen atoms represented by $R_{11}'$ and $R_{12}'$ include chlorine, bromine, fluorine, and iodine atoms.

Examples of the alkyl groups represented by $R_{11}'$ and $R_{12}'$ include linear or branched alkyl groups having 1-10 carbon atoms.

The atomic group represented by Z', which is for forming an alicyclic structure, is an atomic group which serves to form, in the resin, repeating units of an alicyclic hydrocarbon which may have one or more substituents. Especially preferred is an atomic group for forming a bridged alicyclic structure forming repeating units of a bridged alicyclic hydrocarbon.

Examples of the framework of the alicyclic hydrocarbon to be formed include the same frameworks as those of the alicyclic hydrocarbon groups represented by $R_{11}$ to $R_{25}$ in general formulae (pI) to (pV).

The framework of the alicyclic hydrocarbon may have one or more substituents. Examples of the substituents include $R_{13}'$ to $R_{16}'$ in general formula (II-AB1) or (II-AB2).

In the resin (A) according to the invention, groups decomposing by the action of an acid can be contained in at least one kind of repeating units selected from: repeating units having a partial structure which includes an alicyclic hydrocarbon and is represented by any of general formulae (pI) to (pV); repeating units represented by general formula (II-AB); and repeating units derived from the comonomer components which will be described later.

Various substituents of $R_{13}'$ to $R_{16}'$ in general formula (II-AB1) or (II-AB2) can serve as substituents of the atomic group for forming an alicyclic structure in general formula (II-AB) or of the atomic group Z for forming a bridged alicyclic structure.

Specific examples of the repeating units represented by general formula (II-AB1) or (II-AB2) include the following. However, the repeating units in the invention should not be construed as being limited to the following examples.

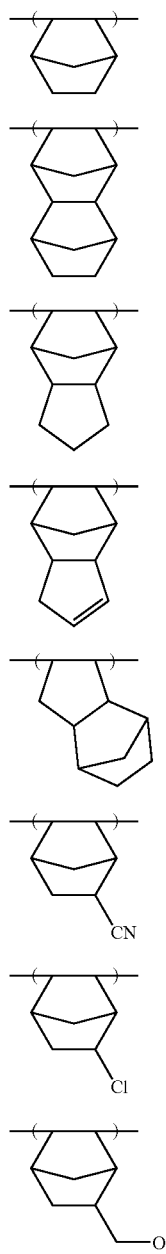

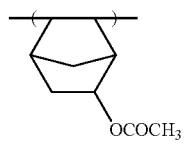

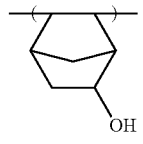

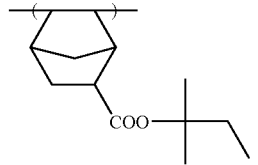

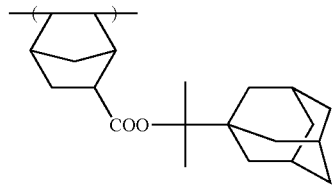

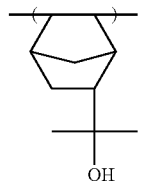

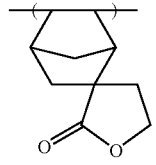

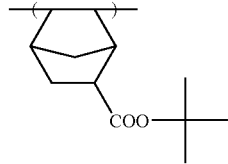

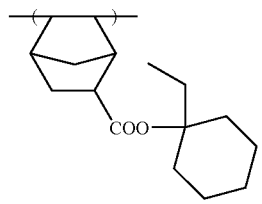

[II-18]
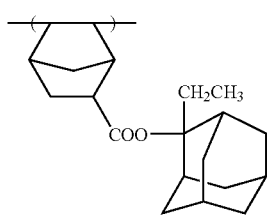
[II-19]
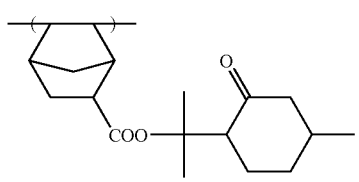
[II-20]
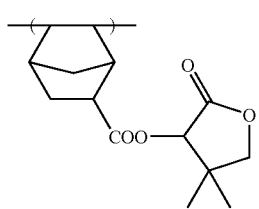
[II-21]
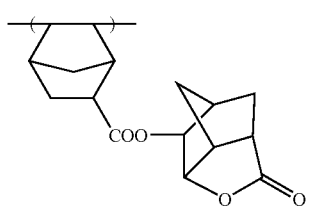
[II-22]
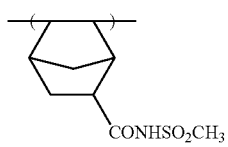
[II-23]
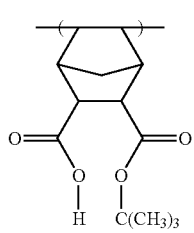
[II-24]
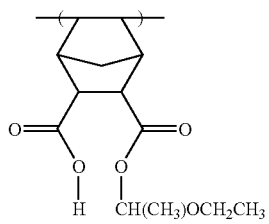
[II-25]
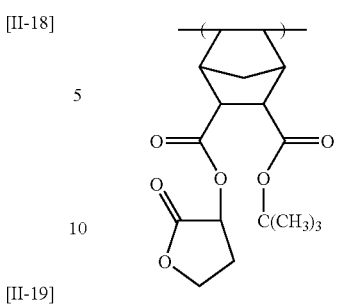
[II-26]
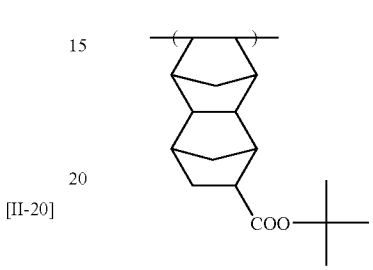
[II-27]
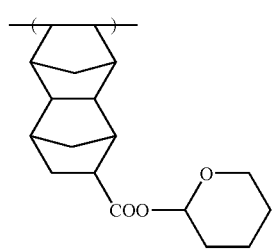
[II-28]
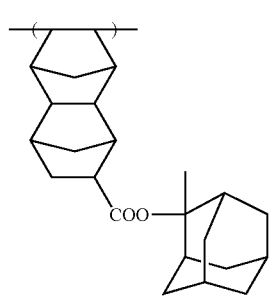
[II-29]
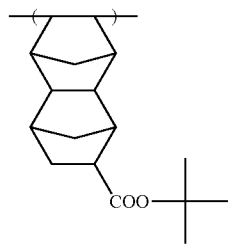
[II-30]
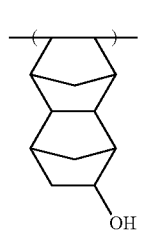

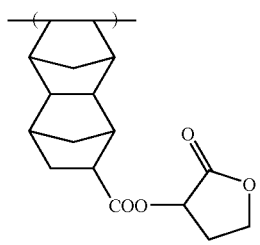

[II-31]

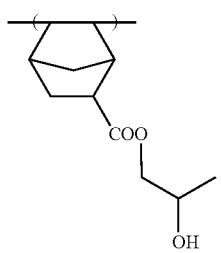

[II-32]

The resin (A) in the invention preferably has groups having a lactone ring. The groups having a lactone ring may be any groups having a lactone ring. However, preferred examples thereof are groups having a 5- to 7-membered lactone structure and ones comprising a 5- to 7-membered lactone structure and another ring structure fused thereto so as to form a bicycle structure or spiro structure. More preferred are groups having a lactone structure represented by any of the following general formulae (LC1-1) to (LC1-16). Groups having a lactone structure may have been directly bonded to the main chain. Preferred lactone structures are (LC1-1), (LC1-4), (LC1-5), (LC1-6), (LC1-13), and (LC1-14). Use of a lactone structure brings about satisfactory results concerning line edge roughness and development defects.

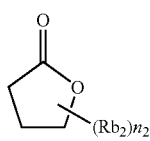

LCI-1

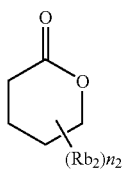

LCI-2

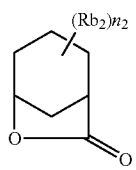

LCI-3

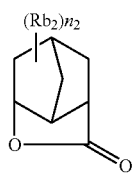

LCI-4

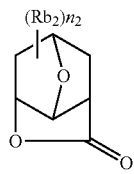

LCI-5

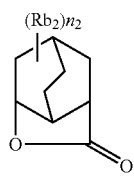

LCI-6

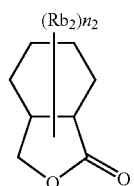

LCI-7

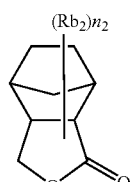

LCI-8

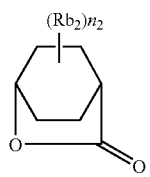

LCI-9

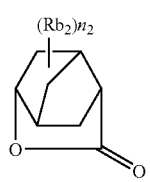

LCI-10

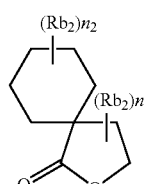

LCI-11

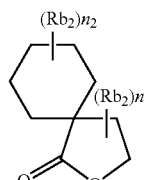

LCI-11

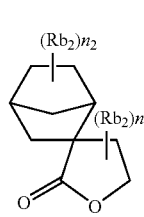

LCI-12

-continued

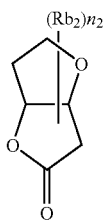
LCI-13

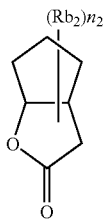
LCI-14

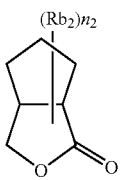
LCI-15

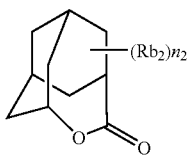
LCI-16

The lactone structure parts may have one or more substituents ($Rb_2$) or have no substituents. Preferred examples of the substituents ($Rb_2$) include alkyl groups having 1-8 carbon atoms, cycloalkyl groups having 4-7 carbon atoms, alkoxy groups having 1-8 carbon atoms, alkoxycarbonyl groups having 1-8 carbon atoms, carboxyl, halogen atoms, hydroxyl, cyano, and acid-decomposable groups. Symbol n2 represents an integer of 0-4. When n2 is 2 or larger, the $Rb_2$'s may be the same or different and may be bonded to each other to form a ring.

Examples of repeating units having a group having a lactone structure represented by any of general formulae (LC1-1) to (LC1-16) include: repeating units represented by general formula (II-AB1) or (II-AB2) wherein at least one of $R_{13}'$ to $R_{16}'$ has a group represented by any of general formulae (LC1-1) to (LC1-16) (e.g., the repeating units which have —$COOR_5$ wherein $R_5$ is represented by any of general formulae (LC1-1) to (LC1-16)); and repeating units represented by the following general formula (AI).

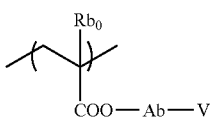
(AI)

In general formula (AI), $Rb_0$ represents a hydrogen atom, halogen atom, or alkyl group having 1-4 carbon atoms. Preferred examples of substituents which may be possessed by the alkyl group represented by $Rb_0$ include hydroxyl and halogen atoms.

Examples of the halogen atom represented by $Rb_0$ include fluorine, chlorine, bromine, and iodine atoms. $Rb_0$ preferably is a hydrogen atom or methyl.

Ab represents an alkylene group, a divalent connecting group having a monocyclic or polycyclic, alicyclic hydrocarbon structure, a single bond, an ether, ester, carbonyl, or carboxyl group, or a divalent group comprising a combination of two or more of these. Preferably, Ab is a single bond or a connecting group represented by -$Ab_1$-$CO_2$—.

$Ab_1$ is a linear or branched alkylene group or a monocyclic or polycyclic cycloalkylene group, and preferably is methylene, ethylene, cyclohexylene, adamantylene, or norbornylene group.

V represents a group represented by any of general formulae (LC1-1) to (LC1-16).

Repeating units having a lactone structure generally have optical isomers, and any of these optical isomers may be used. One optical isomer may be used alone, or a mixture of two or more optical isomers may be used. In the case where one optical isomer is mainly used, it has an optical purity (ee) of preferably 90 or higher, more preferably 95 or higher.

Specific examples of the repeating units having a lactone structure are shown below, but the repeating units in the invention should not be construed as being limited to the following examples.

(In the formulae, Rx is H, $CH_3$, $CH_2OH$, or $CF_3$.)

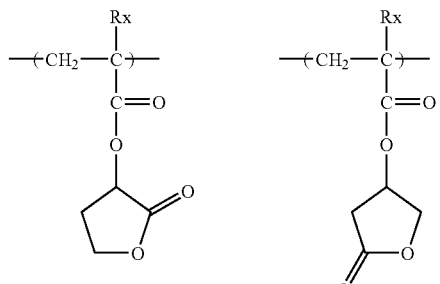

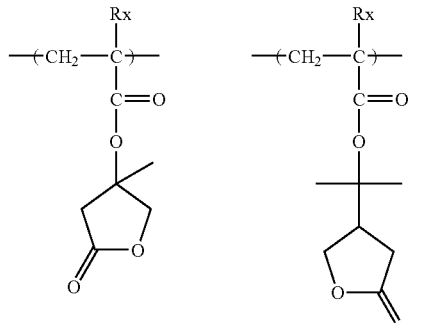

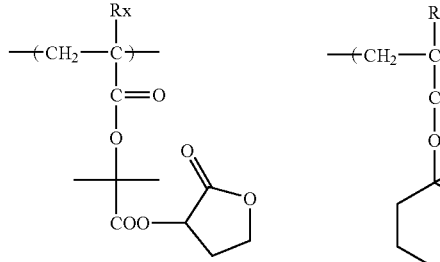

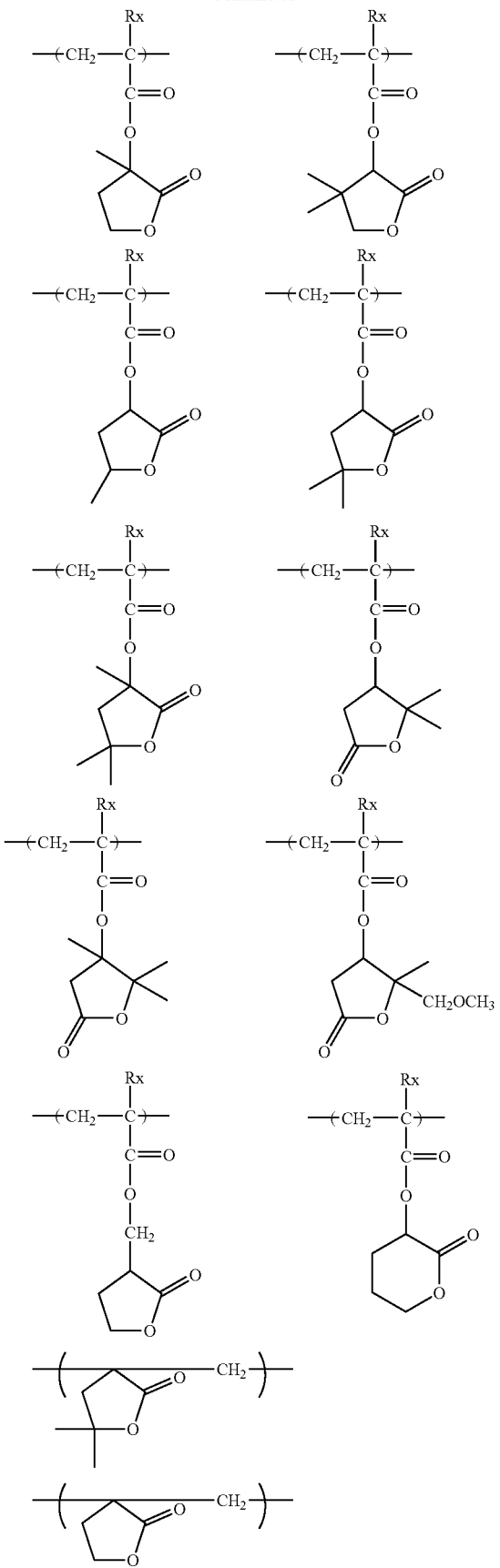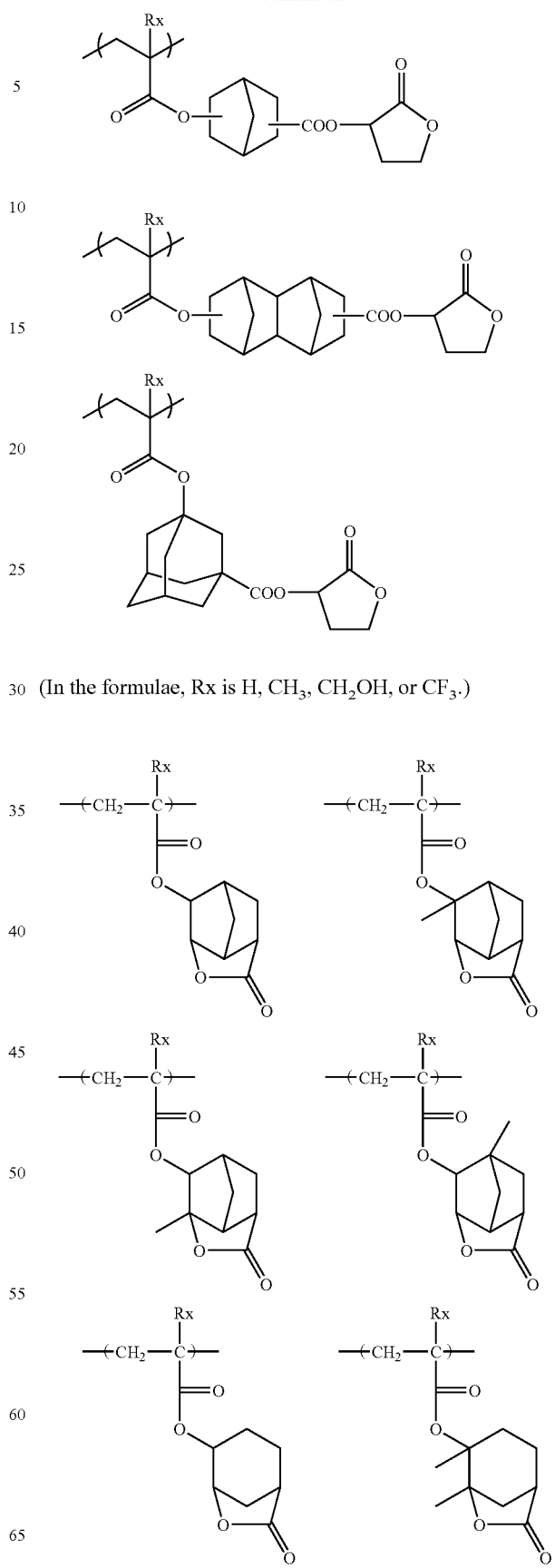
(In the formulae, Rx is H, CH$_3$, CH$_2$OH, or CF$_3$.)

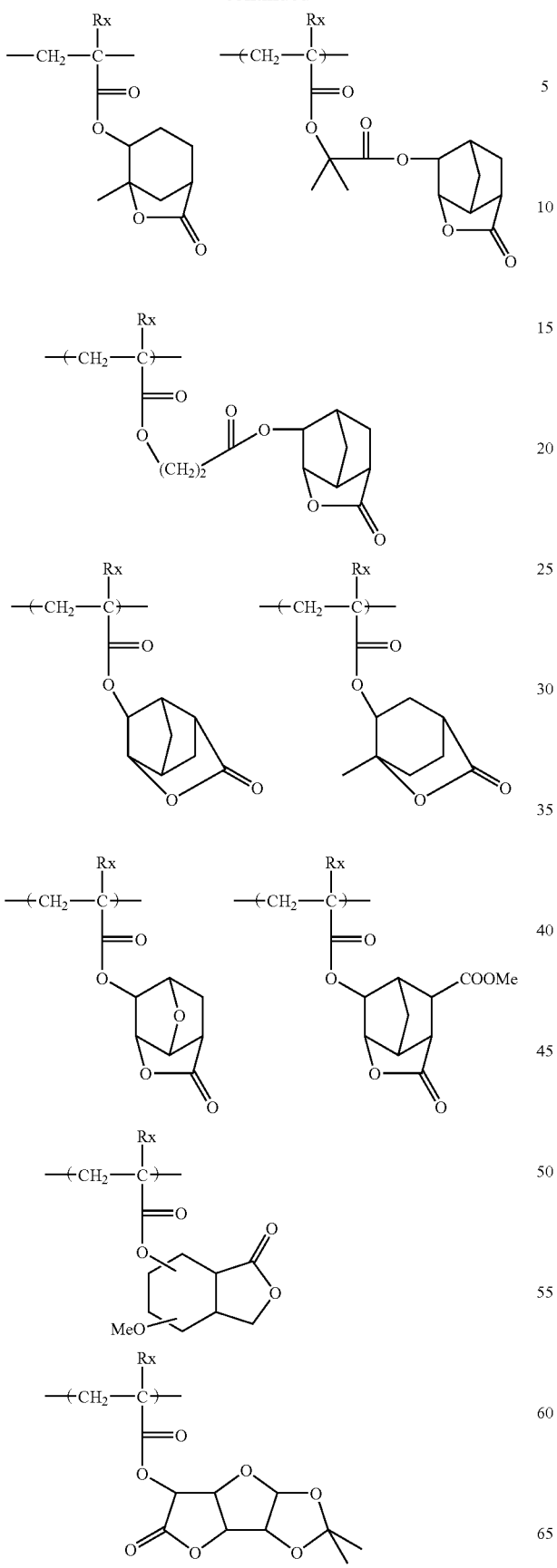
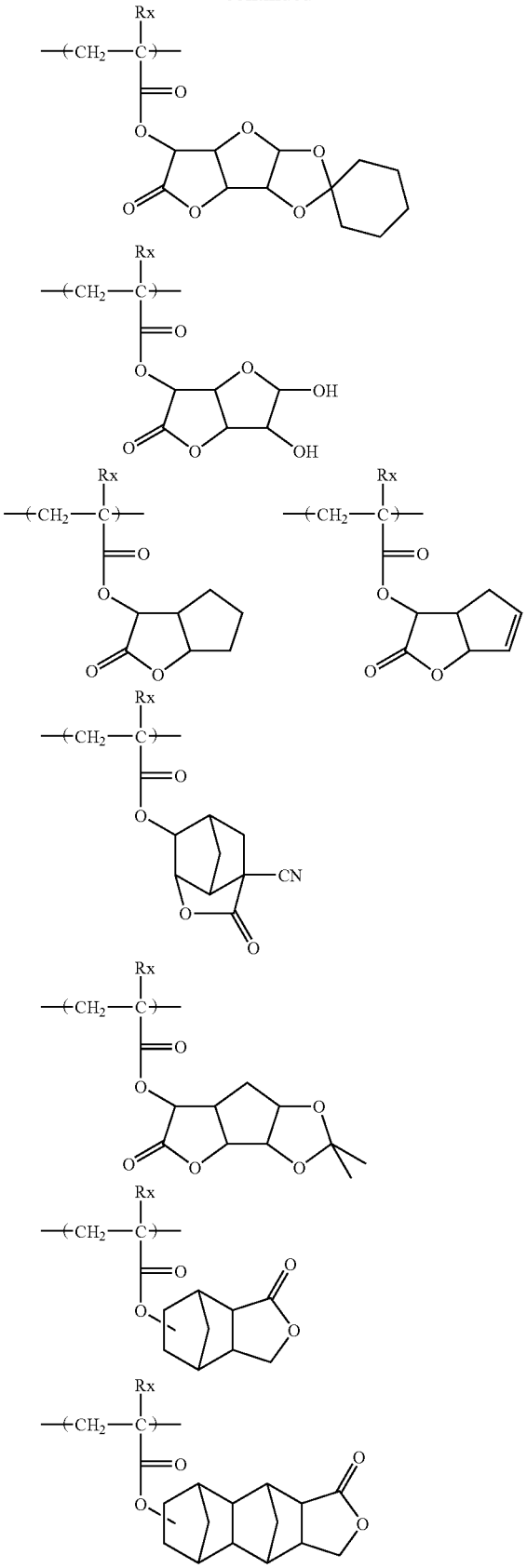
(In the formulae, Rx is H, CH₃, CH₂OH, or CF₃.)

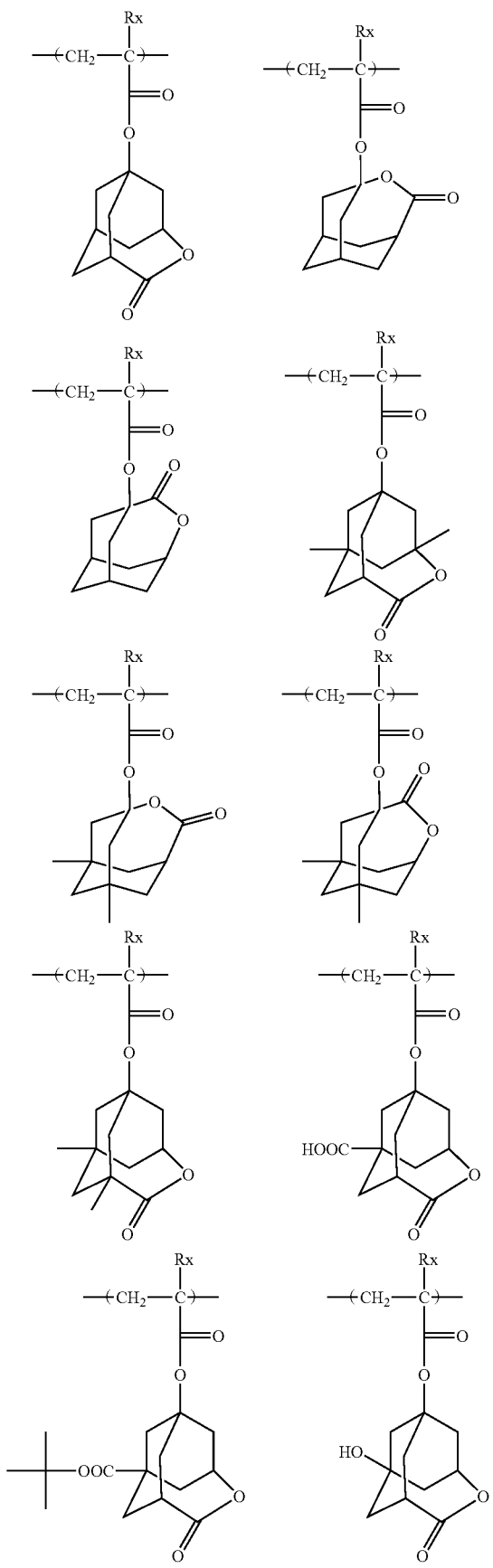
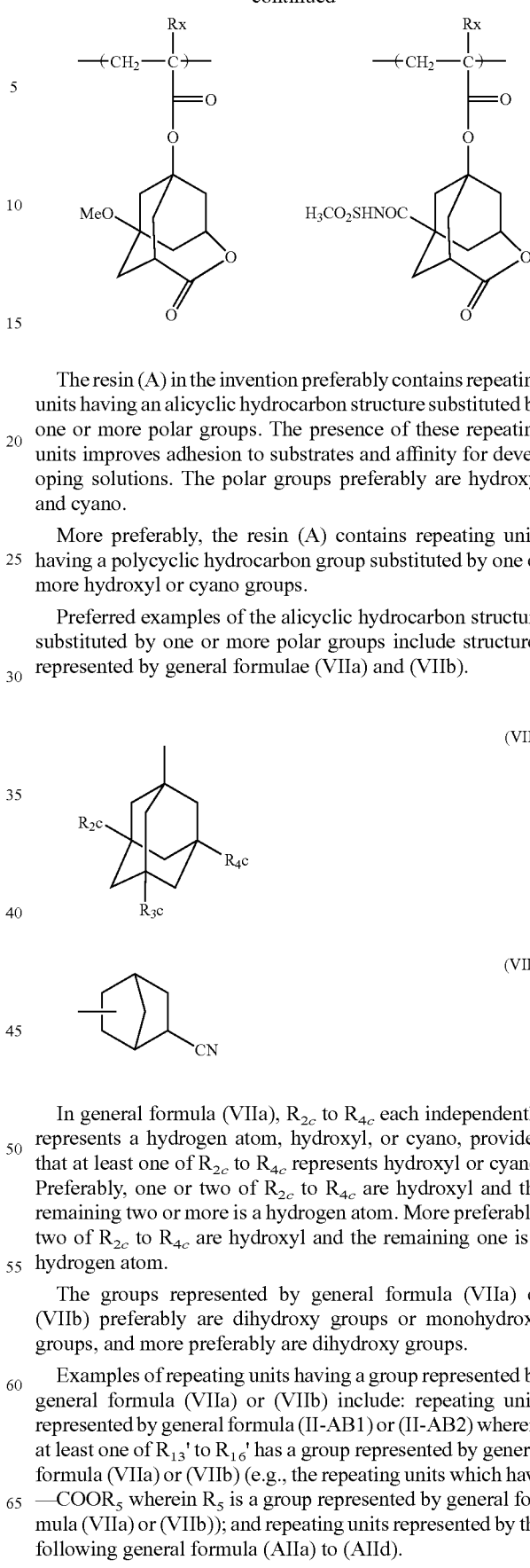

The resin (A) in the invention preferably contains repeating units having an alicyclic hydrocarbon structure substituted by one or more polar groups. The presence of these repeating units improves adhesion to substrates and affinity for developing solutions. The polar groups preferably are hydroxyl and cyano.

More preferably, the resin (A) contains repeating units having a polycyclic hydrocarbon group substituted by one or more hydroxyl or cyano groups.

Preferred examples of the alicyclic hydrocarbon structure substituted by one or more polar groups include structures represented by general formulae (VIIa) and (VIIb).

(VIIa)

(VIIb)

In general formula (VIIa), $R_{2c}$ to $R_{4c}$ each independently represents a hydrogen atom, hydroxyl, or cyano, provided that at least one of $R_{2c}$ to $R_{4c}$ represents hydroxyl or cyano. Preferably, one or two of $R_{2c}$ to $R_{4c}$ are hydroxyl and the remaining two or more is a hydrogen atom. More preferably, two of $R_{2c}$ to $R_{4c}$ are hydroxyl and the remaining one is a hydrogen atom.

The groups represented by general formula (VIIa) or (VIIb) preferably are dihydroxy groups or monohydroxy groups, and more preferably are dihydroxy groups.

Examples of repeating units having a group represented by general formula (VIIa) or (VIIb) include: repeating units represented by general formula (II-AB1) or (II-AB2) wherein at least one of $R_{13}'$ to $R_{16}'$ has a group represented by general formula (VIIa) or (VIIb) (e.g., the repeating units which have —COOR$_5$ wherein R$_5$ is a group represented by general formula (VIIa) or (VIIb)); and repeating units represented by the following general formula (AIIa) to (AIId).

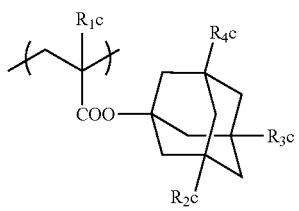
(AIIa)

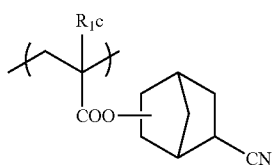
(AIIb)

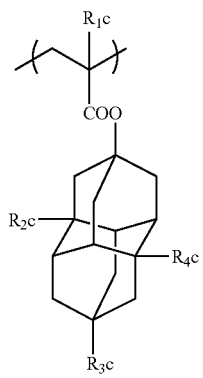
(AIIc)

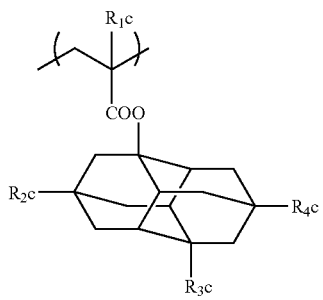
(AIId)

In general formulae (AIIa) to (AIId), $R_{1c}$ represents a hydrogen atom, methyl, trifluoromethyl, or hydroxymethyl.

$R_{2c}$ to $R_{4c}$ each independently represents a hydrogen atom, hydroxyl, or cyano, provided that at least one of $R_{2c}$ to $R_{4c}$ represents hydroxyl or cyano. Preferably, one or two of $R_{2c}$ to $R_{4c}$ are hydroxyl and the remaining two or more is a hydrogen atom. More preferably, two of $R_{2c}$ to $R_{4c}$ are hydroxyl and the remaining one is a hydrogen atom.

Specific examples of the repeating units represented by general formulae (AIIa) to (AIId) are shown below, but the repeating units in the invention should not be construed as being limited to the following examples.

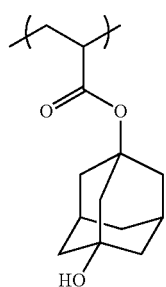

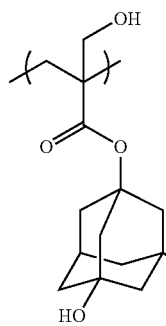

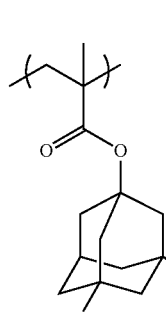

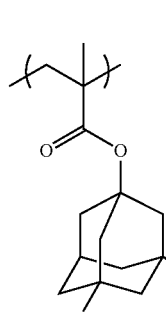

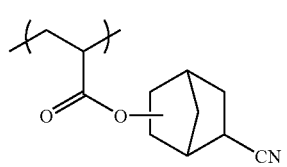

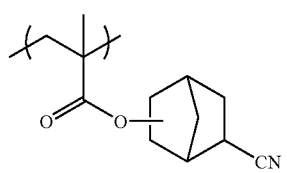

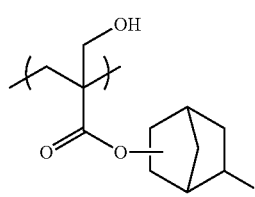

-continued

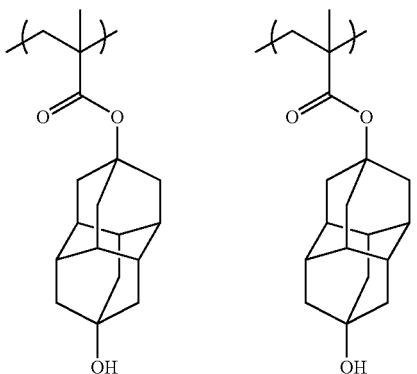

The resin (A) in the invention may contain repeating units represented by the following general formula (VIII).

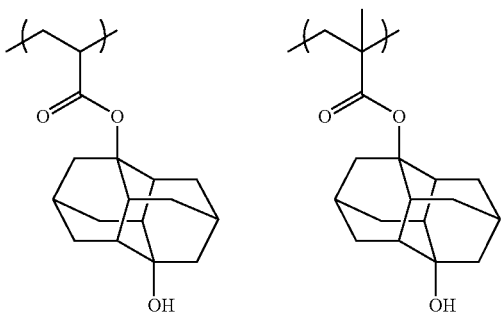
(VIII)

In general formula (VIII), $Z_2$ represents —O— or —N($R_{41}$)—. $R_{41}$ represents a hydrogen atom, hydroxyl, alkyl group, or —$OSO_2$—$R_{42}$. $R_{42}$ represents an alkyl group, cycloalkyl group, or camphor residue. The alkyl group represented by $R_{41}$ or $R_{42}$ may be substituted by a halogen atom (preferably fluorine atom), etc.

Specific examples of the repeating units represented by general formula (VIII) include the following, but the repeating units in the invention should not be construed as being limited to these examples.

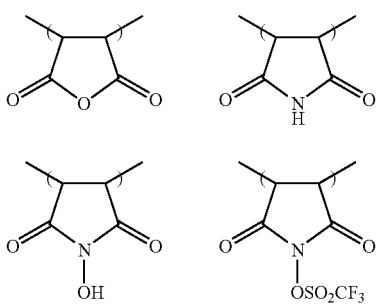

-continued

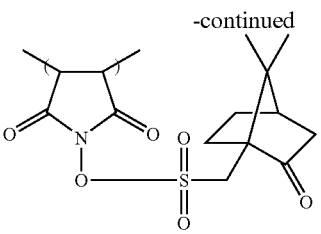

The resin (A) in the invention preferably has repeating units each having an alkali-soluble group, and more preferably has repeating units each having a carboxyl group. The presence of these repeating units enhances resolution in contact hole applications. The repeating units having a carboxyl group may be either repeating units which constitute a resin main chain having carboxyl groups directly bonded thereto, such as the repeating units derived from acrylic acid or methacrylic acid, or repeating units which constitute a resin main chain having carboxyl groups each bonded thereto through a connecting group. Both of these two types of repeating units are preferred. The connecting group may have a monocyclic or polycyclic hydrocarbon structure. Most preferred are repeating units derived from acrylic acid or methacrylic acid.

The resin (A) in the invention may further have repeating units having 1-3 groups represented by general formula (F1). The presence of these repeating units improves line edge roughness performance.

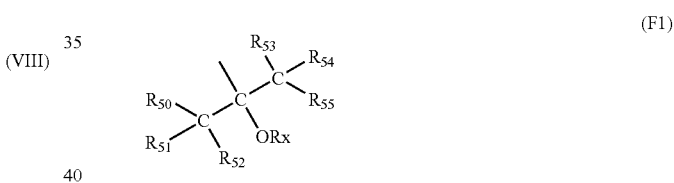
(F1)

In general formula (F1), $R_{50}$ to $R_{55}$ each independently represents a hydrogen atom, fluorine atom, or alkyl group, provided that at least one of $R_{50}$ to $R_{55}$ represents a fluorine atom or an alkyl group in which at least one hydrogen atom has been replaced by a fluorine atom (fluoroalkyl group). Rx represents a hydrogen atom or an organic group (preferably, an acid-decomposable protective group or an alkyl, cycloalkyl, acyl, or alkoxycarbonyl group).

The alkyl groups represented by $R_{50}$ to $R_{55}$ may have been substituted by one or more substituents selected from halogen atoms, e.g., fluorine, cyano, etc. Preferred examples thereof include alkyl groups having 1-3 carbon atoms, such as methyl and trifluoromethyl. It is preferred that $R_{50}$ to $R_{55}$ each be a fluorine atom.

Preferred examples of the organic group represented by Rx include acid-decomposable protective groups and alkyl, cycloalkyl, acyl, alkylcarbonyl, alkoxycarbonyl, alkoxycarbonylmethyl, alkoxymethyl, and 1-alkoxyethyl groups which may have one or more substituents.

The repeating units having 1-3 groups represented by general formula (F1) preferably are repeating units represented by the following general formula (F2).

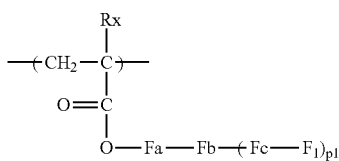

In formula (F2), Rx represents a hydrogen atom, halogen atom, or alkyl group having 1-4 carbon atoms. The alkyl group represented by Rx may have one or more substituents, and preferred examples of the substituents include hydroxyl and halogen atoms.

Fa represents a single bond or a linear or branched alkylene group, and preferably represents a single bond.

Fb represents a monocyclic or polycyclic hydrocarbon group.

Fc represents a single bond or a linear or branched alkylene group (preferably represents a single bond or methylene group).

$F_1$ represents a group represented by general formula (F1).

Symbol $p_1$ represents 1-3.

Preferred examples of the cyclic hydrocarbon group represented by Fb include cyclopentyl, cyclohexyl, and norbornyl.

Specific examples of the repeating units having 1-3 structures represented by general formula (F1) are shown below.

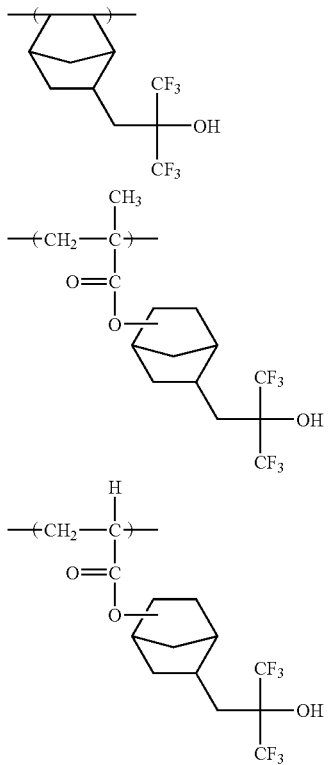

The resin (A) in the invention may further have repeating units which have an alicyclic hydrocarbon structure and are not acid-decomposable. The presence of these repeating units is effective in inhibiting low-molecular components contained in the resist film from dissolving in the immersion liquid during immersion exposure. Examples of such repeating units including units derived from 1-adamantyl(meth)acrylate, tricyclodecanyl(meth)acrylate, and cyclohexyl(meth)acrylate.

From the standpoint of compatibility, it is preferred that the resin (A) has no fluorine atom.

The resin (A) in the invention can contain various repeating structural units besides the repeating structural units described above for the purpose of regulating dry etching resistance, suitability for standard developing solutions, adhesion to substrates, resist profile, and general properties required of resists, such as resolution, heat resistance, sensitivity, etc.

Examples of such repeating structural units include the repeating structural units corresponding to the monomers shown below, but the optional units should not be construed as being limited to these.

Thus, performances required of the resin (A), in particular, (1) solubility in solvent for application, (2) film-forming properties (glass transition point), (3) alkali developability, (4) resist loss (hydrophilicity/hydrophobicity, selection of alkali-soluble group), (5) adhesion of unexposed areas to substrate, (6) dry etching resistance, and the like can be delicately regulated.

Examples of such monomers include compounds having one addition-polymerizable unsaturated bond, such as acrylic esters, methacrylic esters, acrylamide and analogues thereof, methacrylamide and analogues thereof, allyl compounds, vinyl ethers, and vinyl esters.

Besides such monomers corresponding to those various repeating structural units, any addition-polymerizable unsaturated compound copolymerizable with those monomers may have been copolymerized.

In the resin (A), the molar proportion of each kind of repeating structural units to be contained is suitably determined in order to regulate resist properties including dry etching resistance, suitability for standard developing solutions, adhesion to substrates, and resist profile and general performances required of resists, such as resolution, heat resistance, and sensitivity.

Preferred embodiments of the resin (A) in the invention include the following.

(1) One containing repeating units having a partial structure which includes an alicyclic hydrocarbon and is represented by any of general formulae (pI) to (pV) (side chain type). This embodiment preferably is one containing (meth)acrylate repeating units having a structure represented by any of (pI) to (pV).

(2) One containing repeating units represented by general formula (II-AB) (main chain type), provided that examples of the resin (2) include the following.

(3) One comprising repeating units represented by general formula (II-AB), a maleic anhydride derivative, and a (meth)acrylate structure (hybrid type).

In the resin (A), the content of the repeating units having an acid-decomposable group is preferably 10-60% by mole, more preferably 20-50% by mole, even more preferably 25-40% by mole, based on all repeating structural units.

In the resin (A), the content of the repeating units having a partial structure which includes an alicyclic hydrocarbon and is represented by any of general formulae (pI) to (pV) is preferably 25-70% by mole, more preferably 35-65% by mole, even more preferably 40-60% by mole, based on all repeating structural units.

In the resin (A), the content of the repeating units represented by general formula (II-AB) is preferably 10-70% by mole, more preferably 15-65% by mole, even more preferably 25-60% by mole, based on all repeating structural units.

The content of the repeating structural units derived from those optionally usable comonomers in the resin also can be suitably determined according to the desired resist performances. In general, however, the content thereof is preferably 99% by mole or lower, more preferably 90% by mole or lower, even more preferably 80% by mole or lower, based on the total amount of the repeating structural units having a partial structure which includes an alicyclic hydrocarbon and is represented by any of general formulae (pI) to (pV) and the repeating units represented by general formula (II-AB).

In the case where the composition of the invention is to be used for ArF exposure, the resin preferably has no aromatic group from the standpoint of transparency to ArF light.

The resin (A) preferably is a copolymer of three components, i.e., a (meth)acrylate having a lactone ring, a (meth)acrylate having an organic group having at least either of hydroxyl and cyano, and a (meth)acrylate having an acid-decomposable group.

More preferably, the resin (A) to be used in the invention is one in which all the repeating units are constituted of (meth)acrylate repeating units. In this case, the resin to be use can be any of one in which all the repeating units are methacrylate units, one in which all the repeating units are acrylate units, and one in which the repeating units are a mixture of methacrylate units and acrylate units. It is, however, preferred that the proportion of acrylate repeating units is up to 50 mol % based on all repeating units. The resin more preferably is: a terpolymer comprising 25-50% repeating units having a partial structure which includes an alicyclic hydrocarbon and is represented by any of general formulae (pI) to (pV), 25-50% repeating units having the lactone structure, and 5-30% repeating units having an alicyclic hydrocarbon structure substituted by the polar group; or a quadripolymer containing, besides these three kinds of repeating units, 5-20% repeating units containing a carboxyl group or a structure represented by general formula (F1).

The polymer or copolymer to be used in the invention has a weight-average molecular weight in the range of preferably 1,500-100,000, more preferably 2,000-70,000, especially preferably 3,000-50,000.

The resin (A) to be used in the invention can be synthesized by ordinary methods (e.g., radical polymerization). Examples of general synthesis methods include the en bloc polymerization method in which monomers and an initiator are dissolved in a solvent and the solution is heated to thereby polymerize the monomers and the dropping polymerization method in which a solution of monomers and an initiator is added dropwise to a heated solvent over 1-10 hours. The dropping polymerization method is preferred. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethylformamide and dimethylacetamide, and solvents capable of dissolving the composition of the invention therein, such as those which will be shown later, e.g., propylene glycol monomethyl ether acetate, propylene glycol monomethyl ether, and cyclohexanone. It is more preferred that polymerization be conducted using the same solvent as that to be used in the resist composition of the invention. Use of this solvent can inhibit particle generation during storage.

It is preferred that the polymerization reaction be conducted in an inert gas atmosphere such as nitrogen or argon. A commercial free-radical initiator (e.g., azo initiator or peroxide) is used as a polymerization initiator to initiate the polymerization. The free-radical initiator preferably is an azo initiator, which preferably is an azo initiator having an ester group, cyano group, or carboxyl group. Preferred initiators include azobisisobutyronitrile, azobisdimethylvaleronitrile, and dimethyl 2,2'-azobis(2-methylpropionate). The initiator may be added additionally or in portions according to need. After completion of the reaction, the reaction mixture is poured into a solvent and the target polymer is recovered as a powder, solid, etc. The reactant concentration is 5-50% by mass, preferably 10-30% by mass. (In this specification, mass ratio is equal to weight ratio.) The reaction temperature is generally 10-150° C., preferably 30-120° C., more preferably 50-100° C.

In the invention, the amount of the resin (A) added to the photosensitive composition is 50-99.7% by mass, preferably 70-99.5% by mass, based on all solid components. Besides the resin according to the invention, other resins may be used according to need. Other resins can be incorporated into the composition of the invention preferably in such a proportion that the amount thereof per 100 parts by mass of the resin (A) in the invention is up to 70 parts by mass, especially preferably up to 50 parts by mass.

(B) Compound Generating Acid Upon Irradiation with Actinic Ray or Radiation

The photosensitive composition of the invention contains a compound which generates an acid upon irradiation with actinic rays or a radiation (referred to also as component (B) or compound (B)).

The photo-acid generator to be used can be suitably selected from photoinitiators for cationic photopolymerization, photoinitiators for radical photopolymerization, photodecolorants or optical color changers for dyes, known compounds used in microresist formation or the like which generate an acid upon irradiation with actinic rays or a radiation, and mixtures of two or more thereof.

Examples thereof include diazonium salts, phosphonium salts, sulfonium salts, iodonium salts, imidesulfonates, oximesulfonates, diazodisulfones, disulfones, and o-nitrobenzyl sulfonates.

Also usable are compounds obtained by incorporating any of those groups or compounds which generate an acid upon irradiation with actinic rays or a radiation into the main chain or side chains of a polymer. Examples thereof are given in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Furthermore, those compounds generating an acid by the action of light which are described in U.S. Pat. No. 3,779,778, European Patent 126,712, etc. can be used.

Component (B) preferably is a compound which, upon irradiation with actinic rays, generates an acid having one or more fluoroalkyl chains (preferably having 2-4 carbon atoms) or a benzenesulfonic acid having one or more fluorine atoms.

Furthermore, component (B) preferably is a triphenylsulfonium salt compound having in the cation part either an alkyl residue (preferably having 1-15 carbon atoms) which has not been substituted by fluorine or a cycloalkyl residue (preferably having 3-15 carbon atoms) which has not been substituted by fluorine.

Preferred of the compounds which decompose upon irradiation with actinic rays or a radiation to generate an acid are compounds represented by the following general formulae (ZI), (ZII), and (ZIII).

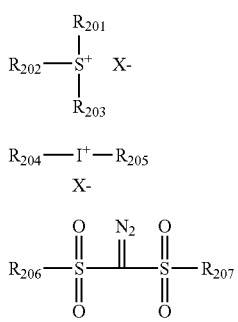

ZI

ZII

ZIII

In general formula (ZI), $R_{201}$, $R_{202}$, and $R_{203}$ each independently represents an organic group.

$X^-$ represents a non-nucleophilic anion. Preferred examples thereof include a sulfonic acid anion, carboxylic acid anion, bis(alkylsulfonyl)amide anion, tris(alkylsulfonyl) methide anion, $BF_4^-$, $PF_6^-$, and $SbF_6^-$. Preferred are organic anions containing one or more carbon atoms.

Preferred examples of the organic anions include organic anions represented by the following formulae.

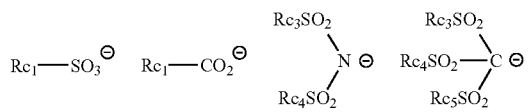

In the formulae, $Rc_1$ represents an organic group.

Examples of the organic group represented by $Rc_1$ include ones having 1-30 carbon atoms. Preferred examples thereof include alkyl and aryl groups which may have one or more substituents, and further include groups comprising two or more of these groups connected to each other through a single bond or a connecting group such as —O—, —$CO_2$—, —S—, —$SO_3$—, or —$SO_2N(Rd_1)$—. $Rd_1$ represents a hydrogen atom or alkyl group.

$RC_3$, $Rc_4$, and $Rc_5$ each represent an organic group. Preferred examples of the organic groups represented by $Rc_3$, $Rc_4$, and $RC_5$ include the same organic groups as those shown above as preferred examples of $Rb_1$. Most preferred are perfluoroalkyl groups having 1-4 carbon atoms.

$Rc_3$ and $Rc_4$ may be bonded to each other to form a ring.

Examples of the group formed by the bonding of $Rc_3$ and $Rc_4$ include alkylene groups and arylene groups. Preferred are perfluoroalkylene groups having 2-4 carbon atoms.

Most preferred examples of the organic groups represented by $Rc_1$ and $Rc_3$ to $Rc_5$ are: alkyl groups substituted in the 1-position by a fluorine atom or fluoroalkyl group; and a phenyl group substituted by one or more fluorine atoms or fluoroalkyl groups. The presence of one or more fluorine atoms or fluoroalkyl groups enables the acid generated by light irradiation to have an increased acidity to improve sensitivity. Furthermore, the formation of a ring by the bonding of $Rc_3$ and $Rc_4$ enables the acid generated by light irradiation to have an increased acidity to improve sensitivity.

The number of carbon atoms in each of the organic groups represented by $R_{201}$, $R_{202}$, and $R_{203}$ is generally 1-30, preferably 1-20.

Two of $R_{201}$ to $R_{203}$ may be bonded to each other to form a ring structure, which may contain an oxygen atom, sulfur atom, ester bond, amide bond, or carbonyl group therein.

Examples of the group formed by the bonding of two of $R_{201}$ to $R_{203}$ include alkylene groups (e.g., butylene and pentylene).

Examples of the organic groups represented by $R_{201}$, $R_{202}$, and $R_{203}$ include the corresponding groups in the compounds (Z1-1), (Z1-2), and (Z1-3) which will be described later.

A compound having two or more structures represented by general formula (ZI) may also be used. For example, use may be made of a compound having a structure in which at least one of the $R_{201}$ to $R_{203}$ of a compound represented by general formula (ZI) is bonded to at least one of the $R_{201}$ to $R_{203}$ of another compound represented by general formula (ZI).

More preferred examples of the component (ZI) include the compounds (Z1-1), (Z1-2), and (Z1-3) which will be explained below.

Compound (Z1-1) is an arylsulfonium compound represented by general formula (ZI) wherein at least one of $R_{201}$ to $R_{203}$ is an aryl group, i.e., a compound including an arylsulfonium as a cation.

The arylsulfonium compound may be one in which all of $R_{201}$ to $R_{203}$ are aryl groups, or may be one in which part of $R_{201}$ to $R_{203}$ is an aryl group and the remainder is an alkyl group.

Examples of the arylsulfonium compound include triarylsulfonium compounds, diarylalkylsulfonium compounds, and aryldialkylsulfonium compounds.

The aryl group of the arylsulfonium compound preferably is an aryl group such as phenyl or naphthyl or a heteroaryl group such as an indole residue or pyrrole residue, and more preferably is phenyl or an indole residue. In the case where the arylsulfonium compound has two or more aryl groups, these aryl groups may be the same or different.

The alkyl group which is optionally possessed by the arylsulfonium compound preferably is a linear, branched, or cyclic alkyl group having 1-15 carbon atoms. Examples thereof include methyl, ethyl, propyl, n-butyl, sec-butyl, t-butyl, cyclopropyl, cyclobutyl, and cyclohexyl.

The aryl and alkyl groups represented by $R_{201}$ to $R_{203}$ may have substituents selected from alkyl groups (e.g., ones having 1-15 carbon atoms), aryl groups (e.g., ones having 6-14 carbon atoms), alkoxy groups (e.g., ones having 1-15 carbon atoms), halogen atoms, hydroxyl, and phenylthio. Preferred examples of the substituents are linear, branched, or cyclic alkyl groups having 1-12 carbon atoms and linear, branched, or cyclic alkoxy groups having 1-12 carbon atoms. Most preferred are alkyl groups having 1-4 carbon atoms and alkoxy groups having 1-4 carbon atoms. Any one of $R_{201}$ to $R_{203}$ may have such a substituent or each of $R_{201}$ to $R_{203}$ may have such a substituent. In the case where $R_{201}$ to $R_{203}$ are aryl groups, it is preferred that a substituent be bonded to the p-position in each aryl group.

Next, compound (Z1-2) will be explained.

Compound (Z1-2) is a compound represented by formula (ZI) wherein $R_{201}$ to $R_{203}$ each independently represents an organic group containing no aromatic ring. The term aromatic ring herein implies any of aromatic rings including ones containing one or more heteroatoms.

The organic groups containing no aromatic ring which are represented by $R_{201}$ to $R_{203}$ each have generally 1-30, preferably 1-20 carbon atoms.

Preferably, $R_{201}$ to $R_{203}$ each independently are an alkyl, 2-oxoalkyl, alkoxycarbonylmethyl, allyl, or vinyl group. $R_{201}$ to $R_{203}$ each more preferably are a linear, branched, or cyclic 2-oxoalkyl or alkoxycarbonylmethyl group, and most preferably are a linear or branched 2-oxoalkyl group.

The alkyl groups represented by $R_{201}$ to $R_{203}$ may be either linear, branched, or cyclic. Preferred examples thereof include linear or branched alkyl groups having 1-10 carbon atoms (e.g., methyl, ethyl, propyl, butyl, and pentyl) and cycloalkyl groups having 3-10 carbon atoms (e.g., cyclopentyl, cyclohexyl, and norbornyl).

The 2-oxoalkyl groups represented by $R_{201}$ to $R_{203}$ may be either linear, branched, or cyclic. Preferred examples thereof include the alkyl groups enumerated above which each have >C=O in the 2-position.

Examples of the alkyl groups in the alkoxycarbonylmethyl groups represented by $R_{201}$ to $R_{203}$ include alkoxy groups preferably having 1-5 carbon atoms (methoxy group, ethoxy group, propoxy group, butoxy group, and pentoxy group).

$R_{201}$ to $R_{203}$ may have been further substituted by substituents selected from halogen atoms, alkoxy groups (e.g., ones having 1-5 carbon atoms), hydroxyl, cyano, and nitro.

Two of $R_{201}$ to $R_{203}$ may be bonded to each other to form a ring structure, which may contain an oxygen atom, sulfur atom, ester bond, amide bond, or carbonyl group therein. Examples of the group formed by the bonding of two of $R_{201}$ to $R_{203}$ include alkylene groups (e.g., butylene and pentylene).

Compound (Z1-3) is a compound represented by the following general formula (Z1-3). Namely, it is a compound having a phenacylsulfonium salt structure.

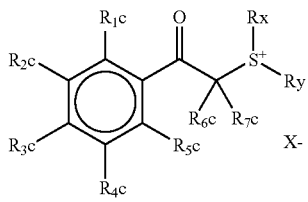

(Z1-3)

$R_{1C}$ to $R_{5C}$ each independently represents a hydrogen atom, alkyl or alkoxy group, or halogen atom.

$R_{6C}$ and $R_{7C}$ each represent a hydrogen atom or an alkyl group.

$R_x$ and $R_y$ each independently represents an alkyl, 2-oxoalkyl, alkoxycarbonylmethyl, allyl, or vinyl group.

Two or more of $R_{1C}$ to $R_{5C}$ may be bonded to each other to form a ring structure, and $R_x$ and $R_y$ may be bonded to each other to form a ring structure. These ring structures may contain an oxygen atom, sulfur atom, ester bond, or amide bond.

The alkyl groups represented by $R_{1C}$ to $R_{5C}$ may be either linear, branched, or cyclic. Examples thereof include alkyl groups having 1-20 carbon atoms, preferably, linear or branched alkyl groups having 1-12 carbon atoms (e.g., methyl, ethyl, linear or branched propyl, linear or branched butyl, and linear or branched pentyl), and cycloalkyl groups having 3-8 carbon atoms (e.g., cyclopentyl and cyclohexyl).

The alkoxy groups represented by $R_{1C}$ to $R_{5C}$ may be either linear, branched, or cyclic. Examples thereof include alkoxy groups having 1-10 carbon atoms. Preferred examples thereof include linear or branched alkoxy groups having 1-5 carbon atoms (e.g., methoxy, ethoxy, linear or branched propoxy, linear or branched butoxy, and linear or branched pentoxy) and cyclic alkoxy groups having 3-8 carbon atoms (e.g., cyclopentyloxy and cyclohexyloxy).

It is preferred that any of $R_{1C}$ to $R_{5C}$ be a linear, branched, or cyclic alkyl group or a linear, branched, or cyclic alkoxy group. It is more preferred that the total number of carbon atoms in $R_{1C}$ to $R_{5C}$ be from 2 to 15. This compound has further improved solubility in solvents and is inhibited from generating particles during storage.

Examples of the alkyl groups represented by $R_x$ and $R_y$ include the same alkyl groups as those enumerated above as examples of $R_{1C}$ to $R_{5C}$.

Examples of the 2-oxoalkyl groups include those alkyl groups represented by $R_{1C}$ to $R_{5C}$ which each have >C=O in the 2-position.

Examples of the alkoxy groups in the alkoxycarbonylmethyl groups include the same alkoxy groups as those enumerated above as examples of $R_{1C}$ to $R_{5C}$.

Examples of the group formed by the bonding of $R_x$ and $R_y$ include butylene and pentylene.

$R_x$ and $R_y$ each preferably are an alkyl group having 4 or more carbon atoms, and more preferably are an alkyl group having 6 or more, especially 8 or more carbon atoms.

In general formulae (ZII) and (ZIII), $R_{204}$ to $R_{207}$ each independently represents an aryl group which may have one or more substituents or an alkyl group which may have one or more substituents.

The aryl groups represented by $R_{204}$ to $R_{207}$ preferably are phenyl or naphthyl, and more preferably are phenyl.

The alkyl groups represented by $R_{204}$ to $R_{207}$ may be either linear, branched, or cyclic. Preferred examples thereof include linear or branched alkyl groups having 1-10 carbon atoms (e.g., methyl, ethyl, propyl, butyl, and pentyl) and cycloalkyl groups having 3-10 carbon atom (e.g., cyclopentyl, cyclohexyl, and norbornyl).

Examples of substituents which may be possessed by $R_{204}$ to $R_{207}$ include alkyl groups (e.g., ones having 1-15 carbon atoms), aryl groups (e.g., ones having 6-15 carbon atoms), alkoxy groups (e.g., ones having 1-15 carbon atoms), halogen atoms, hydroxyl, and phenylthio.

$X^-$ represents a non-nucleophilic anion, and examples thereof include the same non-nucleophilic anions as those enumerated above as examples of the $X^-$ in general formula (I).

Other preferred examples of the compound which decomposes upon irradiation with actinic rays or a radiation to generate an acid include compounds represented by the following general formulae (ZIV), (ZV), and (ZVI).

$$Ar_3—SO_2—SO_2—Ar_4 \qquad \text{ZIV}$$

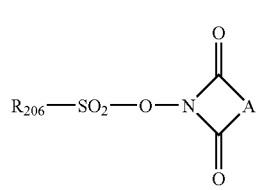

ZV

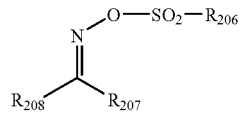

ZVI

In general formulae (ZIV) to (ZVI), $Ar_3$ and $Ar_4$ each independently represents an aryl group.

$R_{206}$ represents an alkyl group or a substituted or unsubstituted aryl group.

$R_{207}$ and $R_{208}$ each independently represents an alkyl or aryl group or an electron-attracting group. $R_{207}$ preferably is an aryl group.

$R_{208}$ preferably is an electron-attracting group, and more preferably is cyano or a fluoroalkyl group.

Symbol A represents an alkylene, alkenylene, or arylene group.

More preferred of the compounds which decompose upon irradiation with actinic rays or a radiation to generate an acid are the compounds represented by general formulae (ZI) to (ZIII).

Especially preferred examples of the compounds which decompose upon irradiation with actinic rays or a radiation to generate an acid are shown below.

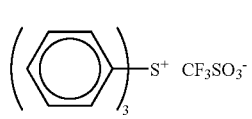 (z1)
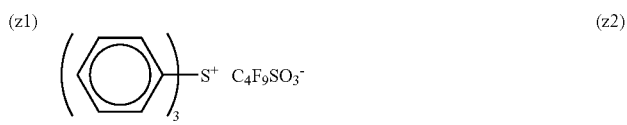 (z2)
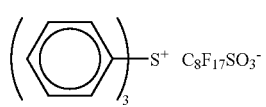 (z3)
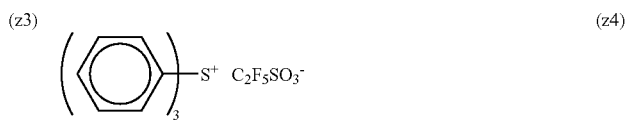 (z4)
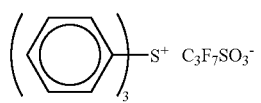 (z5)
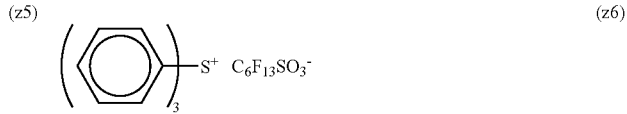 (z6)
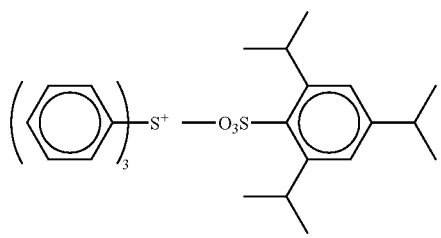 (z7)
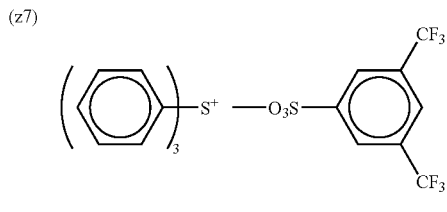 (z8)
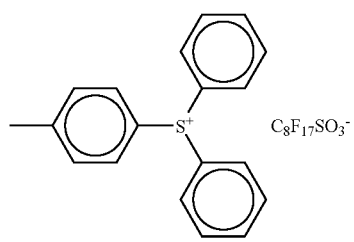 (z9)
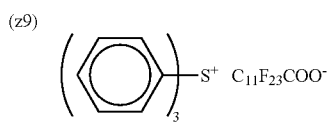 (z10)
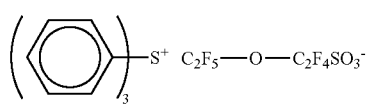 (z11)
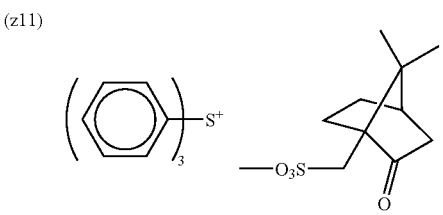 (z12)
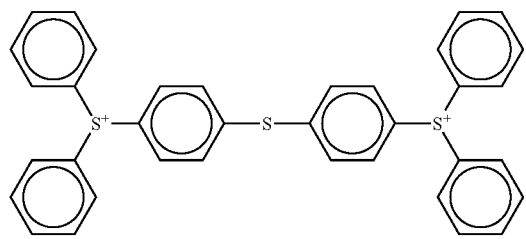 (z13)
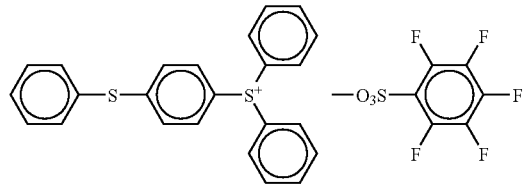 (z14)
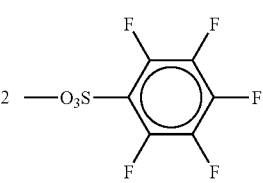 
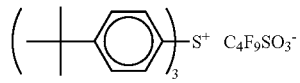 (z15)

-continued
(z16) 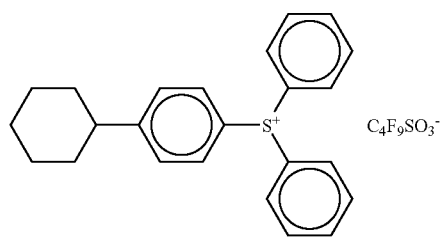
(z17) 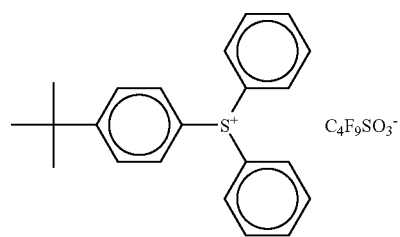
(z18) 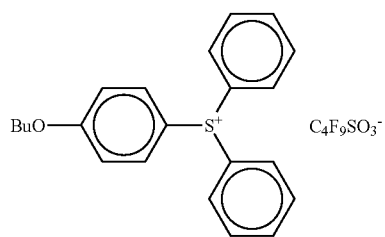
(z19) 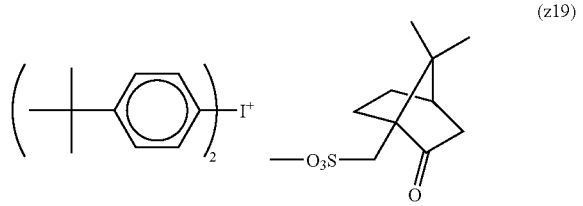
(z20) 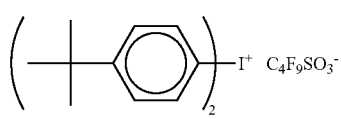
(z21) 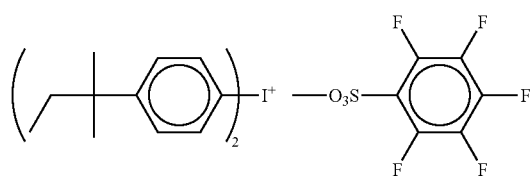
(z22) 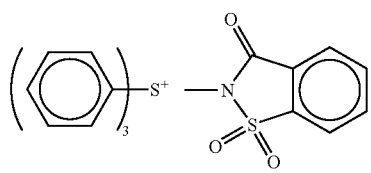
(z23) 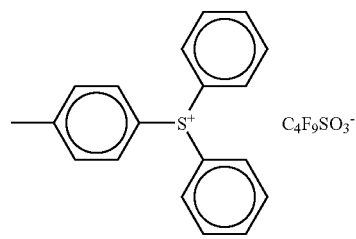
(z24) 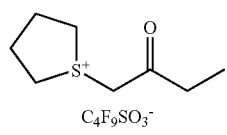
(z25) 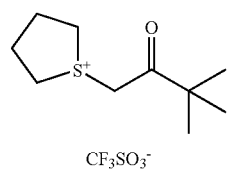
(z26) 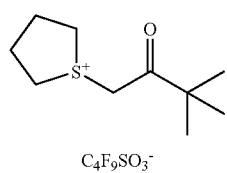
(z27) 
(z28) 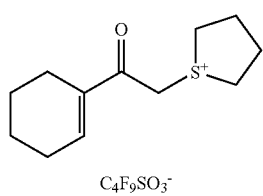
(z29) 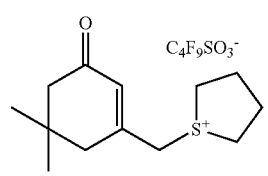

-continued
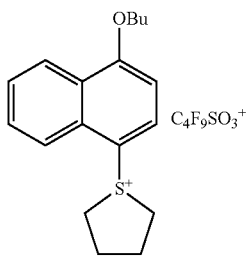
(z30)
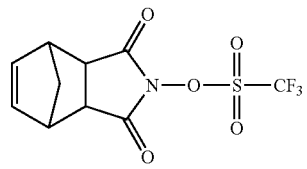
(z31)
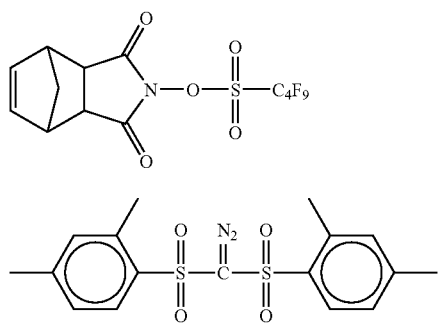
(z32)
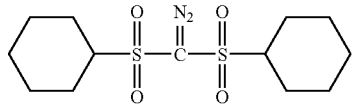
(z33)
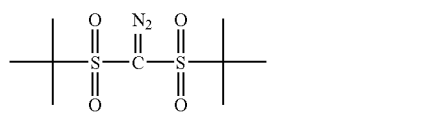
(z34)
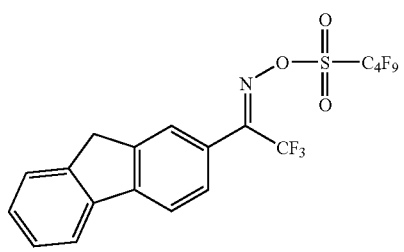
(z35)
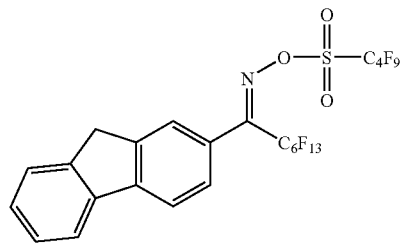
(z36)
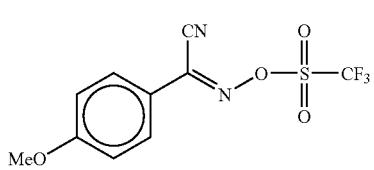
(z37)
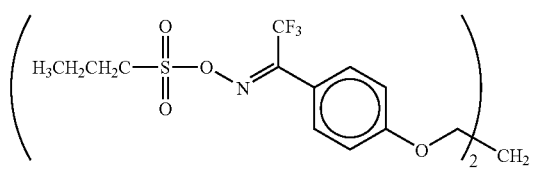
(z38)
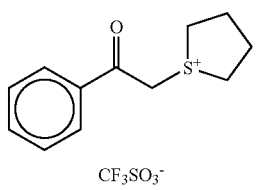
(z39)
(z40)
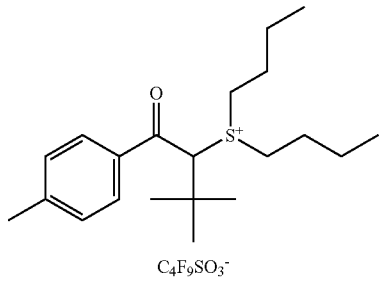
(z41)
(z42)
(z43)

-continued
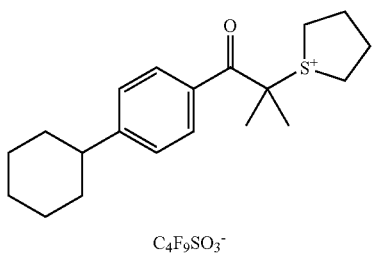
(z44)
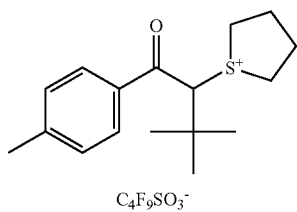
(z45)
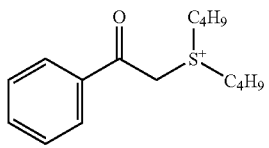
(z46)
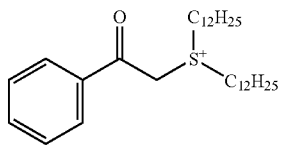
(z47)
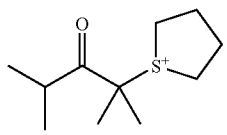
(z48)
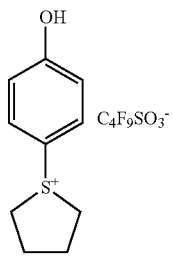
(z49)
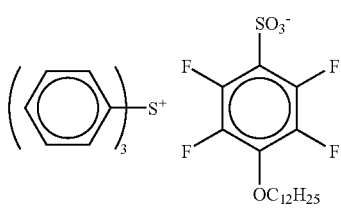
(z50)
(z51)
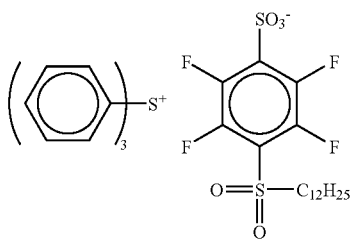
(z52)
(z53)
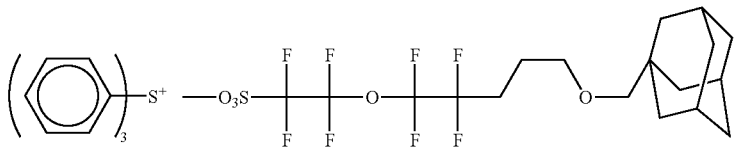
(z54)
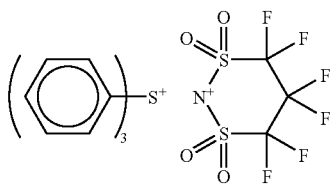
(z55)
(z56)

-continued
(z57) 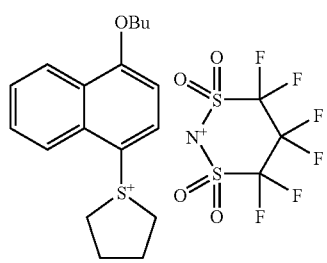
(z58) 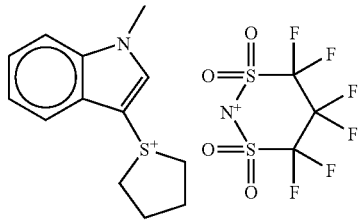
(z59) 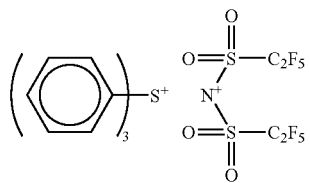
(z60) 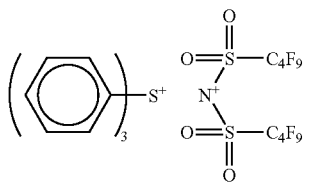
(z61) 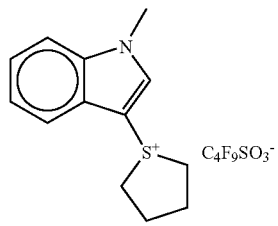
(z62) 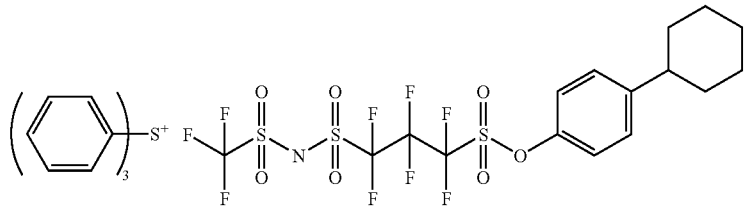
(z63) 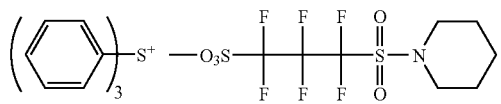
(z64) 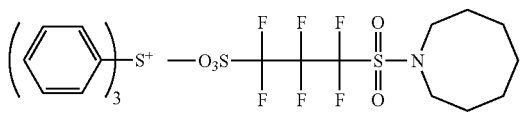
(z65) 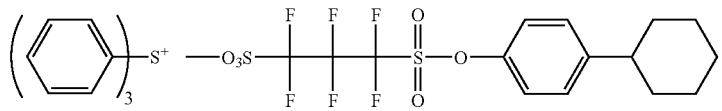
(z66) 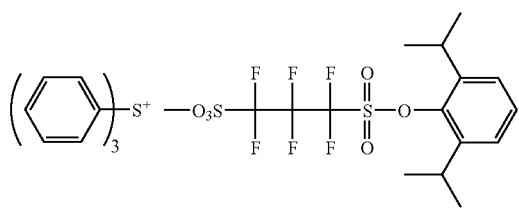
(z67) 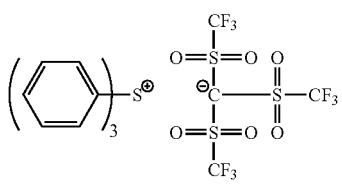
(z68) 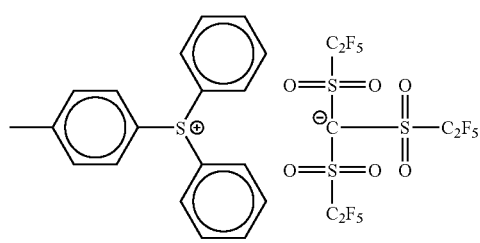
(z69) 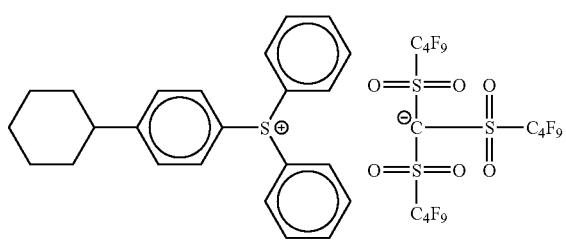

-continued

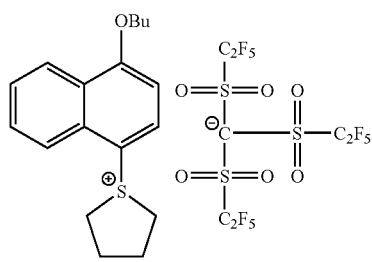
(z70)

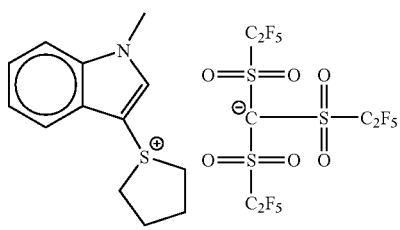
(z71)

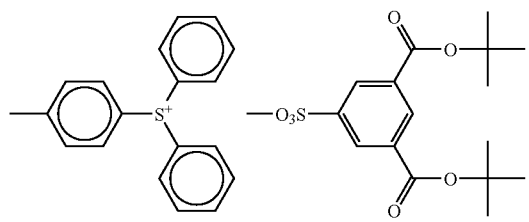
(z72)

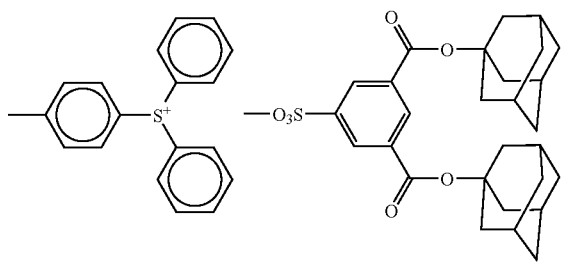
(z73)

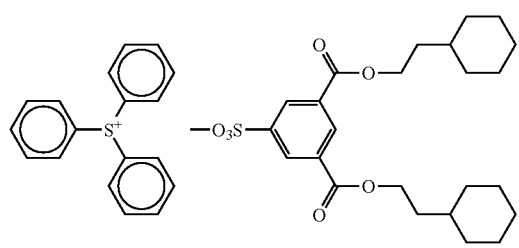
(z74)

One acid generator can be used alone, or a combination of two or more acid generators can be used. In the case where two or more acid generators are used in combination, it is preferred to use a combination of compounds respectively generating two organic acids differing in the total number of atoms excluding hydrogen atoms by 2 or more.

The content of the acid generator in the composition is preferably 0.1-20% by mass, more preferably 0.5-10% by mass, even more preferably 1-7% by mass, based on all solid components of the resist composition.

(C) Fluorine-Containing Compound

The positive resin composition of the invention contains a fluorine-containing compound containing at least one group selected from the following groups (x) to (z):

(x) alkali-soluble groups;

(y) groups which decompose by the action of an alkaline developing solution to enhance solubility in the alkaline developing solution; and (z) groups which decompose by the action of an acid.

Examples of the alkali-soluble groups (x) include phenolic hydroxyl, carboxy, fluorinated alcohol, sulfo, sulfonamide, sulfonylimide, (alkylsulfonyl)(alkylcarbonyl)methylene, (alkylsulfonyl)(alkylcarbonyl)imide, bis(alkylcarbonyl)methylene, bis(alkylcarbonyl)imide, bis(alkylsulfonyl)methylene, bis(alkylsulfonyl)imide, and tris(alkylcarbonyl)methylene groups and groups having a tris(alkylsulfonyl)methylene group.

Preferred examples of the alkali-soluble groups include fluorinated alcohol (preferably hexafluoroisopropanol) sulfonimide, and bis(alkylcarbonyl)methylene groups.

In the case where the fluorine-containing compound (C) is a resin, preferred repeating units having an alkali-soluble group (x) are repeating units each having an alkali-soluble group directly bonded to the main chain of the resin, such as repeating units derived from acrylic acid or methacrylic acid, and repeating units each having an alkali-soluble group bonded to the main chain of the resin through a connecting group. Also preferred is to use a polymerization initiator or chain-transfer agent having an alkali-soluble group in polymerization to introduce the alkali-soluble group into a polymer end.

The content of the repeating units having an alkali-soluble group (x) is preferably 1-50 mol %, more preferably 3-35 mol %, even more preferably 5-20 mol %, based on all repeating units in the polymer.

Specific examples of the repeating units having an alkali-soluble group (x) are shown below.
(In the formulae, Rx is H, CH₃, CF₃, or CH₂OH.)
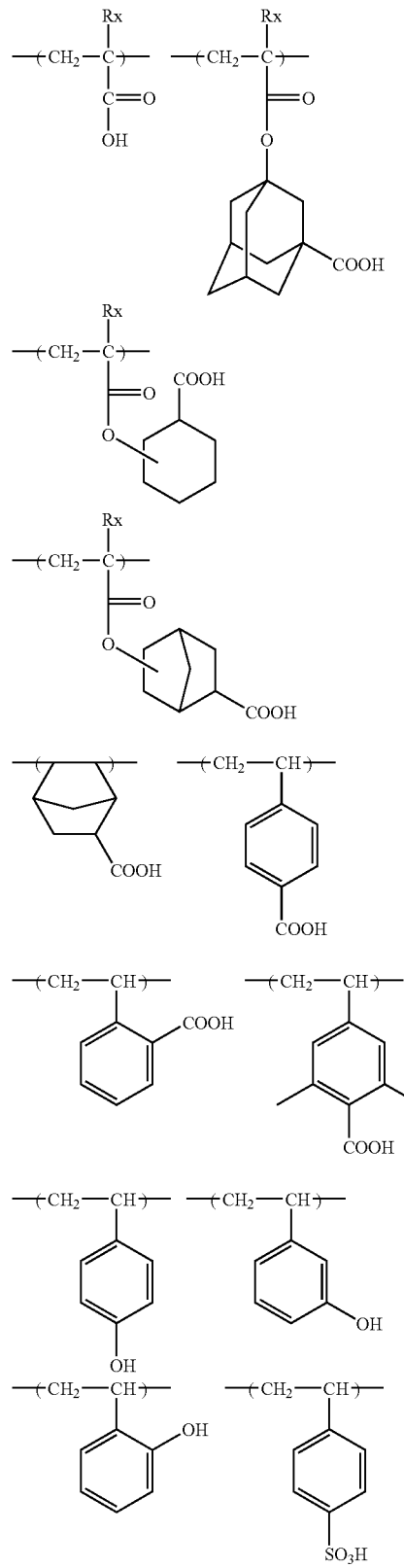
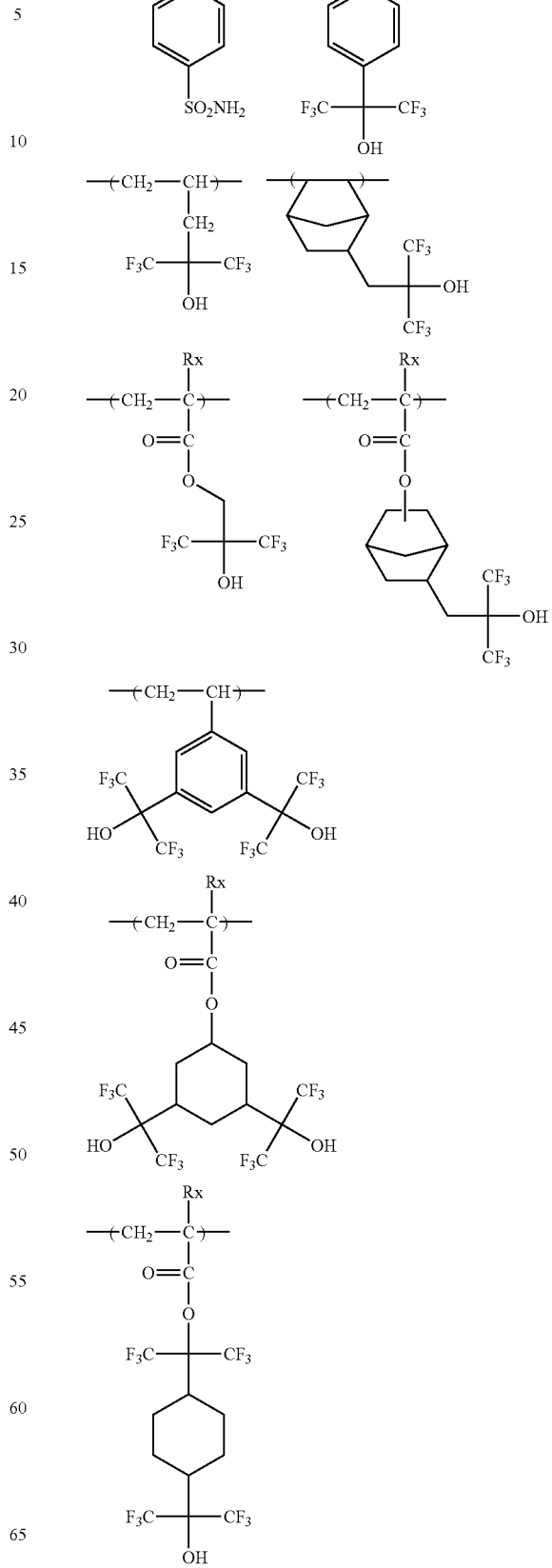

-continued

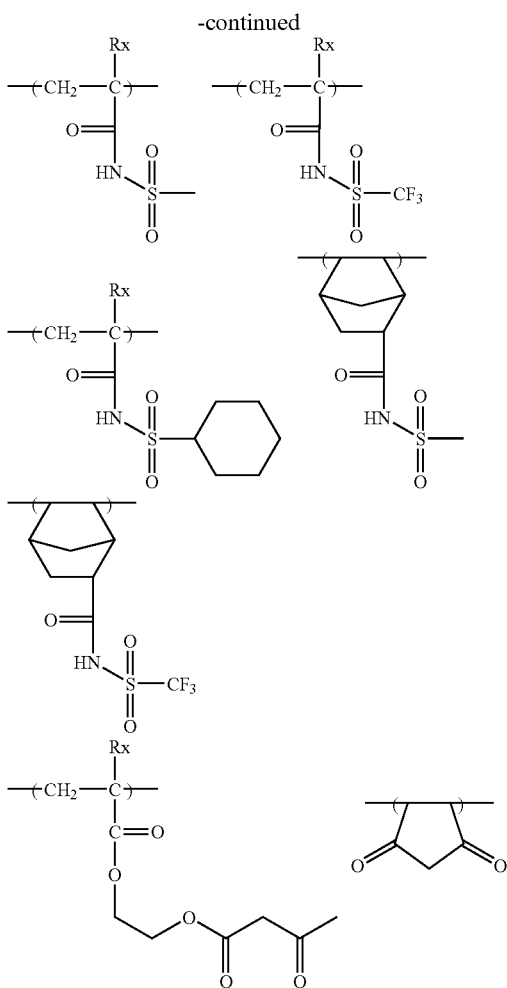

Examples of the groups (y) which decompose by the action of an alkaline developing solution to enhance solubility in the alkaline developing solution include groups having a lactone structure, acid anhydrides, and acid imide groups. Preferred are lactone groups.

In the case where the fluorine-containing compound (C) is a resin, preferred repeating units having a group (y) decomposing by the action of an alkaline developing solution to enhance solubility in the alkaline developing solution are repeating units each having a group enhancing solubility in an alkaline developing solution bonded to the main chain of the resin through a connecting group, such as repeating units derived from an acrylic ester or methacrylic ester. It also preferred that a polymerization initiator or chain-transfer agent having a group (y) enhancing solubility in an alkaline developing solution be used in polymerization to introduce the group into a polymer end.

The content of the repeating units having a group (y) enhancing solubility in an alkaline developing solution is preferably 1-40 mol %, more preferably 3-30 mol %, even more preferably 5-15 mol %, based on all repeating units in the polymer.

Specific examples of the repeating units having a group (y) enhancing solubility in an alkaline developing solution include the same lactone structures and structures represented by general formula (VIII) as those shown above with regard to the resin (A).

Examples of the groups (z) which decompose by the action of an acid include the same acid-decomposable groups as those enumerated above with regard to the resin (A). In the case where the fluorine-containing compound (C) is a resin, examples of repeating units containing a group (z) decomposing by the action of an acid include the same repeating units as those containing an acid-decomposable group which were shown above with regard to the resin (A). When the fluorine-containing compound (C) is a resin, the content of the repeating units having a group (z) decomposing by the action of an acid is preferably 1-80 mol %, more preferably 10-80 mol %, even more preferably 20-60 mol %, based on all repeating units in the polymer.

In the fluorine-containing compound (C), the fluorine atoms may be contained in the groups (x) to (z) or in other parts. In the case where the fluorine-containing compound (c) is a resin, the fluorine atoms may be contained in the main chain of the resin or in side chains thereof. Preferably, the fluorine atoms are contained in side chains. The fluorine atoms may be contained in the repeating units containing any of the groups (x) to (z) or may be contained in other repeating units.

It is preferred that the fluorine-containing compound (C) be a compound containing an alkyl group having one or more fluorine atoms (fluoroalkyl group) (preferably having 1-4 carbon atoms), a cycloalkyl group having one or more fluorine atoms, or an aryl group having one or more fluorine atoms.

The alkyl group having one or more fluorine atoms is a linear or branched alkyl group substituted by at least one fluorine atom. This group may have other substituents.

The cycloalkyl group having at least one fluorine atom is a monocyclic or polycyclic cycloalkyl group substituted by at least one fluorine atom. This group may have other substituents.

Examples of the aryl group having at least one fluorine atom include aryl groups, such as phenyl and naphthyl, which have been substituted by at least one fluorine atom. This group may have other substituents.

The alkyl group having one or more fluorine atoms, cycloalkyl group having one or more fluorine atoms, and aryl group having one or more fluorine atoms preferably have any of structures represented by the following general formulae (F1) to (F3).

(F1)

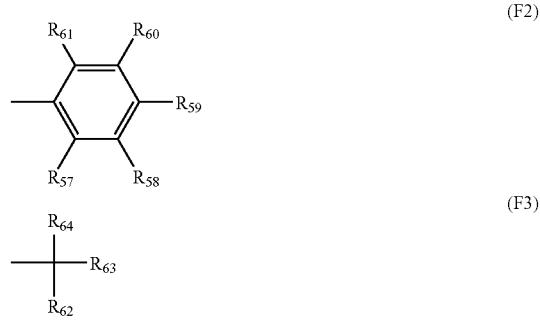

(F2)

(F3)

In general formulae (F1) to (F3),
$R_{50}$ to $R_{64}$ each independently represents a hydrogen atom, fluorine atom, or alkyl group, provided that at least one of $R_{50}$ to $R_{55}$, at least one of $R_{57}$ to $R_{61}$, and at least one of $R_{62}$ to $R_{64}$ each represent a fluorine atom or an alkyl group in which at least one hydrogen atom has been replaced by a fluorine atom (i.e., a fluoroalkyl group, which preferably has 1-4 carbon atoms).

It is preferred that all of $R_{50}$ to $R_{55}$ and $R_{57}$ to $R_{61}$ be fluorine atoms.

$R_{62}$ to $R_{63}$ each preferably are a fluoroalkyl group having 1-4 carbon atoms, and more preferably are a perfluoroalkyl group having 1-4 carbon atoms.

$R_{62}$ and $R_{63}$ may be bonded to each other to form a ring.

Examples of the structure represented by general formula (F1) include —$CF_2OH$, —$C(CF_3)_2OH$, —$C(C_2F_5)_2OH$, —$C(CF_3)(CH_3)OH$, and —$CH(CF_3)OH$. The structure preferably is —$C(CF_3)_2OH$.

Examples of the structure represented by general formula (F2) include p-fluorobenzene, pentafluorobenzene, and 3,5-di(trifluoromethyl)benzene.

Examples of the structure represented by general formula (F3) include trifluoroethyl, pentafluoropropyl, pentafluoroethyl, heptafluorobutyl, hexafluoroisopropyl, heptafluoroisopropyl, hexafluoro(2-methyl)isopropyl, nonafluorobutyl, octafluoroisobutyl, nonafluorohexyl, nonafluoro-t-butyl, perfluoroisopentyl, perfluorooctyl, perfluoro(trimethyl)hexyl, 2,2,3,3-tetrafluorocyclobutyl, and perfluorocyclohexyl. The structure preferably is hexafluoroisopropyl, heptafluoroisopropyl, hexafluoro(2-methyl)isopropyl, octafluoroisobutyl, nonafluoro-t-butyl, or perfluoroisopentyl, and more preferably is hexafluoroisopropyl or heptafluoroisopropyl.

The compound (C) preferably is any of the following resins (C-1) to (C-13). More preferably, it is any of resins (C-1) to (C-4) and (C-8) to (C-13).

(C-1)
A resin comprising
repeating units (a) having a fluoroalkyl group and
repeating units (X) containing an alkali-soluble group (x).
This resin more preferably is a copolymer resin consisting only of repeating units (a) and repeating units (X).

(C-2)
A resin comprising
repeating units (a) having a fluoroalkyl group and
repeating units (Y) containing a group (y) decomposing by the action of an alkaline developing solution to enhance solubility in the alkaline developing solution.
This resin more preferably is a copolymer resin consisting only of repeating units (a) and repeating units (Y).

(C-3)
A resin comprising
repeating units (a) having a fluoroalkyl group and
repeating units (Z) containing a group (z) decomposing by the action of an acid.
This resin more preferably is a copolymer resin consisting only of repeating units (a) and repeating units (Z).

(C-4)
A resin comprising
repeating units (a) having a fluoroalkyl group,
repeating units (X) containing an alkali-soluble group (x), and
repeating units (Y) containing a group (y) decomposing by the action of an alkaline developing solution to enhance solubility in the alkaline developing solution.
This resin more preferably is a copolymer resin consisting only of repeating units (a), repeating units (X), and repeating units (Y).

(C-5)
A resin comprising
repeating units (a) having a fluoroalkyl group,
repeating units (X) containing an alkali-soluble group (x), and
repeating units (Z) containing a group (z) decomposing by the action of an acid.
This resin more preferably is a copolymer resin consisting only of repeating units (a), repeating units (X), and repeating units (Z).

(C-6)
A resin comprising
repeating units (a) having a fluoroalkyl group,
repeating units (Y) containing a group (y) decomposing by the action of an alkaline developing solution to enhance solubility in the alkaline developing solution, and
repeating units (Z) containing a group (z) decomposing by the action of an acid.
This resin more preferably is a copolymer resin consisting only of repeating units (a), repeating units (Y), and repeating units (Z).

(C-7)
a resin comprising
repeating units (a) having a fluoroalkyl group,
repeating units (X) containing an alkali-soluble group (x),
repeating units (Y) containing a group (y) decomposing by the action of an alkaline developing solution to enhance solubility in the alkaline developing solution, and
repeating units (Z) containing a group (z) decomposing by the action of an acid.
This resin more preferably is a copolymer resin consisting only of repeating units (a), repeating units (X), repeating units (Y), and repeating units (Z).

(C-8)
A resin comprising
repeating units (aX) containing both an alkali-soluble group (x) and a fluoroalkyl group.
This resin more preferably is a resin (homopolymer) consisting only of repeating units (aX).

(C-9)
A resin comprising
repeating units (bY) containing both a group (y) decomposing by the action of an alkaline developing solution to enhance solubility in the alkaline developing solution and a fluoroalkyl group.
This resin more preferably is a resin (homopolymer) consisting only of repeating units (bY).

(C-10)
A resin comprising
repeating units (aX) containing both an alkali-soluble group (x) and a fluoroalkyl group having 1-4 carbon atoms and
repeating units (Y) containing a group (y) decomposing by the action of an alkaline developing solution to enhance solubility in the alkaline developing solution.
This resin more preferably is a copolymer resin consisting only of repeating units (aX) and repeating units (Y).

(C-11)
A resin comprising
repeating units (aX) containing both an alkali-soluble group (x) and a fluoroalkyl group and
repeating units (Z) containing a group (z) decomposing by the action of an acid.
This resin more preferably is a copolymer resin consisting only of repeating units (aX) and repeating units (Z).

(C-12)
A resin comprising
repeating units (a) having a fluoroalkyl group and
repeating units (aX) containing both an alkali-soluble group (x) and a fluoroalkyl group.

This resin more preferably is a copolymer resin consisting only of repeating units (a) and repeating units (aX).

(C-13)

A resin comprising repeating units (a) having a fluoroalkyl group and repeating units (aY) containing both a group (y) decomposing by the action of an alkaline developing solution to enhance solubility in the alkaline developing solution and a fluoroalkyl group.

This resin more preferably is a copolymer resin consisting only of repeating units (a) and repeating units (aY).

In such copolymers, the repeating unit (a) having a fluoroalkyl group preferably does not contain any alkali-soluble group.

In resins (C-1), (C-2), and (C-4), the amount of repeating units (a) incorporated is preferably 40-99% by mole, more preferably 60-80% by mole.

In resin (C-10), the amount of repeating units (aX) incorporated is preferably 40-99% by mole, more preferably 60-90% by mole.

Specific examples of repeating units having one or more fluorine atoms include repeating units represented by formulae (C1) to (C8), which will be described later. Specific examples of repeating units (aX) include repeating units (C1) and (C2), which will be described later. In particular, as specific examples of the repeating unit (a), the repeating unit represented by (C4) to (C7) to be described later can be mentioned for example, specifically including the following ones.

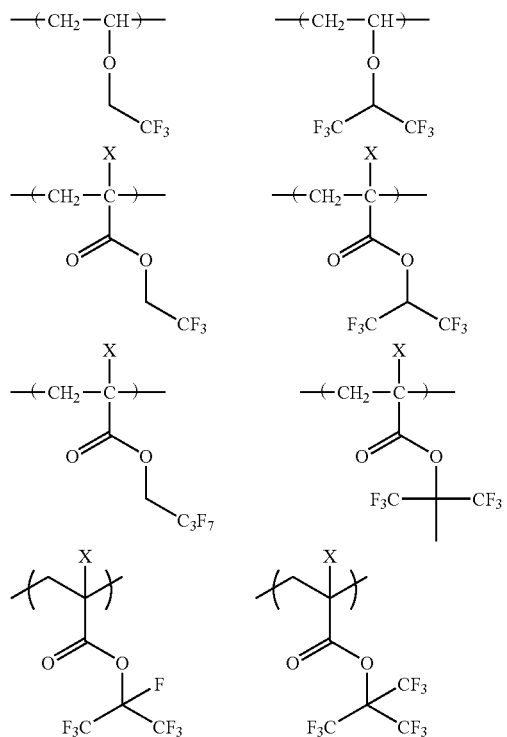

As the repeating unit (aX), the repeating units (C1) and (C2) can be mentioned for example, specifically including the following ones.

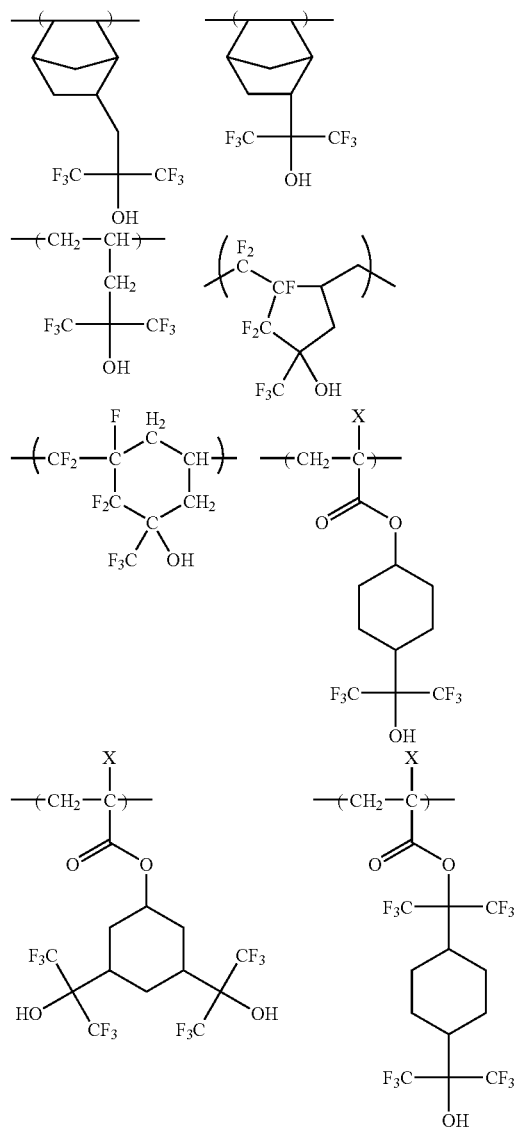

As the repeating unit (aY), those (C3), which will be described later, are mentioned as examples.

The fluorine-containing compound (C) in the invention can contain various repeating structural units, besides the repeating units (C1) to (C8) which will be described later, for the purpose of regulating film-forming properties, applicability, compatibility, and receding contact angle.

Examples of such repeating units include units derived from a compound having one or more addition-polymerizable unsaturated bonds which is selected from acrylic esters, methacrylic esters, acrylamide and derivatives thereof, methacrylamide and derivatives thereof, styrene and derivatives thereof, allyl compounds, vinyl ethers, vinyl esters, and the like. Preferably, the compound is an acrylic or methacrylic ester having a branched alkyl group having 6-20 carbon atoms or a cycloalkyl group having 6-20 carbon atoms, acrylamide or a derivative thereof, methacrylamide or a derivative thereof, or styrene which may have an alkyl group having 1-10 carbon atoms.

Furthermore, any addition-polymerizable unsaturated compound copolymerizable with the monomers corresponding to those various repeating structural units may have been copolymerized.

Specific examples of the fluorine-containing compound (C) include resins containing repeating units represented by any of the following general formulae (C1) to (C8).

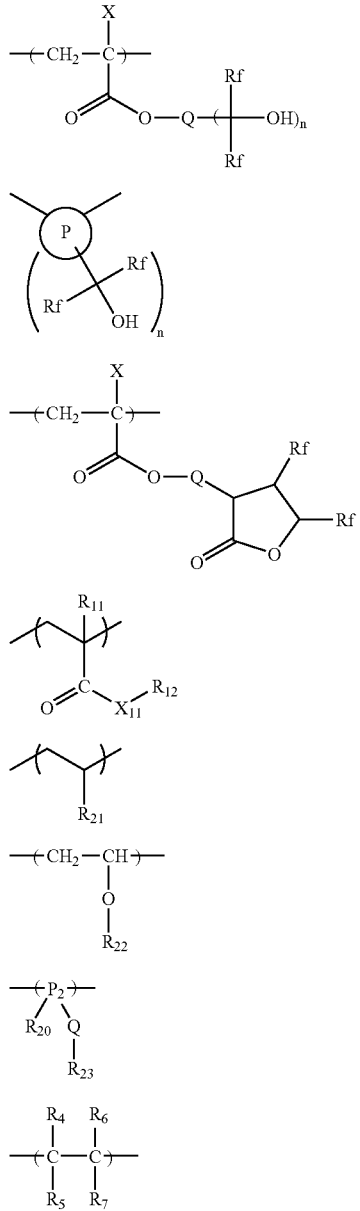

In general formulae (C1) to (C8),

Rf's each independently represents a group having a fluoroalkyl group (preferably having 1-4 carbon atoms).

P represents a linear or branched alkylene group or a monocyclic or polycyclic cycloalkylene group, and preferably is methylene, ethylene, cyclohexylene, adamantylene, or norbornylene.

X's each independently represents a hydrogen atom, halogen atom, or alkyl group. The alkyl group may be linear or branched and may have one or more substituents, e.g., halogen atoms.

Q's each independently represents a single bond, an alkylene group, a divalent group having a monocyclic or polycyclic alicyclic hydrocarbon structure, an ether, ester, or carbonyl group, or a divalent group comprising a combination of two or more of these, provided that in formula (C1), when n is 2 or 3, then Q represents any of those divalent groups substituted by one or two groups represented by $-C(Rf)_2-OH$. Q preferably is a single bond or a connecting group represented by $-Q_1-CO_2-$. $Q_1$ is a linear or branched alkylene group or a monocyclic or polycyclic cycloalkylene group, and preferably is methylene, ethylene, cyclohexylene, adamantylene, or norbornylene.

Symbol n's each independently represents a natural number of 1-3.

$X_{11}$ represents an oxygen atom or a group represented by $-N(R_{13})-$. $R_{13}$ represents a hydrogen atom, linear or branched alkyl group (preferably having 1-20 carbon atoms), or cycloalkyl group (preferably having up to 20 carbon atoms).

$R_{11}$'s each independently represents a hydrogen atom, halogen atom, or alkyl group. The alkyl group may be linear or branched and may have one or more substituents, e.g., halogen atoms.

$R_{12}$ and $R_{21}$ to $R_{23}$ each independently represents an organic group having at least one fluorine atom.

$P_2$ represents an alicyclic group.

$R_{20}$ represents an organic group.

$R_4$ to $R_7$ each represent a hydrogen atom, a fluorine atom, a linear or branched alkyl group having 1-4 carbon atoms, or a linear or branched fluoroalkyl group having 1-4 carbon atoms, provided that at least one of $R_4$ to $R_7$ represents a fluorine atom and that $R_4$ and $R_5$ or $R_6$ and $R_7$ may form a ring.

Preferred examples of the repeating units having one or more fluorine atoms, in the case where the fluorine-containing compound has a high molecular weight (resin), are shown below, but the repeating units should not be construed as being limited to the following examples.

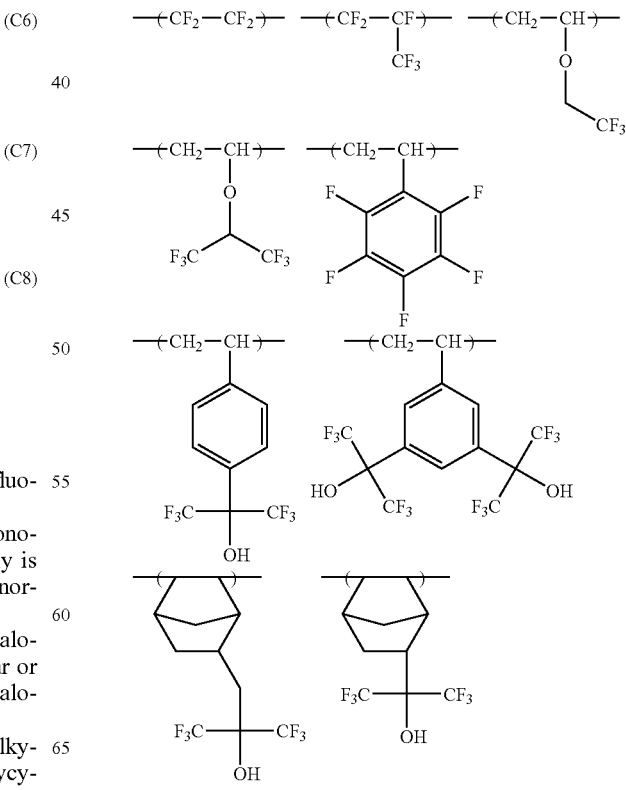

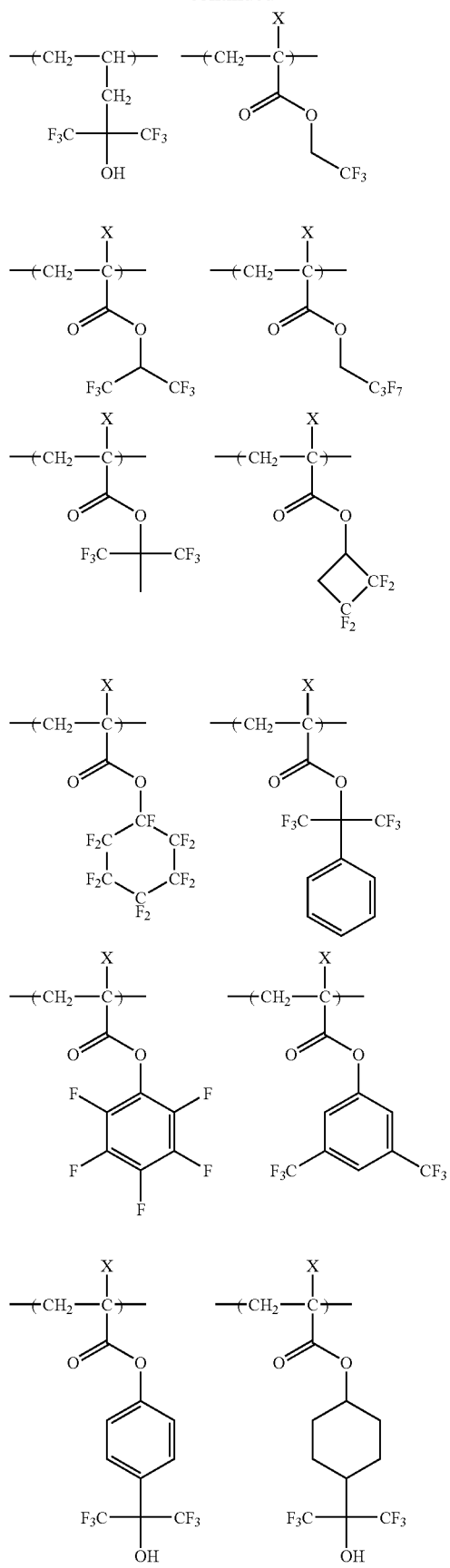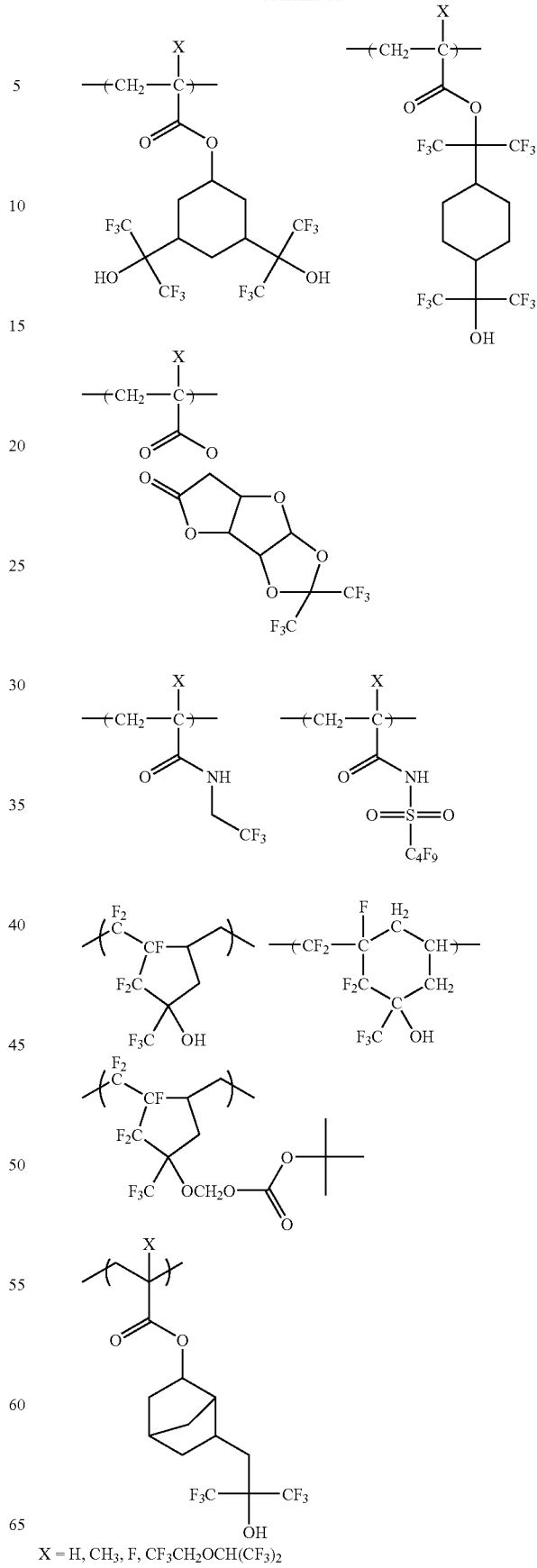
X = H, CH$_3$, F, CF$_3$CH$_2$OCH(CF$_3$)$_2$

Specific examples of the fluorine-containing compound having a high molecular weight (resin) are shown below, but the compound should not be construed as being limited to the following examples.
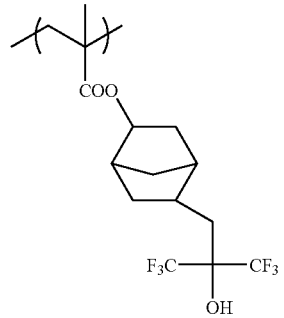
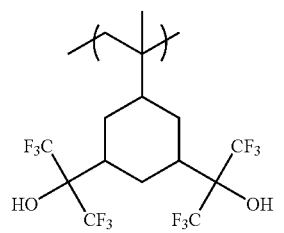
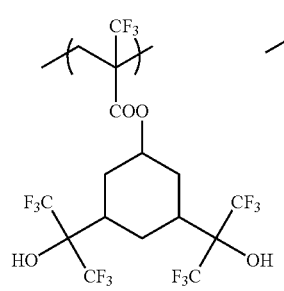
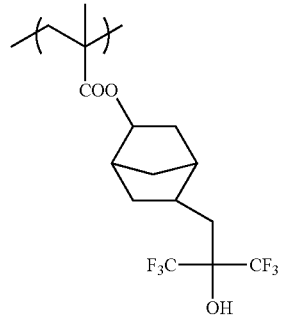
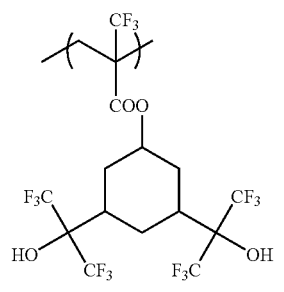
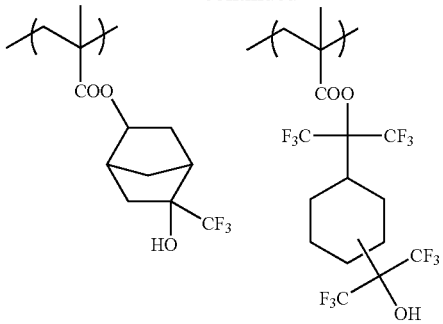
-continued
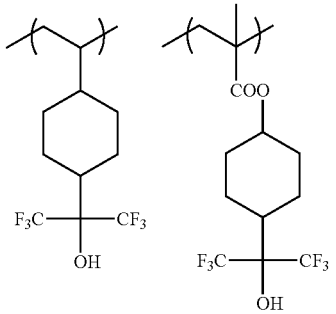
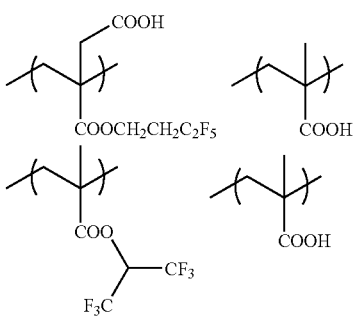
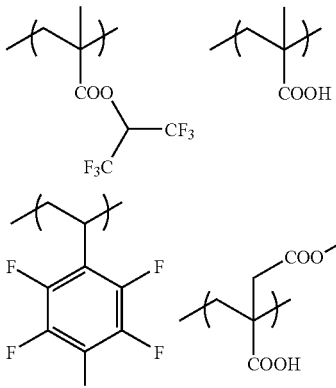
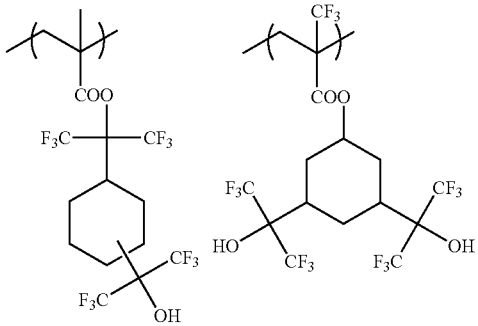

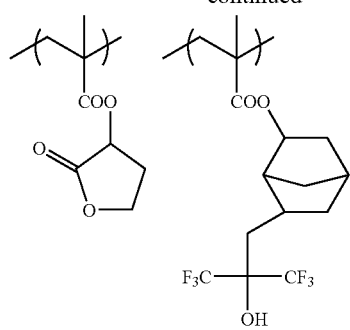
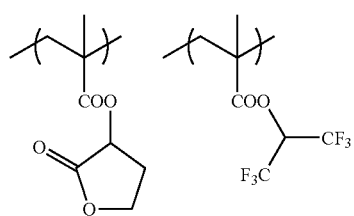
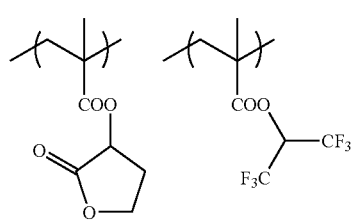
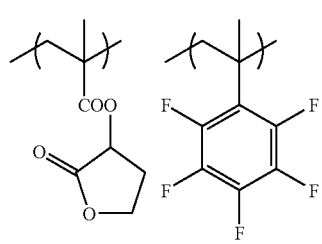
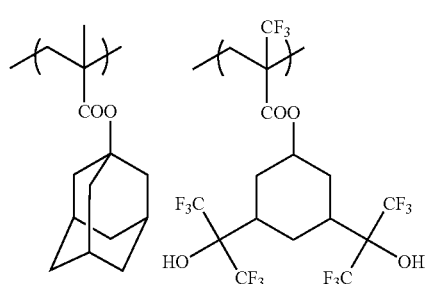
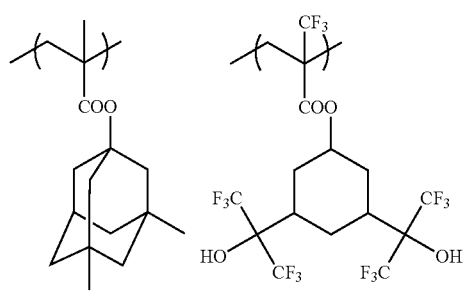
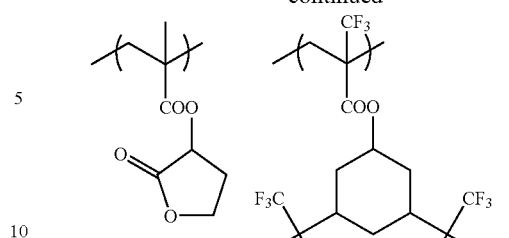
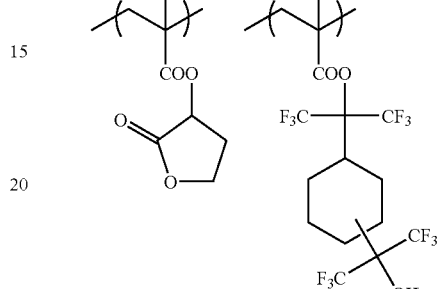
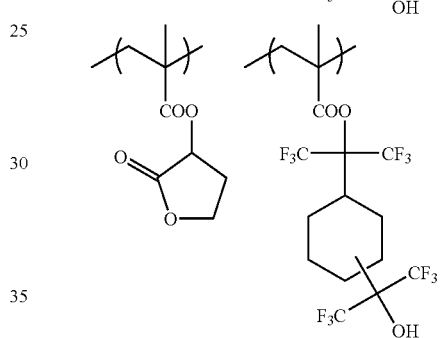
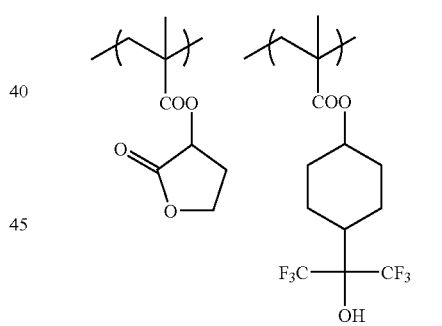
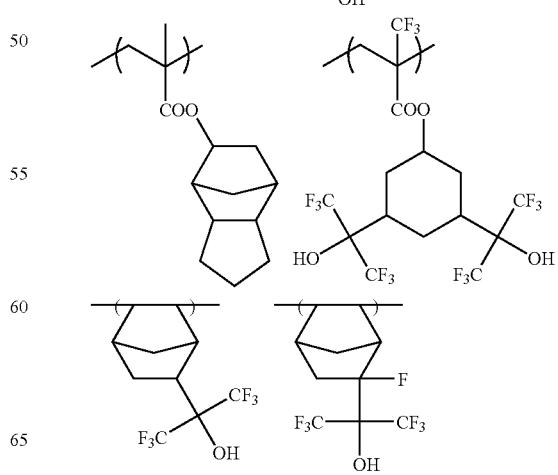

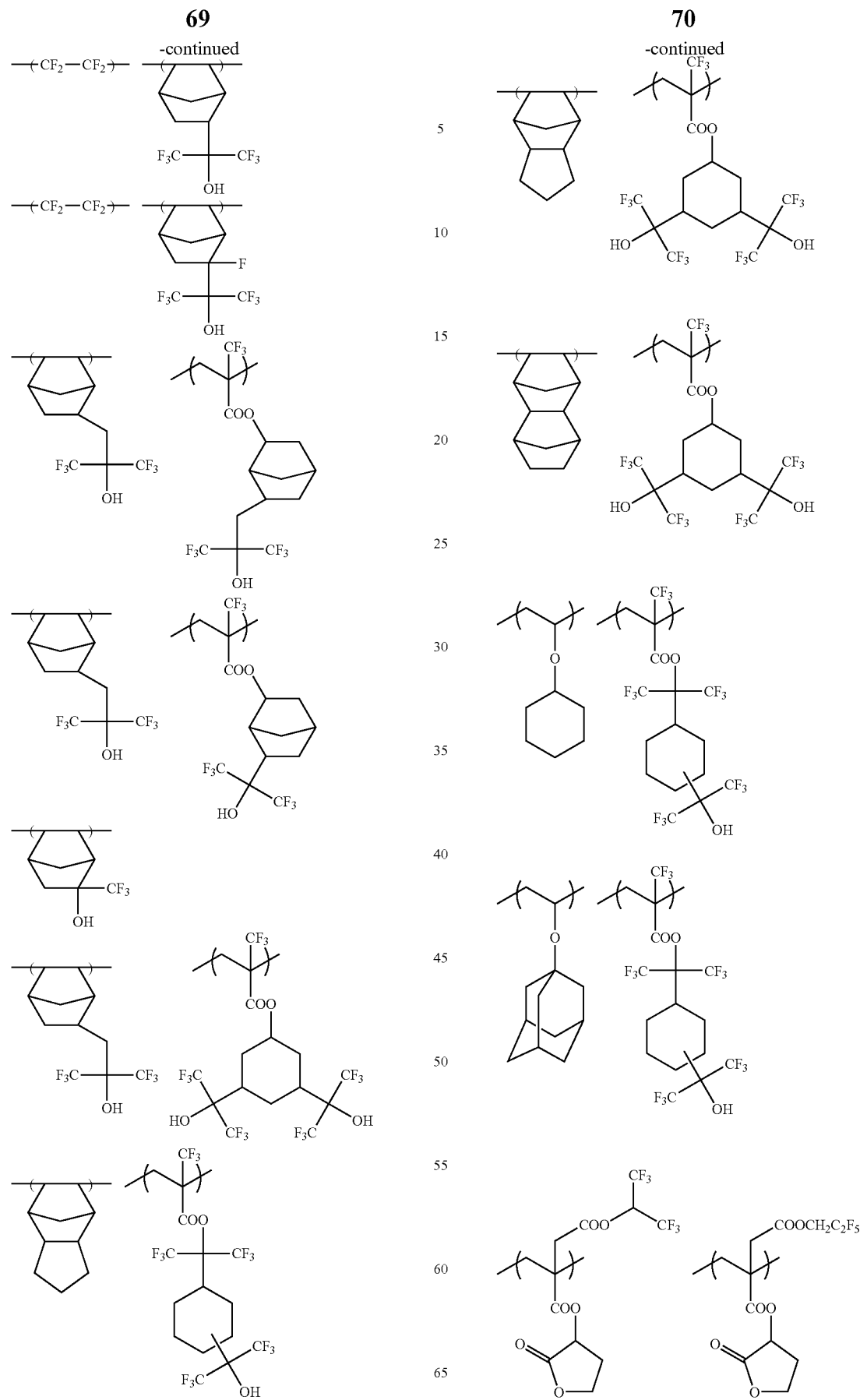

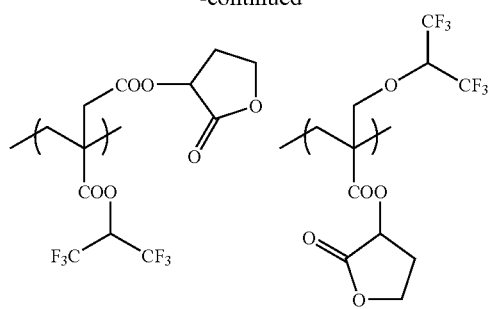
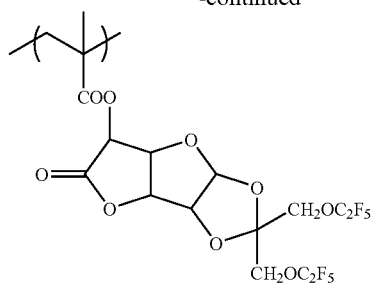
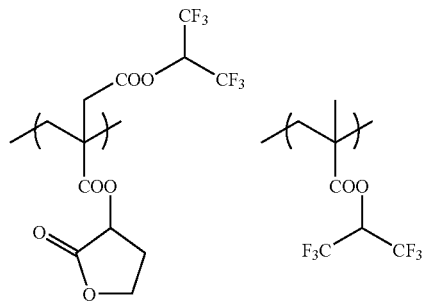
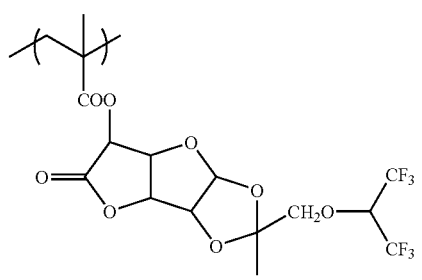
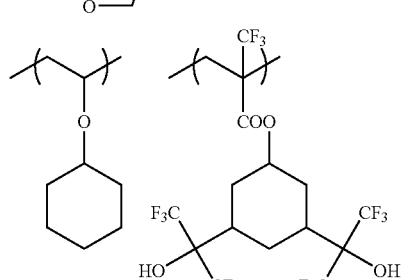
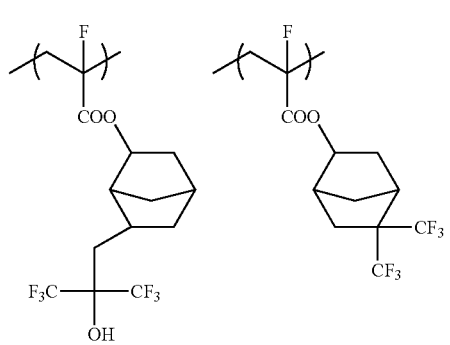
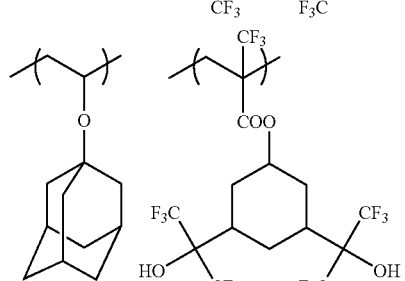
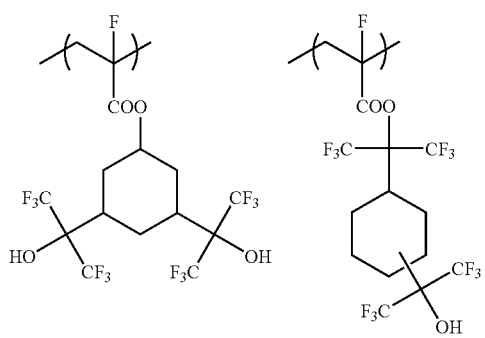
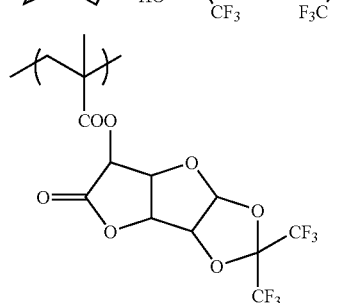
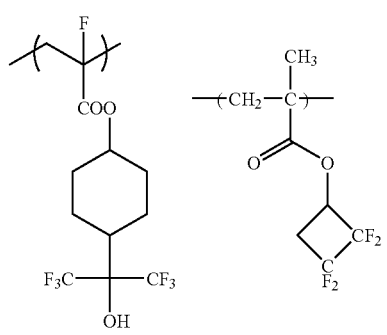
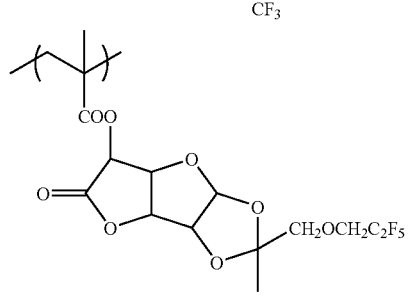

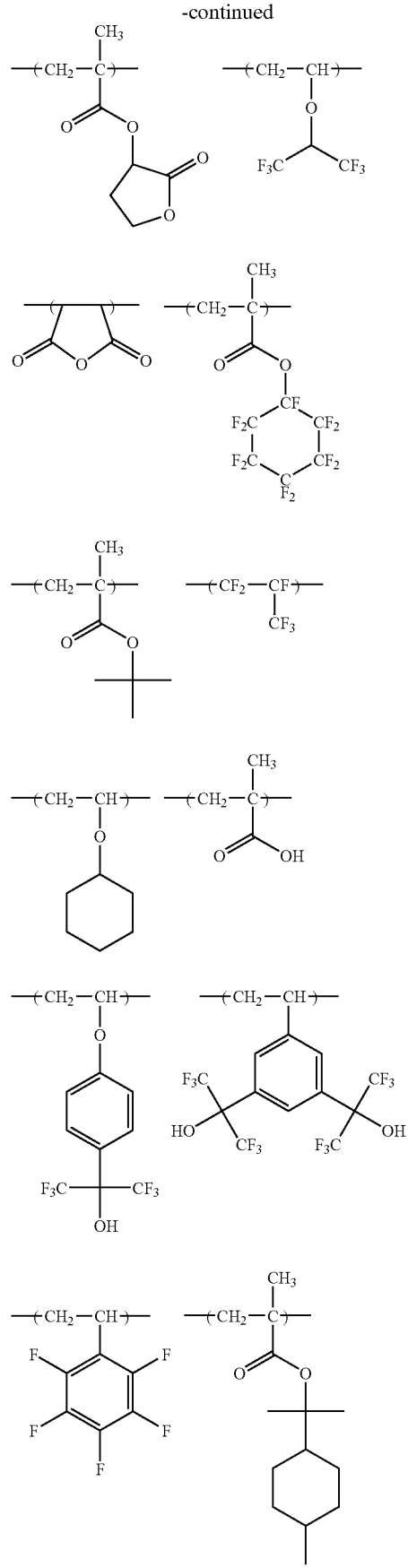
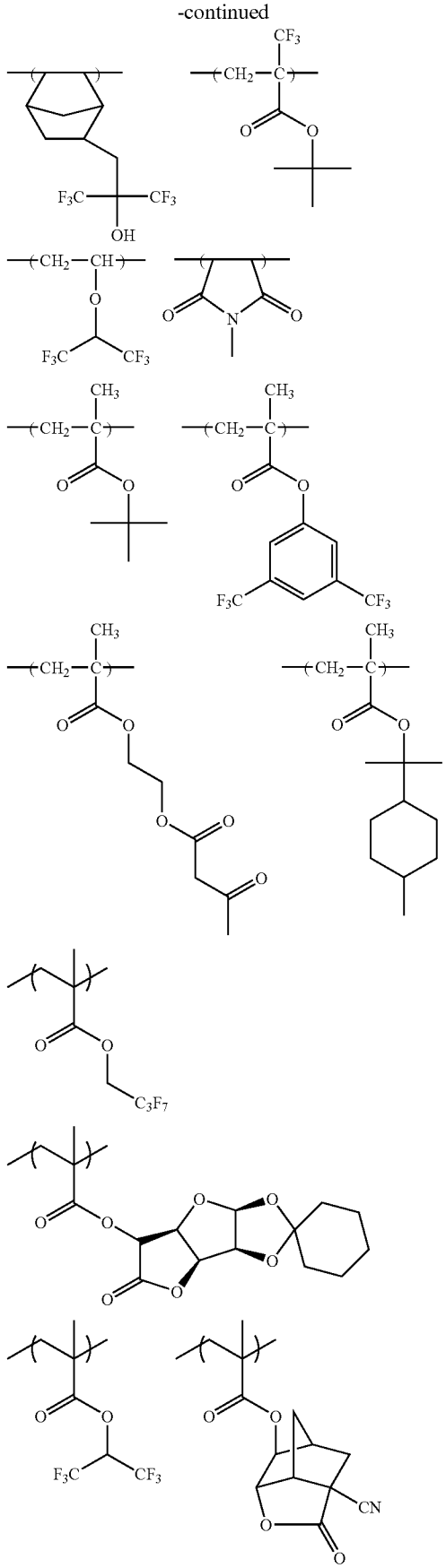

75
-continued
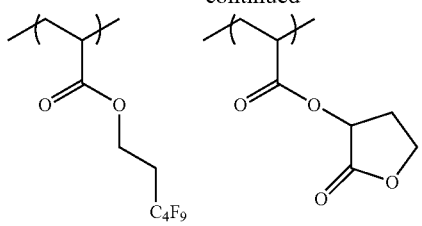
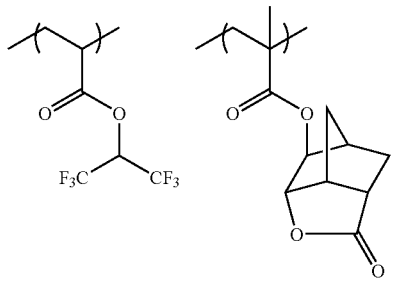
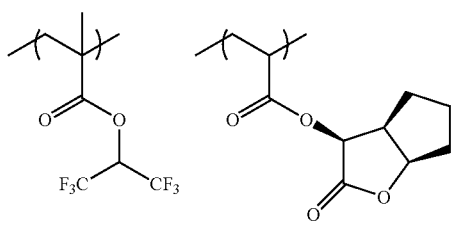
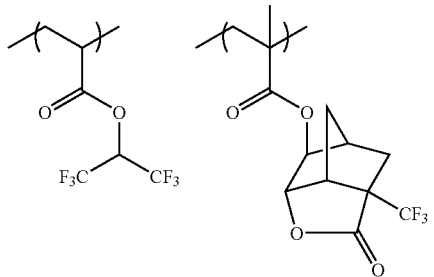
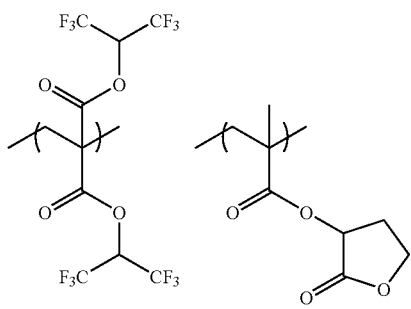
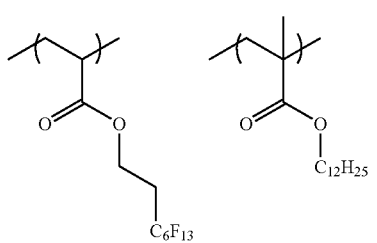
76
-continued
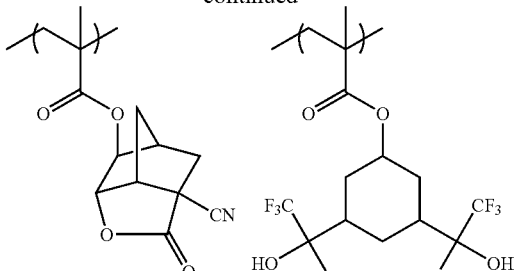
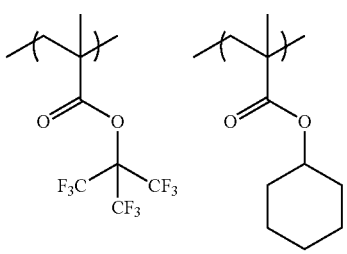
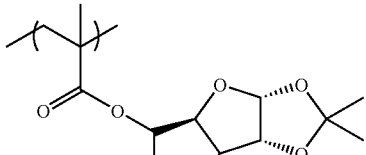
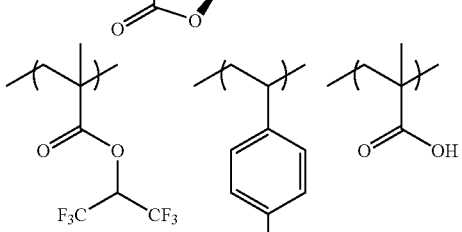
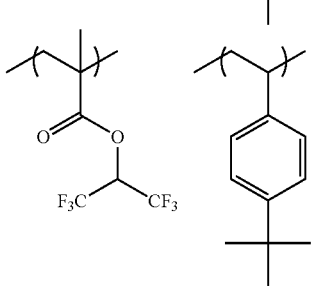
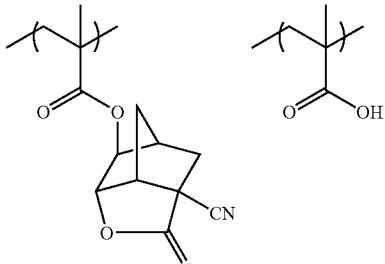
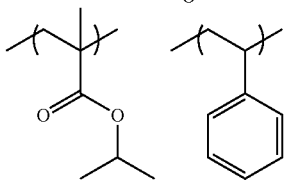

-continued

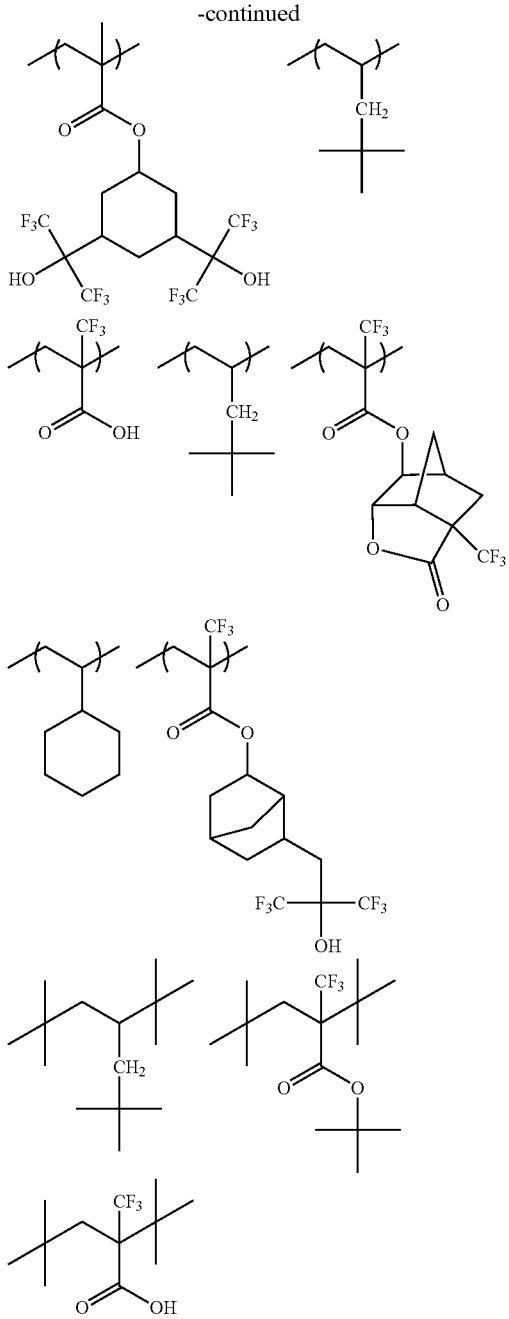

In the case where the fluorine-containing compound (C) is an alkali-soluble compound, the amount of the alkali-soluble groups (acid groups) is preferably 0.1-10 meq/g, more preferably 0.1-3 meq/g, even more preferably 0.1-2 meq/g, in terms of the acid value of the alkali-soluble compound (C). The acid value means the amount (mg) of potassium hydroxide required for neutralizing the compound.

The fluorine-containing compound (C) contains fluorine atoms in an amount of preferably 5-80% by mass, more preferably 10-80% by mass, even more preferably 20-60% by mass, based on the molecular weight of the fluorine-containing compound (C).

Although the fluorine-containing compound (C) may be either a low-molecular compound or a high-molecular compound (e.g., a resin), it preferably is a high-molecular compound in view of the trouble that low-molecular components are released from a resist into an immersion liquid to foul the lens. The molecular weight thereof is preferably 1,000-100,000, more preferably 1,000-50,000, even more preferably 1,500-15,000.

In the case where the fluorine-containing compound (C) is a resin, the amount of residual monomers therein is preferably 0-10% by mass, more preferably 0-5% by mass, even more preferably 0-1% by mass. From the standpoints of resolution, resist shape, resist pattern side walls, roughness, etc., use is made of a resin having a molecular-weight distribution (Mw/Mn; referred to also as dispersity ratio) in the range of preferably 1-5, more preferably 1-3, even more preferably 1-1.5.

The amount of the fluorine-containing compound (C) added to the positive resist composition is preferably 0.1-30% by mass, more preferably 0.1-10% by mass, even more preferably 0.1-5% by mass, based on all solid components of the resist composition.

One fluorine-containing compound (C) may be used alone, or a mixture of two or more fluorine-containing compounds (C) may be used.

The fluorine-containing compound (C) to be used can be any of various commercial products or can be synthesized by an ordinary method. For example, in the case where the compound (C) is a resin, it can be obtained through, e.g., radical polymerization such as that for the synthesis of the acid-decomposable resin (A) described above and general purification, etc.

It is a matter of course that the fluorine-containing compound (C) is reduced in the content of impurities such as metals like the resin (A) containing acid-dissociable groups. In addition, when the compound (C) is a high-molecular compound, it is preferred that the amount of residual monomers and oligomer components is not larger than a predetermined value, e.g., 0.1% by mass in terms of HPLC value. Thus, not only the composition can give a resist further improved in sensitivity, resolution, process stability, pattern shape, etc., but also a resist is obtained which is not causative of foreign-matter generation in the liquid and does not change with time in sensitivity, etc.

Fluorine-containing compound (C) is preferably the following resin (C1) or (C2), too.

The resin (C1) has the structure represented by the following formula.

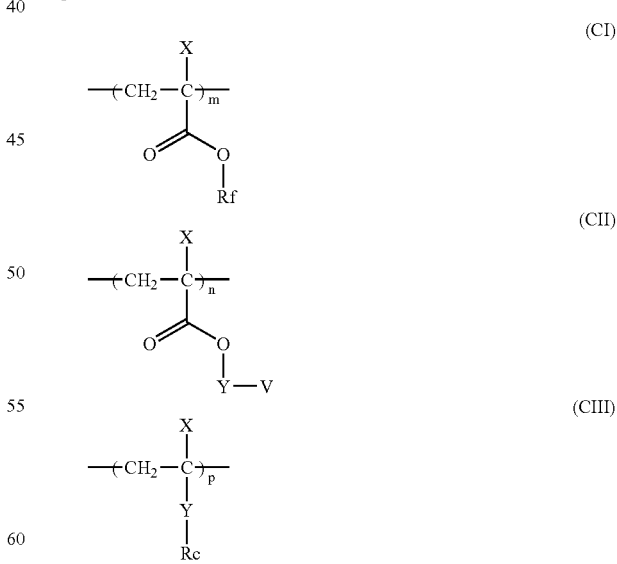

In formulae (CI) to (CIII);

X each independently represents a hydrogen atom, a halogen atom or an alkyl group, which may be of straight-chain or branched, or further may have a substituent group such as a halogen atom;

Rf each independently represents a fluorine-containing alkyl group having a straight-chain or branched alkyl group substituted with at least one fluorine atom, preferably being one represented by the aforementioned general formula (F2) or (F3).

Y represents an alkylene group, a di-valent connecting group having an alicyclic hydrocarbon structure (monocyclic or polycyclic), a single bond, an ether group, an ester group, a carboxyl group or a carboxyl group, or a di-valent group combining these groups. Among these, a single bond is preferred.

V represents a group having a lactone ring, preferably representing the group represented by one of the general formulae (LC1-1) to (LC1-16) for the aforementioned resin (A).

Rc each independently represents an unsubstituted hydrocarbon group, provided that Rc does not contain a hetero atom such as oxygen or halogen. Specifically, Rc represents a branched alkyl group, a cycloalkyl group, a branched alkenyl group, a cycloalkenyl group or an aryl group. Preferably Rc has 4 to 20 carbon atoms, more preferably 7 to 15, whereby it may be of straight-chain, branched or cyclic, but preferably branched or cyclic.

m, n and p each represents a number satisfying the following relationship. $m+n+p=100$, $0<m<100$, $0<n<100$ and $0 \leq p<100$; preferably m is from 20 to 80, n is from 20 to 60, and p is from 0 to 50, and more preferably m is from 20 to 80, n is from 20 to 40 and p is from 10 to 50.

The resin (C2) has the structure represented by the following formula.

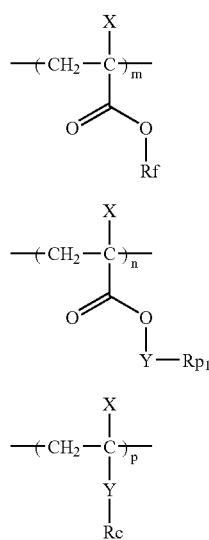

In formulae (CI), (CIV) and (CIII), X, Rf, Y and Rc are the same as those in the aforementioned (CI) to (CIII).

$Rp_1$ represents a group which decomposes by the action of an acid.

m, n and p each represents a number satisfying the following relationship.

$m+n+p=100$, $0<m<100$, $0<n<100$ and $0 \leq p<100$.

Preferably m is 10 to 90, n is 10 to 90 and p is 0 to 50, and more preferably m is 20 to 80, n is 20 to 80 and p is 10 to 50.

In the following, specific preferable examples for the repeating unit represented by general formula (CI) are shown, but the repeating unit should not be construed as being limited thereto.

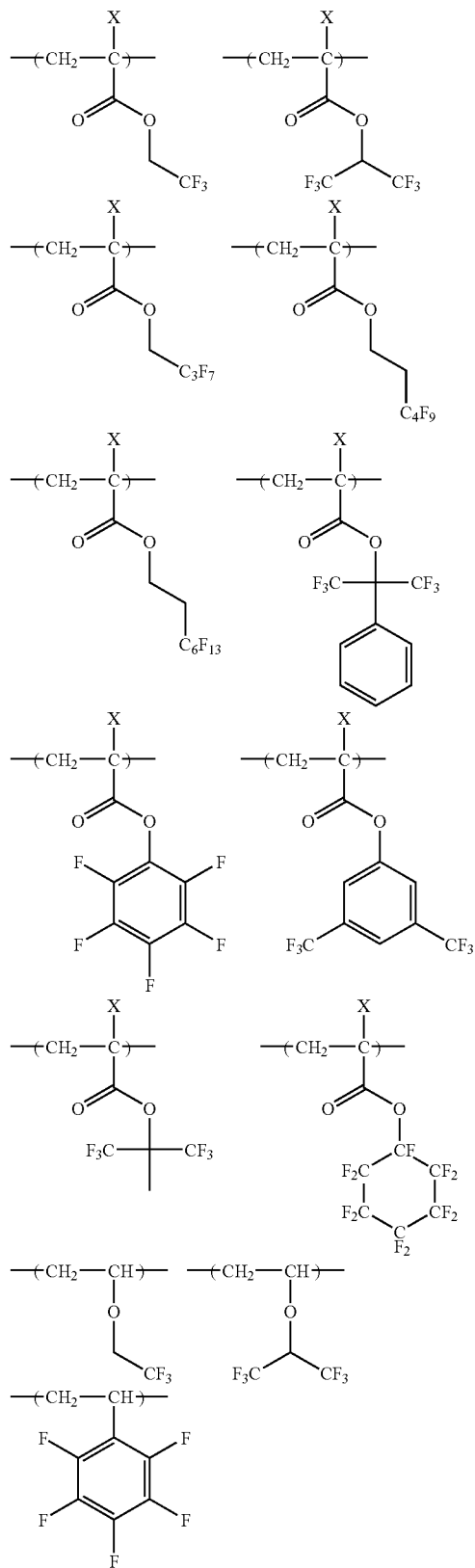

As the repeating unit represented by general formula (CII), those for the repeating unit having a lactone structure in the aforementioned resin (A) can be specifically mentioned.

In the following, preferable specific examples for the repeating unit represented by general formula (CIII) are shown, but the repeating unit should not be construed as being limited thereto.

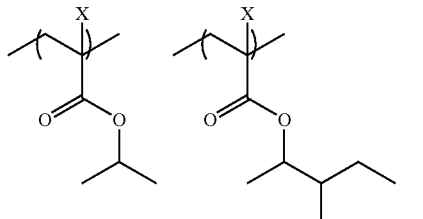
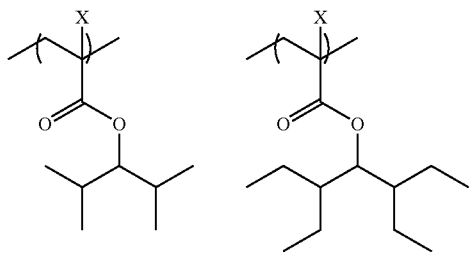
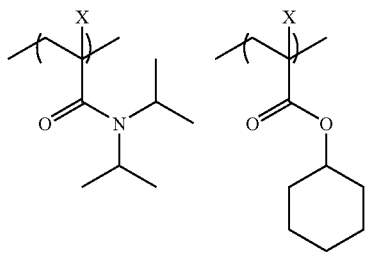
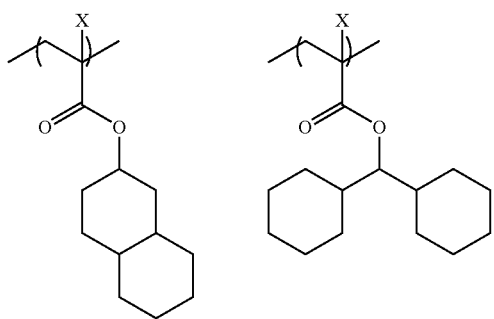
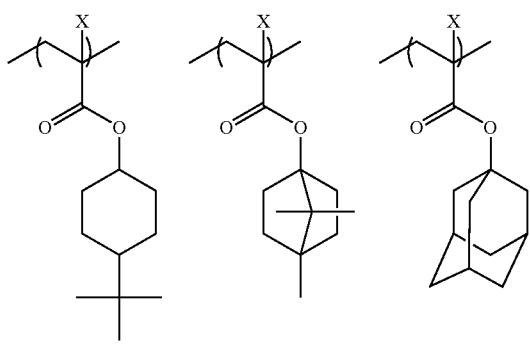

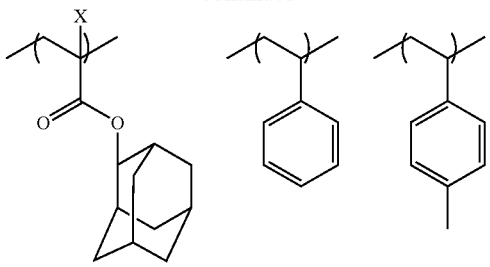

-continued

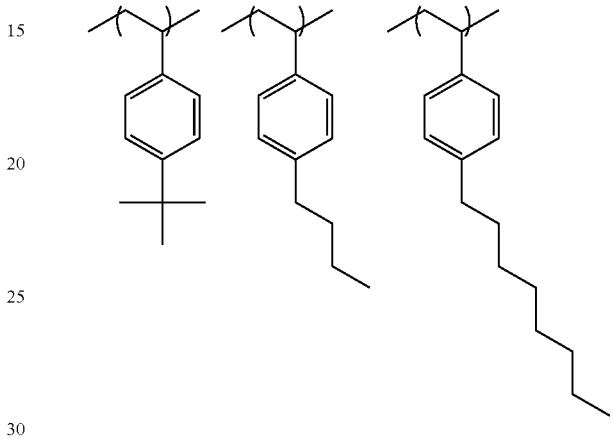

As the group which decomposes by the action of an acid in general formula (CIV), for example, —C($R_{36}$)($R_{37}$)($R_{38}$) and —CH$_2$(O$R_{39}$) can be mentioned.

$R_{36}$ to $R_{39}$ each independently represent an alkyl group, a cycloalkyl group, an aryl group, an aralkyl group or an alkenyl group. $R_{36}$ and $R_{37}$ may combine together to form a ring.

The alkyl group for $R_{36}$ to $R_{39}$ preferably has 1 to 10 carbon atoms, i.e., representing, for example, methyl, ethyl, propyl, n-butyl, sec-butyl, hexyl or octyl.

The cycloalkyl group for $R_{36}$ to $R_{39}$ may be monocyclic or polycyclic. As a monocyclic group, cycloalkyl groups with 3 to 8 carbon atoms are preferred, i.e., representing, for example, cyclopropyl, cyclobutyl, cyclopentyl, cyclohexyl or cyclooctyl. As a polycyclic group, cycloalkyl groups with 6 to 20 carbon atoms are preferred, representing, for example, adamantyl, norbornyl, isobornyl, camphanyl, dicyclopentyl, α-pinenyl, tricyclodecanyl, tetracyclododecyl or androstanyl.

The aryl group for $R_{36}$ to $R_{39}$ preferably has 6 to 10 carbon atoms, representing, for example, phenyl, naphthyl or anthryl.

The aralkyl group for $R_{36}$ to $R_{39}$ preferably has 7 to 12 carbon atoms, representing, for example, benzyl, phenetyl or naphtylmethyl.

The alkenyl group for $R_{36}$ to $R_{39}$ preferably has 2 to 8 carbon atoms, representing, for example, vinyl, allyl, butenyl or cyclohexenyl.

In the following, specific preferable examples for the repeating unit represented by general formula (CIV) are shown, but the repeating unit should not be construed as being limited thereto.

(In the formulae, Rx represents H or CH$_3$, Rxa and Rxc each represent an alkyl group with 1 to 4 carbon atoms.)

83
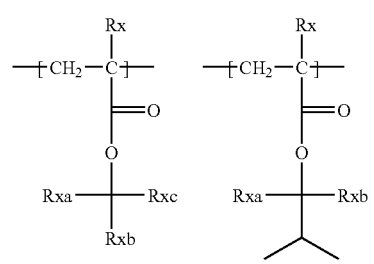
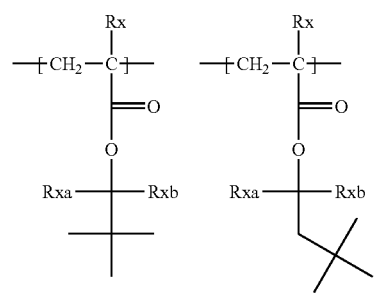
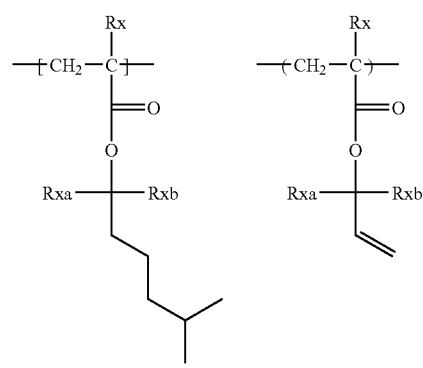
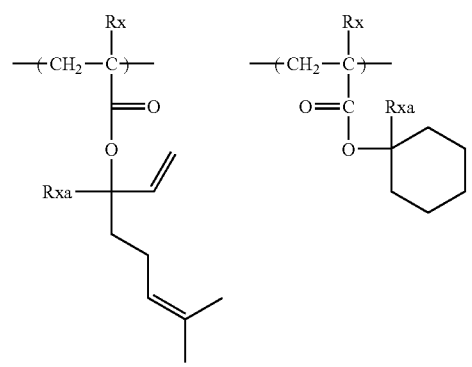
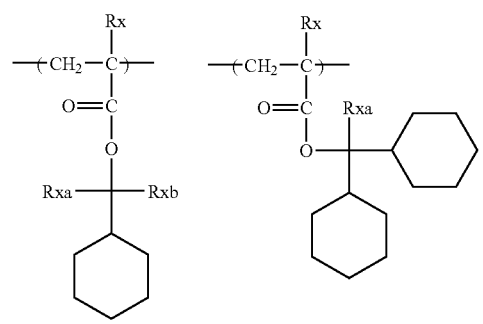
84
-continued
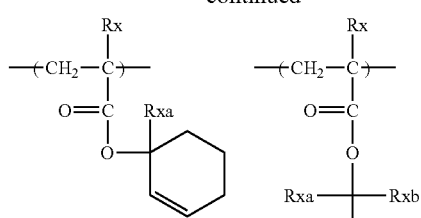
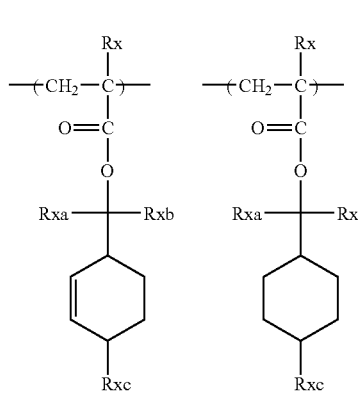
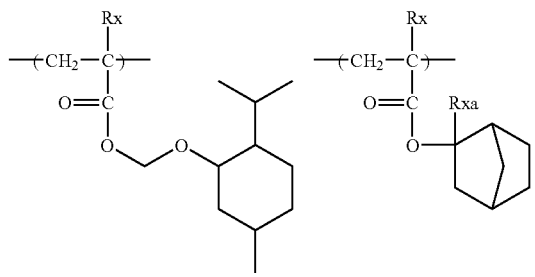
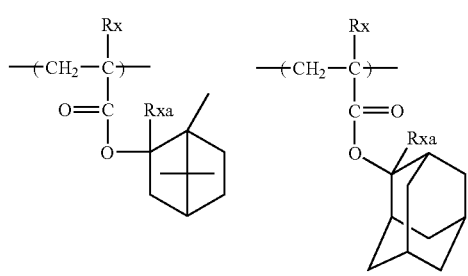
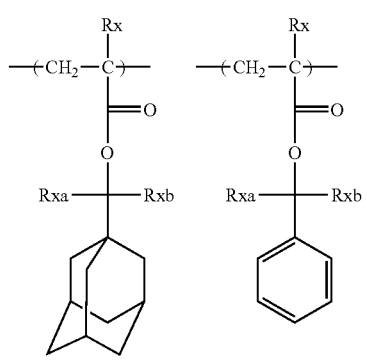

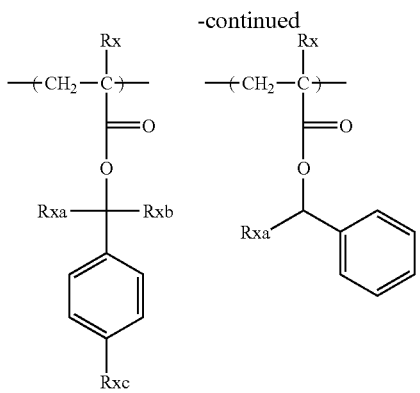

The resin (C1) and (C2) can be synthesized by ordinary methods (e.g., radical polymerization). Examples of general synthesis methods include the en bloc polymerization method in which monomers and an initiator are dissolved in a solvent and the solution is heated to thereby polymerize the monomers and the dropping polymerization method in which a solution of monomers and an initiator is added dropwise to a heated solvent over 1-10 hours. The dropping polymerization method is preferred. Examples of the reaction solvent include ethers such as tetrahydrofuran, 1,4-dioxane, and diisopropyl ether, ketones such as methyl ethyl ketone and methyl isobutyl ketone, ester solvents such as ethyl acetate, amide solvents such as dimethylformamide and dimethylacetamide, and solvents capable of dissolving the composition of the invention therein, such as those which will be shown later, e.g., propylene glycol monomethyl ether acetate, propylene glycol monomethyl ether and cyclohexanone. It is more preferred that polymerization be conducted using the same solvent as that to be used in the resist composition of the invention. Use of this solvent can suppress particle generation during storage.

It is preferred that the polymerization reaction be conducted in an inert gas atmosphere such as nitrogen or argon. A commercially available radical initiator (e.g., azo initiator or peroxide) is used as a polymerization initiator to initiate the polymerization. The radical initiator preferably is an azo initiator, which preferably is an azo initiator having an ester group, cyano group, or carboxyl group. Preferred initiators include azobisisobutyronitrile, azobisdimethylvaleronitrile, and dimethyl 2,2'-azobis(2-methylpropionate). The initiator may be added additionally or in portions according to need.

The reaction temperature is generally 10-150° C., preferably 30-120° C., more preferably 50-100° C.

After completion of the reaction, the reaction mixture is left for cooling and subjected to purification operation. As the purification operation, those ordinarily in use can be adopted, including purification methods under solution state such as liquid-liquid extraction method which removes the residual monomers or oligomer components by rinsing with water or combining suitable solvents, and ultrafiltration which extracts and removes ingredients having molecular weights below a specified value, and those under solid state such as the reprecipitation method that removes residual monomers by coagulating the resin in a poor solvent, and one based on rinsing the filtered resin slurry with a poor solvent. For example, the resin is separated as a solid by bringing a solvent in which the aforementioned resin is sparingly soluble or difficult to solve (a poor solvent) in a volume amount ten times or less (preferably in a volume amount ten to five times) of that of the reaction solution into contact with the reaction solution.

As the solvent used for the precipitation or reprecipitation operation from a polymer solution (precipitation or reprecipitation solvent), any one can be used so long as it is a poor solvent for the polymer. Depending on the type of polymer, there may be used according to appropriate choice, for example, hydrocarbons (aliphatic hydrocarbons such as pentane, hexane, heptane or octane; alicyclic hydrocarbons such as cyclohexane or methylcyclohexane; aromatic hydrocarbons such as benzene, toluene or xylene; halogenated aliphatic hydrocarbons such as halogenated hydrocarbons (methylene chloride, chloroform or carbon tetrachloride; halogenated aromatic hydrocarbons such as chlorobenzene or dichlorobenzene), nitro compounds (nitromethane or nitgroethane), nitriles (acetonitrile or benzonitrile), ethers (chain-type ethers such as diethyl ether, diisopropyl ether or dimethoxyethane; cyclic ethers such as tetrahydrofuran or dioxane), esters (ethyl acetate or butyl acetate), carbonates (dimethyl carbonate, diethyl carbonate, ethylene carbonate or propylene carbonate), alcohols (methanol, ethanol, propanol, isopropyl alcohol or butanol), carboxylic acids (acetic acid), water, and mixed solvents containing these. Among these, as a precipitation or reprecipitation solvent, those containing at least an alcohol (methanol in particular) or water are preferred. In a solvent containing at least hydrocarbon, the ratio of an alcohol (methanol in particular) to other solvents (for example, an ester such as ethyl acetate or an ether such as tetrahydrofuran) is, for example, former/latter (in volume ratio at 25° C.)=10/90 to 99/1, preferably former/latter (in volume ratio at 25° C.)=30/70 to 98/2, and more preferably former/latter (in volume ratio at 25° C.)=50/50 to 97/3.

The use amount of the precipitation or reprecipitation solvent is appropriately chosen in consideration of efficiency, yield and other factors. Generally, to 100 parts by mass of a polymer solution, 100 to 10000 parts by mass, preferably 200 to 2000 parts by mass and more preferably 300 to 1000 parts by mass are used.

The nozzle diameter used for feeding a polymer solution into a precipitation or reprecipitation solvent (poor solvent) is preferably 4 mmφ or less (for example, 0.2 to 4 mmφ. The feeding velocity (dropping speed) of a polymer solution to a poor solvent is, for example, 0.1 to 10 m/sec and preferably roughly 0.3 to 5 m/sec in terms of linear velocity.

Precipitation or reprecipitation is preferably carried out under agitation. As the stirring wing used for such agitation, a disc turbine, a fan turbine (including a paddle), a curved blade turbine, an arrow-feather blade turbine, a Phaudler-type one, an angled blade fan turbine, a propeller, a multistage-type one, an anchor-type (or horseshoe type) one, a gate-type one, a double ribbon and a screw can be used. Agitation is preferably continued, even after the completion of polymer solution feeding, for 10 min or more, particularly for 20 min or more. In case where the agitation period is short, there occur some cases where the monomer content in polymer particles cannot be sufficiently reduced. In addition, a polymer solution can be mixed and agitated with a poor solvent by using a line mixer instead of a stirring wing.

The temperature for precipitation or reprecipitation is chosen appropriately in consideration of efficiency and operability, usually being around 0 to 50° C. and preferably around room temperature (for example, about 20 to 35° C.). Precipitation or reprecipitation operation can be conducted using a conventional mixing vessel such as a agitation tank by any of the well-known methods including a batch process or continuous process.

The particulate polymer obtained by precipitation or reprecipitation is usually subjected to a conventional solid-liquid separation operation such as filtration or centrifugal separation, and dried for practical use. Filtration uses a solvent-resistant filter material and is conducted under an ordinary or reduced pressure (preferably under a reduced pressure) at a temperature of around 30 to 100° C., preferably around 30 to 50° C.

Meanwhile, the resin, which has been once precipitated and separated, may thereafter be dissolved in a solvent again, and be brought into contact with a solvent in which the resin is sparingly soluble or insoluble.

Namely, one may employ the following processes: after the completion of the aforementioned radical polymerization reaction, the resin is deposited by bringing the reaction mixture into contact with a solvent in which the polymer is sparingly soluble or insoluble (process a), and is separated from the solution (process b), and then a resin solution A is newly prepared by dissolving the resin in a solvent (process c). Thereafter, the resin solid is deposited by bringing a solvent in which the resin is sparingly soluble or insoluble in a volume amount not exceeding 10 times (preferably 5 times) of that of the resin solution A into contact with the resin solution A (process d), and the deposited resin is separated (process e).

The used for the preparation of the resin solution A may be the one used for dissolving monomers in the polymerization reaction, or may be the same as or different from the solvent used in the polymerization reaction.

(D) Dissolution Inhibitive Compound Having Molecular Weight of 3,000 or Lower and Decomposing by Action of Acid to Show Enhanced Solubility in Alkaline Developing Solution (Hereinafter Referred to Also as "Dissolution Inhibitive Compound")

The positive resist composition of the invention may contain a dissolution inhibitive compound which has a molecular weight of 3,000 or lower and decomposes by the action of an acid to show enhanced solubility in an alkaline developing solution (hereinafter referred to also as "dissolution inhibitive compound").

The dissolution inhibitive compound preferably is an alicyclic or aliphatic compound having an acid-decomposable group, such as the cholic acid derivatives containing an acid-decomposable group which are described in *Proceeding of SPIE*, 2724, 355(1996), so as not to reduce transmission at wavelengths of 220 nm and shorter. Examples of the acid-decomposable group and alicyclic structure are the same as those described above with regard to the resin as component (A).

The dissolution inhibitive compound in the invention has a molecular weight of 3,000 or lower, preferably 300-3,000, more preferably 500-2,500.

The amount of the dissolution inhibitive compound to be added is preferably 1-30% by mass, more preferably 2-20% by mass, based on all solid components of the positive resist composition.

Examples of the dissolution inhibitive compound are shown below, but the compound should not be construed as being limited to the following examples.

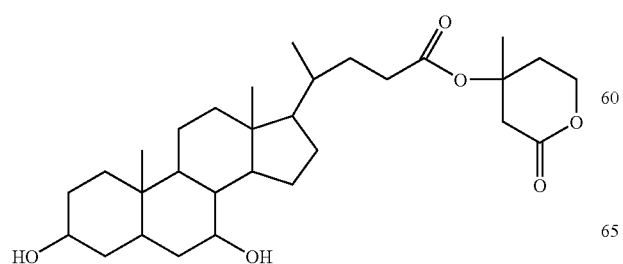

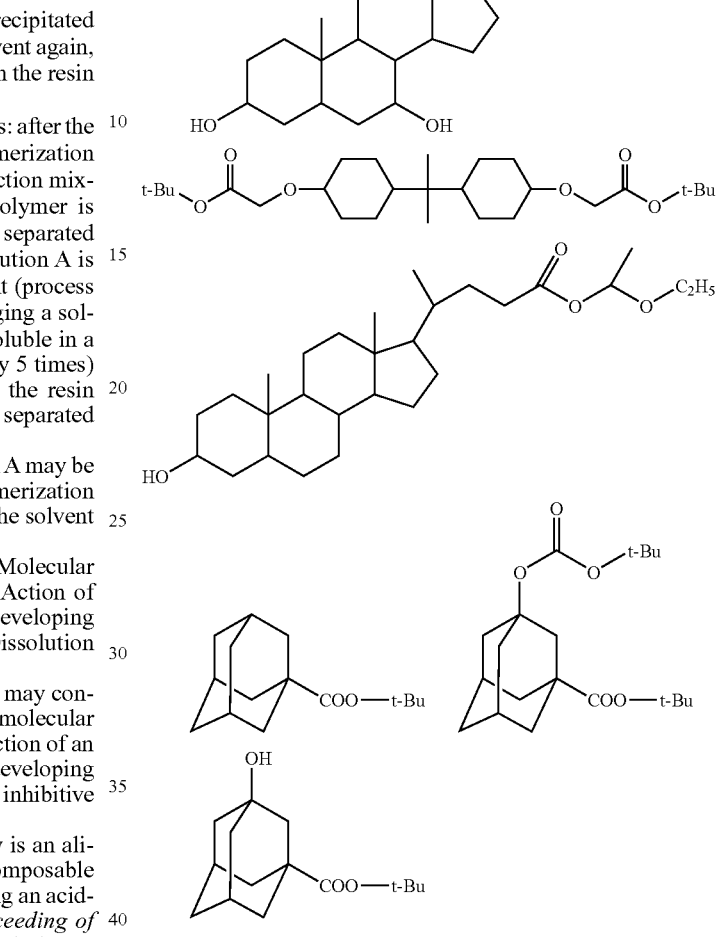

(E) Basic Compound

The positive resist composition of the invention preferably contains a basic compound (E) so as to be reduced in performance changes with the lapse of time from exposure to heating.

Preferred examples of the basic compound include compounds having structures represented by the following formulae (A) to (E).

(A)

(B)

(C)

(D)

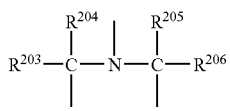
(E)

In general formulae (A) to (E), $R^{200}$, $R^{201}$, and $R^{202}$ may be the same or different and each represent a hydrogen atom, alkyl group having 1-20 carbon atoms, cycloalkyl group having 3-20 carbon atoms, or aryl group having 6-20 carbon atoms, provided that $R^{201}$ and $R^{202}$ may be bonded to each other to form a ring.

The alkyl group may be unsubstituted or may have one or more substituents. The alkyl group having one or more substituents preferably is an aminoalkyl group having 1-20 carbon atoms, hydroxyalkyl group having 1-20 carbon atoms, or cyanoalkyl group having 1-20 carbon atoms.

$R^{203}$, $R^{204}$, $R^{205}$, and $R^{206}$ may be the same or different and each represent an alkyl group having 1-20 carbon atoms.

The alkyl groups in general formulae (A) to (E) preferably are unsubstituted.

Examples of the basic compound include primary, secondary, or tertiary aliphatic amines, aromatic amines, heterocyclic amines, amide derivatives, imide derivatives, and nitrogen-containing compounds having a cyano group, these compounds being substituted or unsubstituted. Preferred of these are aliphatic amines, aromatic amines, and heterocyclic amines. Preferred examples of substituents which may be possessed are amino, alkyl, alkoxy, acyl, acyloxy, aryl, aryloxy, nitro, cyano, ester, and lactone groups.

Those basic compounds may be used alone or in combination of two or more thereof.

The amount of the basic compound to be used is generally 0.001-10% by mass, preferably 0.01-5% by mass, based on the solid components of the positive resist composition.

The proportion of the acid generator to the basic compound in the composition is preferably such that the acid generator/basic compound ratio (by mole) is from 2.5 to 300. Namely, that molar ratio is preferably 2.5 or higher from the standpoints of sensitivity and resolution and is preferably 300 or lower from the standpoint of inhibiting resolution from being reduced by the thickening of resist pattern lines with the lapse of time from exposure to heat treatment. The acid generator/basic compound ratio (by mole) is more preferably from 5.0 to 200, even more preferably from 7.0 to 150.

(E) Surfactant

The positive resist composition of the invention preferably further contains one or more surfactants (E). It is preferred that the composition should contain any one of or two or more of fluorochemical and/or silicone surfactants (fluorochemical surfactants, silicone surfactants, and surfactants containing both fluorine atoms and silicon atoms).

When the positive resist composition of the invention contains such a surfactant (E), it can show satisfactory sensitivity and resolution when irradiated with an exposure light having a wavelength of 250 nm or shorter, especially 220 nm or shorter, and give a resist pattern having satisfactory adhesion and reduced in development defects.

Examples of the fluorochemical and/or silicone surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and FE303 (manufactured by New Akita Chemical Company), Fluorad FC430, 431, and 4430 (manufactured by Sumitomo 3M Ltd.), Megafac F171, F173, F176, F189, F113, F110, F177, F120, and R08 (manufactured by Dainippon Ink & Chemicals, Inc.), Surflon S-382 and SC101, 102, 103, 104, 105, and 106 (manufactured by Asahi Glass Co., Ltd.), Troysol S-366 (manufactured by Troy Chemical Co., Ltd.), GF-300 and GF-150 (manufactured by Toagosei Co., Ltd.), Surflon S-393 (manufactured by Seimi Chemical Co., Ltd.), F-Top EF121, EF122A, EF122B, RF122C, EF125M, EF135M, EF351, 352, EF801, EF802, and EF601 (manufactured by JEMCO Inc.), PF636, PF656, PF6320, and PF6520 (manufactured by OMNOVA Inc.), and FTX-204D, 208G, 218G, 230G, 204D, 208D, 212D, 218, and 222D (manufactured by NEOS Co., Ltd.). Polysiloxane polymer KP-341 (manufactured by Shin-Etsu Chemical Co., Ltd.) can also be used as a silicone surfactant.

Also usable besides the known surfactants shown above is a surfactant comprising a polymer having a fluoroaliphatic group derived from a fluoroaliphatic compound and produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate) and a copolymer of an acrylate (or methacrylate) having a $C_3F_7$ group with poly(oxyethylene) acrylate (or methacrylate) and poly(oxypropylene) acrylate (or methacrylate).

Surfactants other than the fluorochemical and/or silicone surfactants may be used in the invention. Examples thereof include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan/fatty acid esters such as sorbitan monolaurate, sorbitan monopalmitate, sorbitan monostearate, sorbitan monooleate, sorbitan trioleate, and sorbitan tristearate, and polyoxyethylene-sorbitan/fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

Those surfactants may be used alone or in combination of two or more thereof.

The amount of the surfactant (E) to be used is preferably 0.01-10% by mass, more preferably 0.1-5% by mass, based on the total amount of the positive resist composition (excluding the solvent).

(F) Solvent

Examples of solvents usable in dissolving the components described above for preparing the positive resist composition include organic solvents such as alkylene glycol monoalkyl ether carboxylates, alkylene glycol monoalkyl ethers, alkyl lactates, alkyl alkoxypropionates, cyclic lactones having 4-10 carbon atoms, monoketone compounds having 4-10 carbon atoms and optionally having a ring, alkylene carbonates, alkoxyalkyl acetates, and alkyl pyruvates.

Preferred examples of the alkylene glycol monoalkyl ether carboxylates include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ethers include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the alkyl lactates include methyl lactate, ethyl lactate, propyl lactate, and butyl lactate.

Preferred examples of the alkyl alkoxypropionates include ethyl 3-ethoxypropionate, methyl 3-methoxypropionate, methyl 3-ethoxypropionate, and ethyl 3-methoxypropionate.

Preferred examples of the cyclic lactones having 4-10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanolactone, and α-hydroxy-γ-butyrolactone.

Preferred examples of the monoketone compounds having 4-10 carbon atoms and optionally having a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonates include propylene carbonate, vinylene carbonate, ethylene carbonate, and butylene carbonate.

Preferred examples of the alkoxyalkyl acetates include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvates include methyl pyruvate, ethyl pyruvate, and propyl pyruvate.

Preferred solvents include solvents having a boiling point of 130° C. or higher at ordinary temperature and ordinary pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the invention, those solvents may be used alone or in combination of two or more thereof.

In the invention, a mixed solvent prepared by mixing at least one solvent containing one or more hydroxyl groups in the structure with at least one solvent containing no hydroxyl group may be used as the organic solvent.

Examples of the solvent containing one or more hydroxyl groups include ethylene glycol, ethylene glycol monomethyl ether, ethylene glycol monoethyl ether, propylene glycol, propylene glycol monomethyl ether, propylene glycol monoethyl ether, and ethyl lactate. Preferred of these are propylene glycol monomethyl ether and ethyl lactate.

Examples of the solvent containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Especially preferred of these are propylene glycol monomethyl ether acetate, ethyl ethoxypropionate, 2-heptanone, γ-butyrolactone, cyclohexanone, and butyl acetate. Most preferred are propylene glycol monomethyl ether acetate, ethyl ethoxypropionate, and 2-heptanone.

The proportion (by mass) of the solvent containing one or more hydroxyl groups to the solvent containing no hydroxyl group may be from 1/99 to 99/1, and is preferably from 10/90 to 90/10, more preferably from 20/80 to 60/40. A mixed solvent in which the content of the solvent containing no hydroxyl group is 50% by weight or higher is especially preferred from the standpoint of evenness of application.

(G) Alkali-Soluble Resin

The positive resist composition of the invention can further contain a resin (G) which is insoluble in water and soluble in an alkaline developing solution and contains no acid-decomposable group. Incorporation of this resin improves sensitivity.

A novolak resin having a molecular weight of about 1,000-20,000 or a polyhydroxystyrene derivative having a molecular weight of about 3,000-50,000 can be used as the alkali-soluble resin in the invention. However, since these polymers considerably absorb light having a wavelength of 250 nm or shorter, it is preferred to use the polymers in a partly hydrogenated form or in an amount up to 30% by weight based on all resins.

A resin having carboxyl groups as alkali-soluble groups can also be used. The resin having carboxyl groups preferably has a mono- or polycyclic aliphatic hydrocarbon group so as to improve dry etching resistance. Examples thereof include copolymers of (meth)acrylic acid and a methacrylic ester having an alicyclic hydrocarbon structure which is not acid-decomposable and resins of a (meth)acrylic ester having an alicyclic hydrocarbon group having a carboxyl group at the end.

(H) Carboxylic Acid Onium Salt

The positive resist composition of the invention may contain a carboxylic acid onium salt (H). Examples of the carboxylic acid onium salt include carboxylic acid sulfonium salts, carboxylic acid iodonium salts, and carboxylic acid ammonium salts. Especially preferred carboxylic acid onium salts (H) of these are iodonium salts and sulfonium salts. The carboxylic acid onium salt (H) to be used in the invention preferably is one in which the carboxylate residue contains neither an aromatic group nor a carbon-carbon double bond. An especially preferred anion part is an alkanecarboxylic acid anion in which the alkyl group is a linear, branched, monocyclic, or polycyclic alkyl having 1-30 carbon atoms. More preferred is such carboxylic acid anion in which the alkyl group has been partly or wholly substituted by fluorine. The alkyl chain may contain an oxygen atom therein. Incorporation of the carboxylic acid onium salt not only improves sensitivity and resolution while securing transparency to light having a wavelength of 220 nm or shorter but also attains improvements in resolution independence from the degree of line density and in exposure margin.

Examples of the fluorine-substituted carboxylic acid anion include the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

Those carboxylic acid onium salts (H) can be synthesized by reacting a sulfonium hydroxide, iodonium hydroxide, or ammonium hydroxide with carboxylic acids in an appropriate solvent with the acid of silver oxide.

The content of the carboxylic acid onium salt (H) in the composition is desirably 0.1-20% by mass, preferably 0.5-10% by mass, more preferably 1-7% by mass, based on all solid components of the composition.

Other Additives

A dye, plasticizer, photosensitizer, light absorber, compound enhancing solubility in developing solutions (e.g., a phenolic compound having a molecular weight of 1,000 or lower or an alicyclic or aliphatic compound having one or more carboxyl groups), and other additives may be further incorporated according to need into the positive resist composition of the invention.

The phenolic compound having a molecular weight of 1,000 or lower can be easily synthesized by persons skilled in the art while referring to methods described in, e.g., JP-A-4-122938, JP-A-2-28531, U.S. Pat. No. 4,916,210, and European Patent 219,294.

Examples of the alicyclic or aliphatic compound having one or more carboxyl groups include carboxylic acid derivatives having a steroid structure, such as cholic acid, deoxycholic acid, and lithocholic acid, adamantanecarboxylic acid derivatives, adamantanedicarboxylic acid, cyclohexanecarboxylic acid, and cyclohexanedicarboxylic acid. However, the alicyclic or aliphatic compound should not be construed as being limited to these.

[Properties of Resist Composition]

It is preferred that the positive resist composition of the invention be used in a film thickness of 30-250 nm from the standpoint of improving resolution. More preferably, the composition is used in a film thickness of 30-200 nm. Such a film thickness can be attained by imparting an appropriate viscosity to the positive resist composition by regulating the solid concentration in the composition so as to be in an adequate range and by improving applicability and film-forming properties.

The total solid concentration in the positive resist composition is generally 1-10% by mass, preferably 1-8% by mass, more preferably 1.0-7.0% by mass.

[Method of Pattern Formation]

When the positive resist composition of the invention is used, the components described above are dissolved in a given organic solvent, preferably the mixed solvent, and the resultant solution is filtered and then applied to a given substrate in the following manner. The filter to be used for the filtration preferably is one which is made of polytetrafluoroethylene, polyethylene, or nylon and has a pore size of 0.1 μm or smaller, more preferably 0.05 μm or smaller, even more preferably 0.03 μm or smaller.

For example, the positive resist composition is applied to a base such as one for use in producing precision integrated-circuit elements (e.g., a silicon base coated with silicon dioxide) by an appropriate coating technique using a spinner, coater, or the like. The coating film is dried to form a photosensitive film.

This photosensitive film is irradiated with actinic rays or a radiation through a given mask and then preferably baked (heated). This film is developed and rinsed. Thus, a satisfactory pattern can be obtained.

Examples of the actinic rays or radiation include infrared, visible light, ultraviolet, far ultraviolet, X rays, and electron beams. Preferred are far ultraviolet rays having a wavelength of preferably 250 nm or shorter, more preferably 220 nm or shorter, such as, e.g., KrF excimer laser light (248 nm), ArF excimer laser light (193 nm), and $F_2$ excimer laser light (157 nm), X rays, electron beams, and the like. More preferred are lights having a wavelength of 1-200 nm. Especially preferred are ArF excimer laser light, $F_2$ excimer laser light, EUV (13 nm), and electron beams.

In a development step, an alkaline developing solution is used in the following manner. As an alkaline developing solution for the resist composition can be used an alkaline aqueous solution of, e.g., an inorganic alkali such as sodium hydroxide, potassium hydroxide, sodium carbonate, sodium silicate, sodium metasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, or a cyclic amine such as pyrrole or piperidine.

It is also possible to add an alcohol or a surfactant in an appropriate amount to the alkaline developing solution to be used.

The alkali concentration of the alkaline developing solution is generally 0.1-20% by mass.

The pH of the alkaline developing solution is generally 10.0-15.0.

Pure water is used as a rinse, optionally after an appropriate amount of a surfactant is added thereto.

After the development or rinsing, a treatment can be conducted in which the developing solution or rinse adherent to the pattern is removed with a supercritical fluid.

When the photosensitive resist film is irradiated with actinic rays or a radiation, this exposure may be conducted while filling the space between the resist film and a lens with a liquid (immersion medium) having a higher refractive index than air (immersion exposure). This exposure technique can heighten resolution. The immersion medium to be used can be any liquid having a higher refractive index than air. However, pure water is preferred. An overcoat layer may be further formed on the photosensitive film in order to prevent the photosensitive film from coming into direct contact with the immersion medium in immersion exposure. This overcoat layer inhibits composition extraction from the photosensitive film to the immersion medium to thereby diminish development defects.

The immersion liquid to be used in the immersion exposure will be explained below.

The immersion liquid preferably is a liquid which is transparent to the exposure light to be used and in which the temperature coefficient of refractive index is as small as possible so as to minimize the deformation of an optical image to be projected on the resist. However, especially when the exposure light source is an ArF excimer laser (wavelength: 193 nm), it is preferred to use water from the standpoints of availability and handleability besides the standpoints shown above.

Furthermore, a medium having a refractive index of 1.5 or higher can be used from the standpoint of being capable of further improving refractive index. This medium may be an aqueous solution or an organic solvent.

In the case where water is used as the immersion liquid, an additive (liquid) in which the resist layer on the wafer does not dissolve and the influence of which on the optical coat on the lower side of the lens element is negligible may be added in a slight proportion in order to reduce the surface tension of the water and enhance surface activity. This additive preferably is an aliphatic alcohol almost equal to water in refractive index. Examples thereof include methyl alcohol, ethyl alcohol, and isopropyl alcohol. The addition of an alcohol almost equal to water in refractive index brings about an advantage that even when the alcohol component contained in the water vaporizes to cause a change in alcohol concentration, the change in refractive index of the liquid as a whole can be kept exceedingly slight. On the other hand, in case where a substance which is not transparent to 193-nm light or an impurity considerably differing from water in refractive index has come into the water, this leads to the deformation of an optical image to be projected on the resist. It is therefore preferred that the water to be used should be distilled water. Pure water which has undergone filtration through an ion-exchange filter or the like may be used.

The electrical resistance of the water desirably is 18.3 MΩ·cm or higher, and the TOC (organic concentration) therein is desirably 20 ppb or lower. Furthermore, it is desirable that the water should have been degassed.

By heightening the refractive index of the immersion liquid, lithographic performance can be enhanced. From this standpoint, an additive serving to heighten the refractive index may be added to the water, or heavy water ($D_2O$) may be used in place of the water.

A film sparingly soluble in the immersion liquid (hereinafter the film is referred to also as "top coat") may be formed between the immersion liquid and the resist film formed from the positive resist composition of the invention in order to prevent the resist film from coming into direct contact with the immersion liquid. The functions required of the top coat include applicability to the resist surface, transparency to radiations, in particular, one having a wavelength of 193 nm, and poor solubility in the immersion liquid. The top coat preferably is one which does not intermix with the resist and is evenly applicable to the resist surface.

From the standpoint of transparency at 193 nm, the top coat preferably is a polymer containing no aromatic. Examples thereof include hydrocarbon polymers, acrylic ester polymers, poly(methacrylic acid), poly(acrylic acid), poly(vinyl ether)s, silicon-containing polymers, and fluorine-containing polymers. Because extraction of impurities from the top coat into the immersion liquid results in the fouling of the optical lens, the top coat preferably is one in which the amount of residual monomer components contained in the polymer constituting the top coat is smaller.

For removing the top coat, a developing solution may be used. Alternatively, the top coat may be removed by separately using a remover. The remover preferably is a solvent which is less apt to infiltrate into the resist. It is preferred that the top coat be removed with an alkaline developing solution because a removal step can be conducted simultaneously with a development step. The top coat preferably is acidic from the standpoint of removal with an alkaline developing solution. However, the top coat may be either neutral or alkaline from the standpoint of the property of not intermixing with the resist.

The smaller the difference in refractive index between the top coat and the immersion liquid, the more the resolution improves. In the case where an ArF excimer laser (wavelength: 193 nm) is used in combination with water as an immersion liquid, the top coat for ArF immersion exposure preferably has a refractive index close to that of the immersion liquid. From the standpoint of attaining a refractive index closer to that of the immersion liquid, the top coat preferably contains fluorine atoms therein. From the standpoints of transparency and refractive index, the top coat preferably is thin.

It is preferred that the top coat intermixes with neither the resist nor the immersion liquid. From this standpoint, when the immersion liquid is water, the solvent for the top coat preferably is a medium which is poorly soluble in the resist solvent and is water-insoluble. In the case where the immersion liquid is an organic solvent, the top coat may be either water-soluble or water-insoluble.

The resist composition of the invention preferably gives a resist film with which water has a receding contact angle of 65° or larger. The value of receding contact angle is one measured at ordinary temperature and ordinary pressure at the time when the droplet begins to fall as a result of resist film inclination. In general, receding contact angle nearly correlates with sliding angle. Namely, the larger the receding contact angle and the smaller the sliding angle, the better the water repellency.

EXAMPLES

The invention will be explained below in more detail by reference to Examples, but the contents of the invention should not be construed as being limited by the following Examples.

Examples 1 to 44 and Comparative Examples 1 and 2

Synthesis Example (Synthesis of Resin (1))

Under nitrogen gas feeding, 8.6 g of cyclohexanone was charged in a three-necked flask, which was heated to 80° C. Into the flask, 9.8 g of 2-adamantylisopropyl methacrylate, 4.4 g of dihydroxyadamantyl methacrylate, 8.9 g of norbornanelactone methacrylate, and a solution obtained by dissolving a polymerization initiator V601 (manufactured by Wako Pure Chemical Industries, Ltd.) in 79 g of cyclohexanone in an amount of 8% by mole relative to the moles of the monomers were added dropwise over a period of 6 hr. After the completion of dropwise addition, the reaction was continued for 2 hr at 80° C. After cooling, the reaction solution was introduced in a mixture of 800 ml hexane and 200 ml ethyl acetate in 20 min. The deposited powder was filtered and dried to give Resin (1) in 19 g. The weight average molecular weight of the resin thus obtained was 9800 as determined through calculation for standard polystyrene, and the degree of dispersion (Mw/Mn) thereof was 1.9.

Resins (2) to (30) were synthesized in similar manners to that for Resin (1).

Resin (31) was synthesized in the same manner as in Example 1 of Japanese Patent Laid-open No. 2005-156726.

The structures, compositions, molecular weights, etc. of the acid-decomposable resins (A) used in the Examples are shown below. With respect to each composition, the resin structural formula No. and the proportions (proportions of the units, in the left-to-right order, in the structural formula) are shown.

TABLE 1

(1)
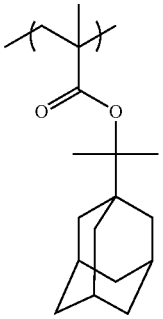

(2)
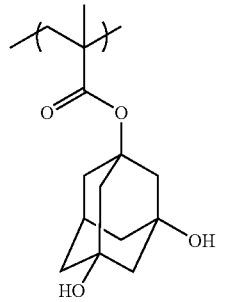

TABLE 1-continued (3)
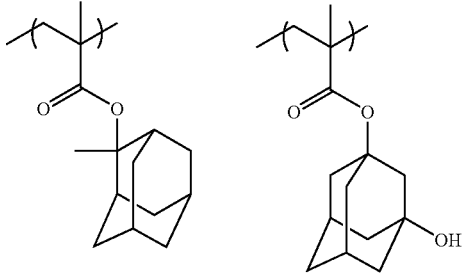

(4)
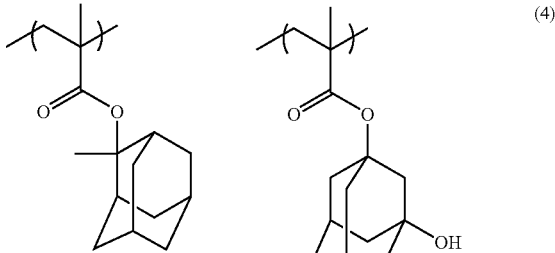

(5)
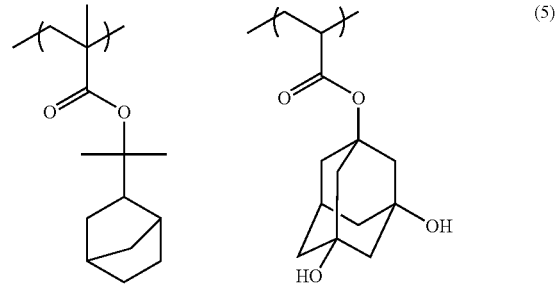

TABLE 1-continued
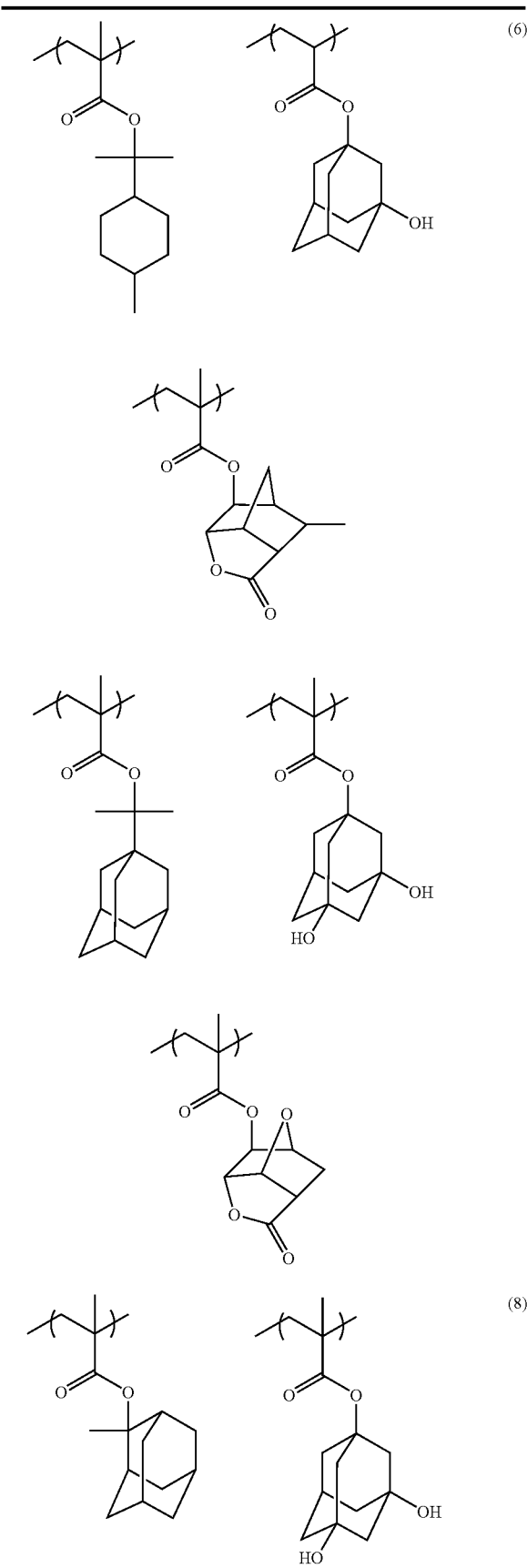
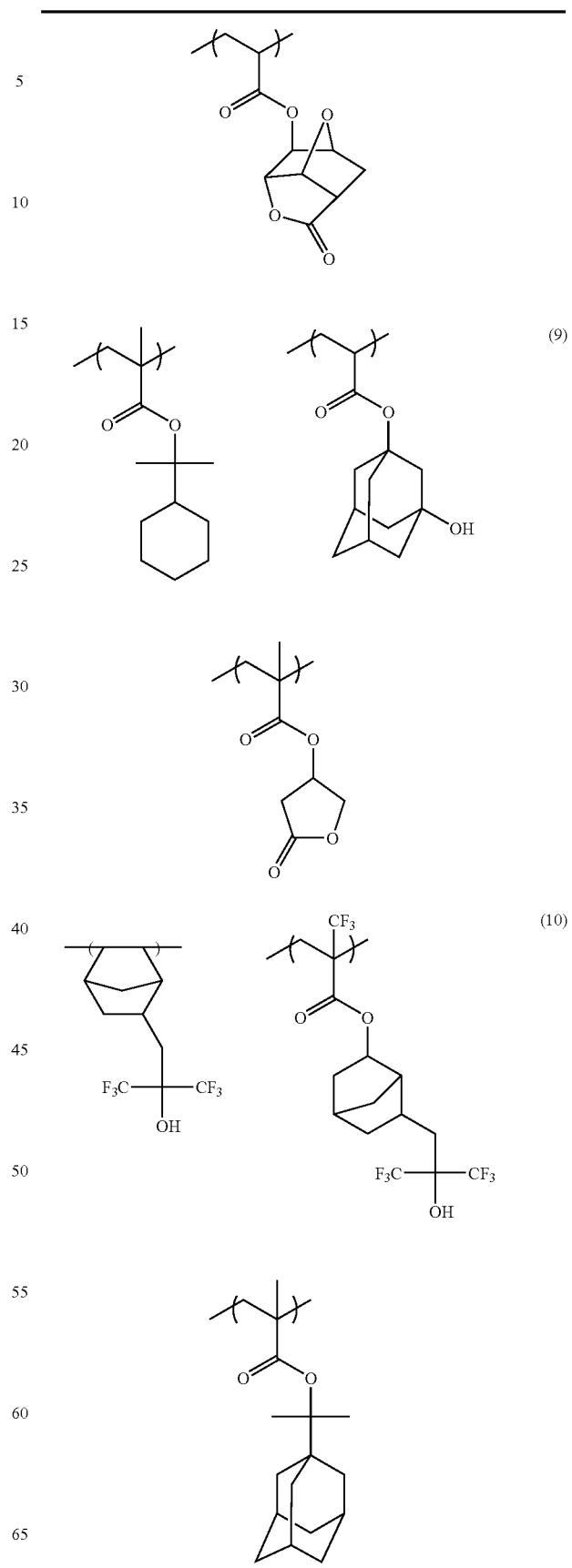

TABLE 1-continued
(11)
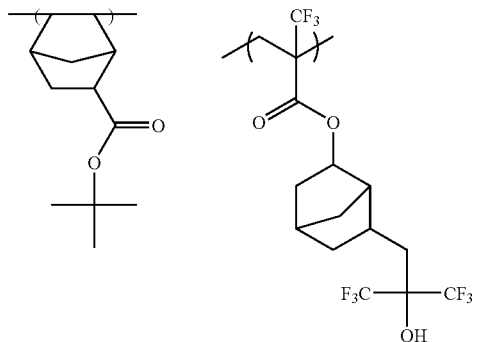
(12)
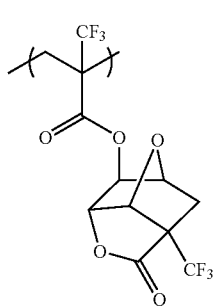
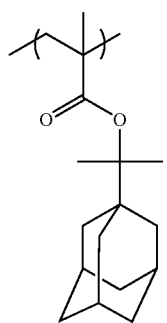 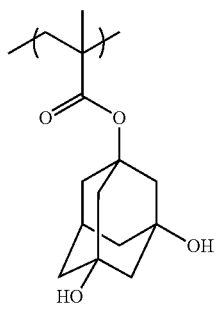
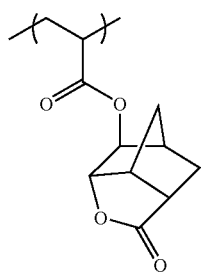 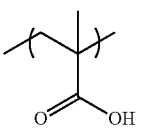
(13)
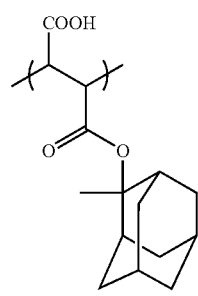 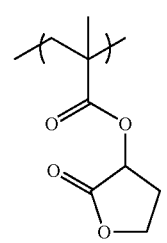
TABLE 1-continued
(14)
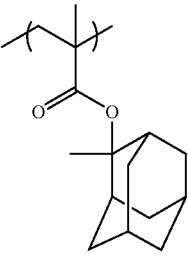 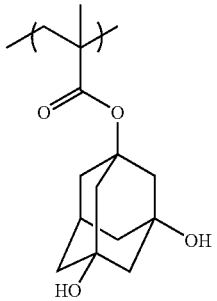
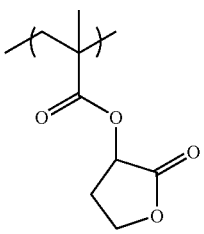 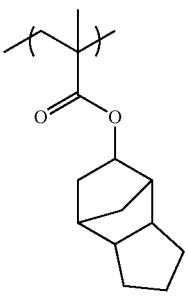
(15)
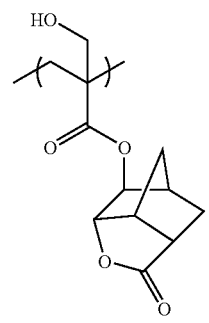 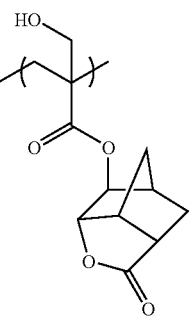
(16)
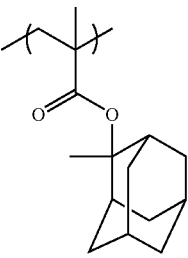 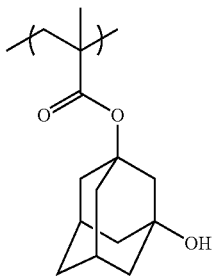
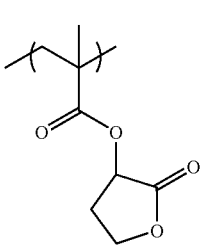 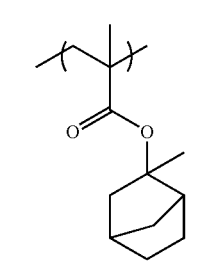

TABLE 1-continued
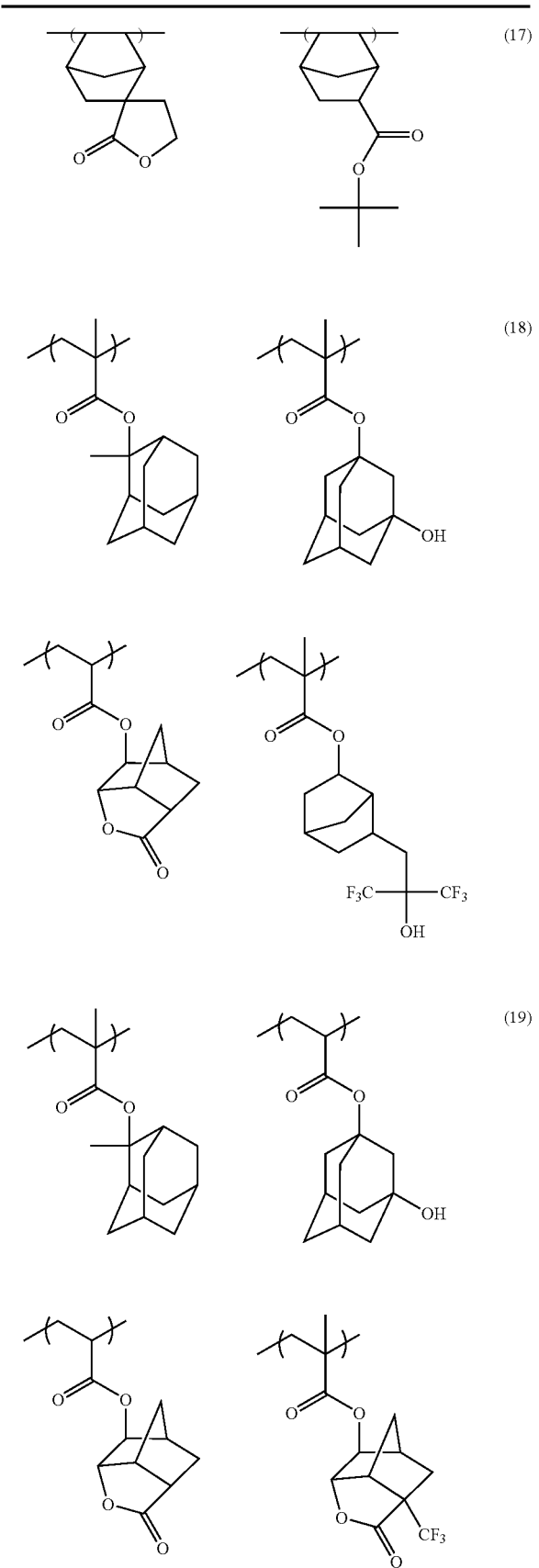
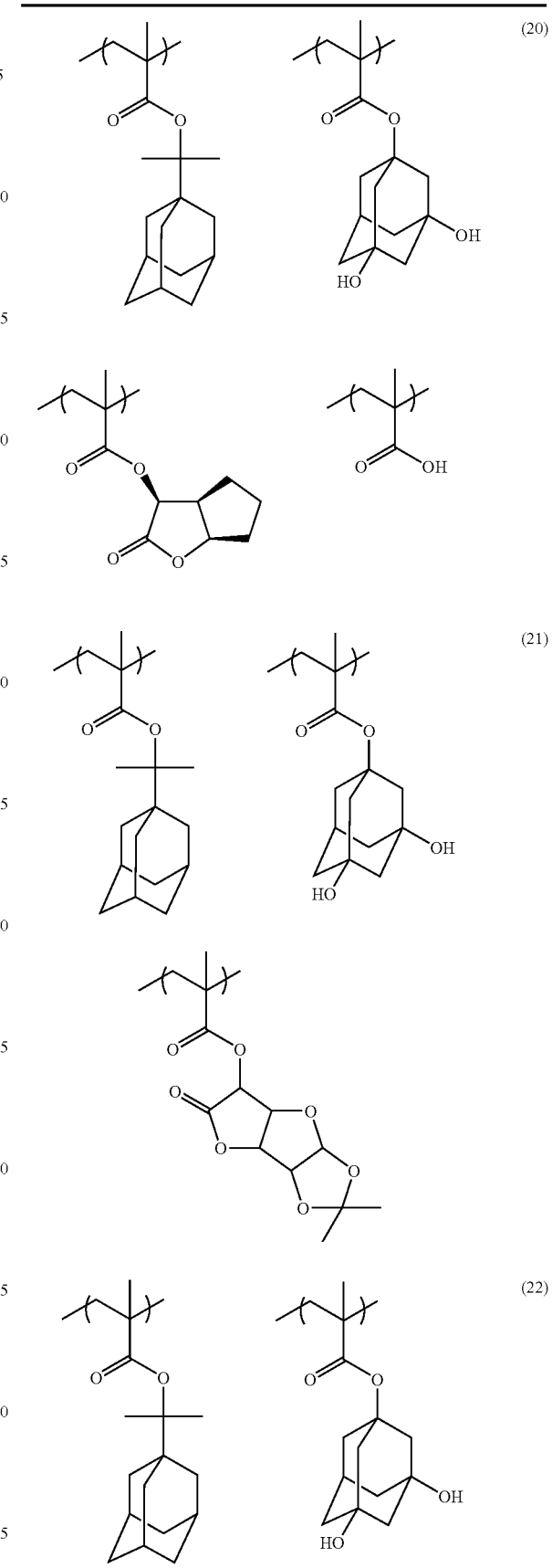

TABLE 1-continued
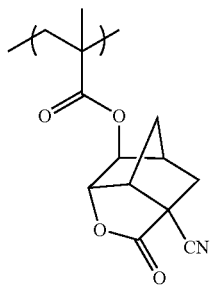 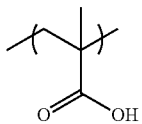
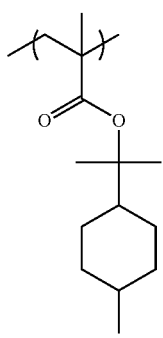 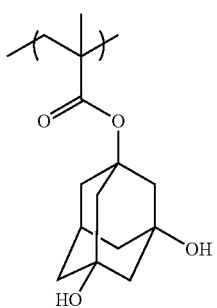
(23)
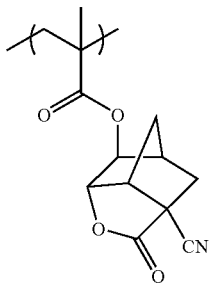
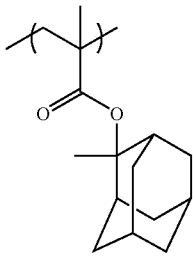 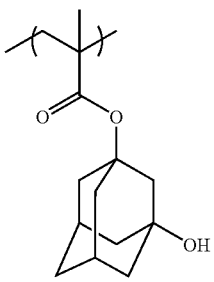
(24)
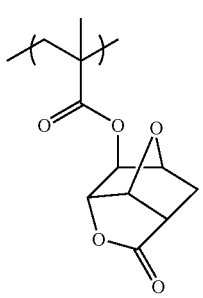 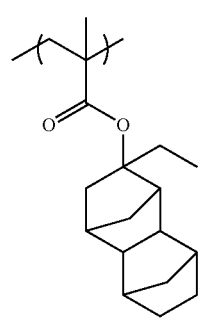
TABLE 1-continued
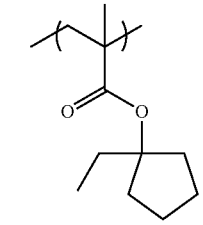 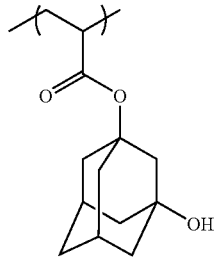
(25)
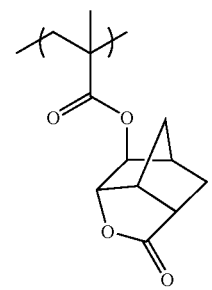
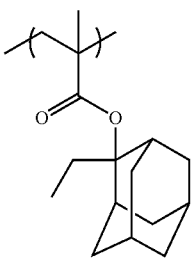 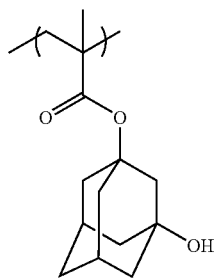
(26)
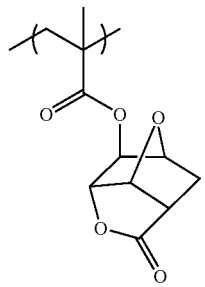
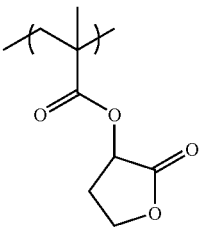 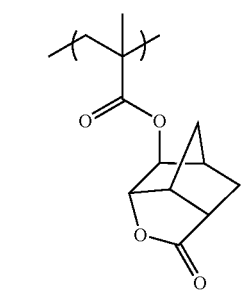
(27)

TABLE 1-continued
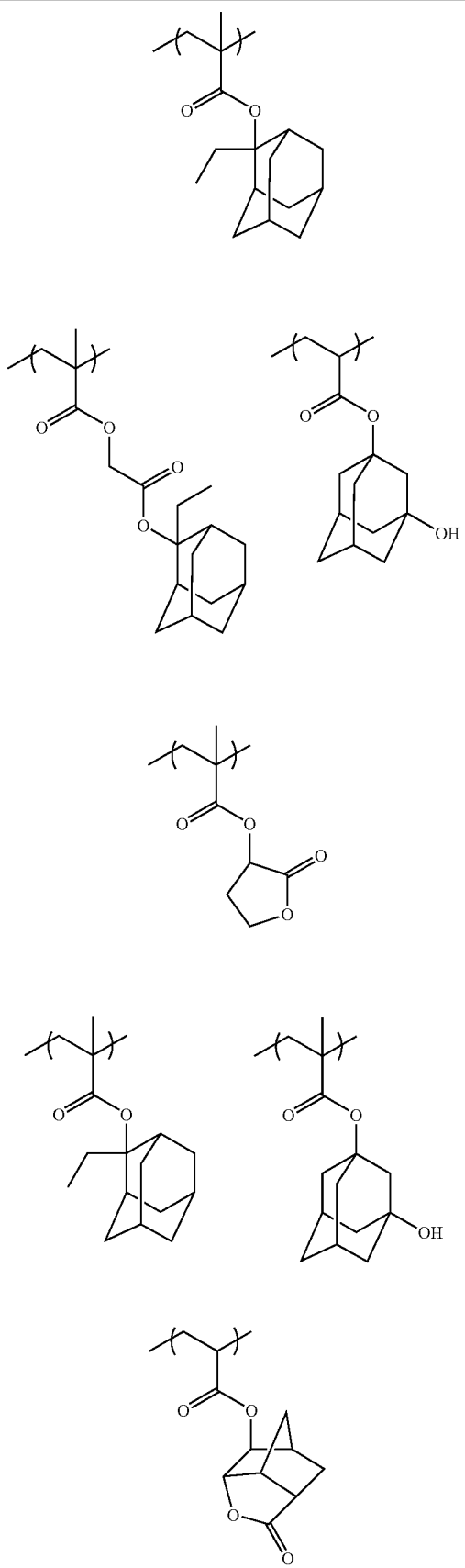
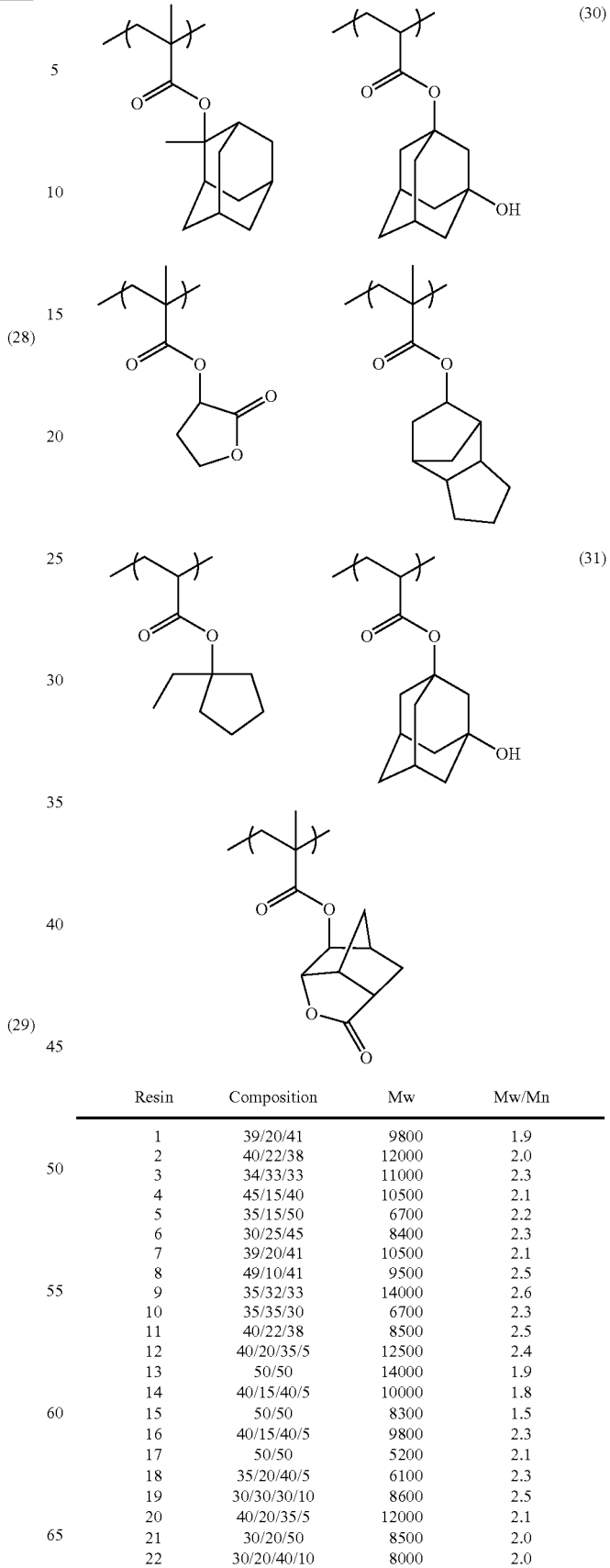
| Resin | Composition | Mw | Mw/Mn |
|---|---|---|---|
| 1 | 39/20/41 | 9800 | 1.9 |
| 2 | 40/22/38 | 12000 | 2.0 |
| 3 | 34/33/33 | 11000 | 2.3 |
| 4 | 45/15/40 | 10500 | 2.1 |
| 5 | 35/15/50 | 6700 | 2.2 |
| 6 | 30/25/45 | 8400 | 2.3 |
| 7 | 39/20/41 | 10500 | 2.1 |
| 8 | 49/10/41 | 9500 | 2.5 |
| 9 | 35/32/33 | 14000 | 2.6 |
| 10 | 35/35/30 | 6700 | 2.3 |
| 11 | 40/22/38 | 8500 | 2.5 |
| 12 | 40/20/35/5 | 12500 | 2.4 |
| 13 | 50/50 | 14000 | 1.9 |
| 14 | 40/15/40/5 | 10000 | 1.8 |
| 15 | 50/50 | 8300 | 1.5 |
| 16 | 40/15/40/5 | 9800 | 2.3 |
| 17 | 50/50 | 5200 | 2.1 |
| 18 | 35/20/40/5 | 6100 | 2.3 |
| 19 | 30/30/30/10 | 8600 | 2.5 |
| 20 | 40/20/35/5 | 12000 | 2.1 |
| 21 | 30/20/50 | 8500 | 2.0 |
| 22 | 30/20/40/10 | 8000 | 2.0 |

TABLE 1-continued

| | | | |
|---|---|---|---|
| 23 | 40/10/50 | 6000 | 1.8 |
| 24 | 30/20/40/10 | 7000 | 2.1 |
| 25 | 50/20/30 | 6000 | 1.8 |
| 26 | 35/30/35 | 9800 | 1.8 |
| 27 | 25/25/50 | 6700 | 2.0 |
| 28 | 50/25/25 | 12000 | 2.0 |
| 29 | 50/30/20 | 10000 | 2.0 |
| 30 | 40/20/20/10 | 6400 | 2.1 |
| 31 | 40/10/50 | 7700 | 2.0 |

Synthesis Example (1)

Synthesis of Resins (C-1) and (C-2)

A mixture of 0.06 mol of 3,5-bis(1,1,1,3,3-hexafluoro-2-hydroxypropan-2-yl)cyclohexyl 2-trifluoromethylmethacrylate and 0.04 mol of (5-norbornene-2-methyl)-1,1,1,3,3,3-hexafluoropropan-2-ol was prepared. While this mixture was being stirred at 80° C. in a nitrogen atmosphere, 1.5 mmol % polymerization initiator V-59, manufactured by Wako Pure Chemical Industries, Ltd., was added thereto. This mixture was stirred under those conditions for 3 hours. Thereafter, the mixture was further stirred for 12 hours while adding 1.5 mol % polymerization initiator V-59 at an interval of 3 hours. After completion of the reaction, this liquid reaction mixture (C-1) was dissolved in 20 mL of THF and the resultant solution was cooled to room temperature. This solution was poured into 800 mL of hexane to cause crystallization. The white powder precipitated was taken out by filtration. Thus, the target resin (C-1) was recovered.

The composition of the polymer was determined by $^1$H NMR and was found to be 60/40 (proportions of the units, in the left-to-right order, in the structural formula). The weight-average molecular weight and dispersity ratio thereof, as determined through measurement by GPC and calculation for standard polystyrene, were 8,800 and 1.5, respectively.

Resin (C-2) was synthesized in the same manner as described above, except that the monomers were changed and the feed proportions were changed to 70/30 (proportions for the units, in the left-to-right order, in the structural formula). The polymer composition of resin (C-2) was determined by $^1$H NMR and was found to be 68/32. The weight-average molecular weight and dispersity ratio thereof, as determined through measurement by GPC and calculation for standard polystyrene, were 11,000 and 1.7, respectively.

Synthesis Example (2)

Synthesis of Resin (C-3)

In 44 mL of chlorobenzene were dissolved 0.262 g of di-μ-chlorobis[(η-allyl)palladium(II)] and 0.488 g of silver hexatluoroantimonate. This solution was stirred at room temperature. After 20 minutes, the reaction mixture was filtered. The filtrate was added to a liquid mixture composed of 20 g of 5-norbornene-1,1,1,3,3,3-hexafluoropropan-2-ol, 0.2 mL of water, and 170 mL of chlorobenzene. The resultant mixture was stirred at room temperature for 20 hours and then added to 1,200 mL of methanol. The resin precipitated was taken out by filtration. Subsequently, the resin was dissolved in 150 mL of chlorobenzene. Thereto were added 30 mL of methanol and 3.2 g of sodium borohydride. This mixture was stirred at room temperature for 3 hours and then allowed to stand at room temperature for 24 hours. The particles of Pd(0) precipitated were removed by filtration, and the filtrate was poured into 800 mL of methanol. The resin precipitated was taken out by filtration to obtain the target resin (C-3).

The weight-average molecular weight and dispersity ratio of the resin, as determined through measurement by GPC and calculation for standard polystyrene, were 8,000 and 1.4, respectively.

Synthesis Example (3)

Synthesis of Resins (C-4) to (C-6)

In 70 mL of propylene glycol monomethyl ether acetate was dissolved 20 g of 1,1,1,3,3,3-hexafluoro-2-(4-(1,1,1,3,3,3-hexafluoro-2-hydroxypropan-2-yl)cyclohexyl)propan-2-yl methacrylate. To this solution was added 3 mol % polymerization initiator V-601, manufactured by Wako Pure Chemical Industries, Ltd. In a nitrogen atmosphere, the resultant mixture was added dropwise over 6 hours to 10 mL of a propylene glycol monomethyl ether acetate solution heated at 80° C. After completion of the dropwise addition, the reaction mixture was stirred for 2 hours to obtain a liquid reaction mixture (C-4). After completion of the reaction, the liquid reaction mixture (C-4) was cooled to room temperature and poured into a 4.5-fold amount of hexane to cause crystallization. The white powder precipitated was taken out by filtration. Thus, the target resin (C-4) was recovered.

The weight-average molecular weight and dispersity ratio thereof, as determined through measurement by GPC and calculation for standard polystyrene, were 8,500 and 1.4, respectively.

Resin (C-5) was synthesized in the same manner as in Synthesis Example (3) in which the monomers were fed in proportions of 80/20 (proportions for the units, in the left-to-right order, in the structural formula). For the crystallization, methanol was used as a solvent. The composition of the polymer was determined by $^1$H NMR and was found to be 80/20. The weight-average molecular weight and dispersity ratio thereof, as determined through measurement by GPC and calculation for standard polystyrene, were 13,000 and 2.1, respectively.

Resin (C-6) was synthesized in the same manner as in Synthesis Example (3) in which the monomers were fed in proportions of 70/30 (proportions for the units, in the left-to-right order, in the structural formula). For the crystallization, methanol was used as a solvent. The composition of the polymer was determined by $^1$H NMR and was found to be 70/30. The weight-average molecular weight and dispersity ratio thereof, as determined through measurement by GPC and calculation for standard polystyrene, were 18,000 and 2.3, respectively.

Resin (C-7) was synthesized in the same manner as in Synthesis Example (1) in which the monomers were fed in proportions of 50/50 (proportions for the units, in the left-to-right order, in the structural formula). For the crystallization, methanol was used as a solvent. The composition of the polymer was determined by $^1$H NMR and was found to be 50/50. The weight-average molecular weight and dispersity ratio thereof, as determined through measurement by GPC and calculation for standard polystyrene, were 5,200 and 1.9, respectively.

Resin (C-8) was synthesized in the same manner as in Synthesis Example (3) in which the monomers were fed in proportions of 50/50 (proportions for the units, in the left-to-right order, in the structural formula). For the crystallization, methanol was used as a solvent. The composition of the polymer was determined by $^1$H NMR and was found to be 50/50. The weight-average molecular weight and dispersity ratio thereof, as determined through measurement by GPC and calculation for standard polystyrene, were 10,200 and 2.2, respectively.

Resin (C-9) was synthesized in the same manner as in Synthesis Example (3) in which the monomers were fed in proportions of 60/40 (proportions for the units, in the left-to-right order, in the structural formula). For the crystallization, hexane was used as a solvent. The composition of the polymer was determined by $^1$H NMR and was found to be 60/40. The weight-average molecular weight and dispersity ratio thereof, as determined through measurement by GPC and calculation for standard polystyrene, were 7,200 and 2.2, respectively.

Resin (C-10) was synthesized in the same manner as in Synthesis Example (1) in which the monomers were fed in proportions of 30/30/40 (proportions for the units, in the left-to-right order, in the structural formula). For the crystallization, methanol was used as a solvent. The composition of the polymer was determined by $^1$H NMR and was found to be 32/32/36. The weight-average molecular weight and dispersity ratio thereof, as determined through measurement by GPC and calculation for standard polystyrene, were 5,600 and 2.0, respectively.

Synthesis Example (4)

Synthesis of Resin (C-11)

In propyleneglycol monomethyl ether acetate, 50 g of (3,5-bis(1,1,1,3,3,3-hexafluoro-2-hydroxypropan-2-yl)cyclohexyl) methacrylate was dissolved to give a 200 mL solution. This mixture was subjected to agitation at 80° C. under nitrogen atmosphere. To this mixture under this condition was added 5 molar % of V-601, a polymerization initiator manufactured by Wako Pure Chemical Industries, Ltd. And the resulting mixture was agitated for 5 hr as it was. After completion of the reaction, the mixture was cooled to room temperature, subjected to precipitation into 5 times volume hexane. The separated white powder was collected by filtration to obtain the target resin (C-11).

The weight-average molecular weight and dispersity ratio thereof, as determined through measurement by GPC and calculation for standard polystyrene, were 9300 and 1.4, respectively.

Resin (C-12) was synthesized in the same manner as in Synthesis Example (3) except that the charging compositional ratio was set at 50/50 and that the amount of the polymerization initiator was changed to 5 molar %. The polymer compositional ratio determined by $^1$H NMR was found to be 50/50. The weight-average molecular weight and dispersity ratio thereof, as determined through measurement by GPC and calculation for standard polystyrene, were 8800 and 1.8, respectively.

Resin (C-13) was synthesized in the same manner as the synthetic method for Resin (C-12) except that the charging compositional ratios were set at 40/30/30. The polymer compositional ratios determined by $^1$H NMR were found to be 39/30/31. The weight-average molecular weight and dispersity ratio thereof, as determined through measurement by GPC and calculation for standard polystyrene, were 6500 and 1.8, respectively.

Resin (C-14) was synthesized in the same manner as the synthetic method for Resin (C-12) except that the charging compositional ratio was set at 80/20. The polymer compositional ratio determined by $^1$H NMR was found to be 78/22. The weight-average molecular weight and dispersity ratio thereof, as determined through measurement by GPC and calculation for standard polystyrene, were 8700 and 1.8, respectively.

Resin (C-15) was synthesized in the same manner as the synthetic method for Resin (C-12) except that the charging compositional ratio was set at 80/20. The polymer compositional ratio determined by $^1$H NMR was found to be 80/20. The weight-average molecular weight and dispersity ratio thereof, as determined through measurement by GPC and calculation for standard polystyrene, were 8800 and 1.8, respectively.

Resin (C-16) was synthesized in the same manner as the synthetic method for Resin (C-12) except that the charging compositional ratio was set at 40/60. For precipitation, methanol was used as the solvent. The polymer compositional ratio determined by $^1$H NMR was found to be 40/60. The weight-average molecular weight and dispersity ratio thereof, as determined through measurement by GPC and calculation for standard polystyrene, were 11000 and 1.9, respectively.

Resin (C-17) was synthesized in the same manner as the synthetic method for Resin (C-16) except that the charging compositional ratio was set at 30/70. The polymer compositional ratio determined by $^1$H NMR was found to be 28/72. The weight-average molecular weight and dispersity ratio thereof, as determined through measurement by GPC and calculation for standard polystyrene, were 10500 and 1.9, respectively.

Resin (C-18) was synthesized in the same manner as the synthetic method for Resin (C-13). The polymer compositional ratio determined by $^1$H NMR was found to be 42/20/38. The weight-average molecular weight and dispersity ratio thereof, as determined through measurement by GPC and calculation for standard polystyrene, were 7500 and 2.2, respectively.

Resin (C-19) was synthesized in the same manner as the synthetic method for Resin (C-16) except that the charging compositional ratios were set at 40/30/30. The polymer compositional ratios determined by $^1$H NMR were found to be 40/33/27. The weight-average molecular weight and dispersity ratio thereof, as determined through measurement by GPC and calculation for standard polystyrene, were 7500 and 2.2, respectively.

Resin (C-20) was synthesized in the same manner as the synthetic method for Resin (C-19). The polymer compositional ratio determined by $^1$H NMR was found to be 40/30/30. The weight-average molecular weight and dispersity ratio thereof, as determined through measurement by GPC and calculation for standard polystyrene, were 8200 and 2.2, respectively.

Resin (C-21) was synthesized in the same manner as the synthetic method for Resin (C-12) except that the charging compositional ratio was set at 70/30. The polymer compositional ratio determined by $^1$H NMR was found to be 65/35. The weight-average molecular weight and dispersity ratio thereof, as determined through measurement by GPC and calculation for standard polystyrene, were 5600 and 2.0, respectively.

Resin (C-22) was synthesized in the same manner as in Synthesis Example (3) except that the charging compositional ratio was set at 50/50. The polymer compositional ratio determined by $^1$H NMR was found to be 50/50. The weight-average molecular weight and dispersity ratio thereof, as determined through measurement by GPC and calculation for standard polystyrene, were 6200 and 2.0, respectively.

Resin (C-23) was synthesized in the same manner as the synthetic method for Resin (C-12) except that the charging compositional ratios were set at 30/50/20. The polymer compositional ratio determined by $^1$H NMR was found to be 29/50/21. The weight-average molecular weight and dispersity ratio thereof, as determined through measurement by GPC and calculation for standard polystyrene, were 8800 and 2.0, respectively.

Resin (C-24) was synthesized in the same manner as in Synthesis Example (3) except that the charging compositional ratios were set at 20/40/20/20. The polymer compositional ratios determined by $^1$H NMR were found to be 19/42/20/19. The weight-average molecular weight and dispersity ratio thereof, as determined through measurement by GPC and calculation for standard polystyrene, were 12000 and 2.2, respectively.

The structures of resins (C-1) to (C-24) are shown below.

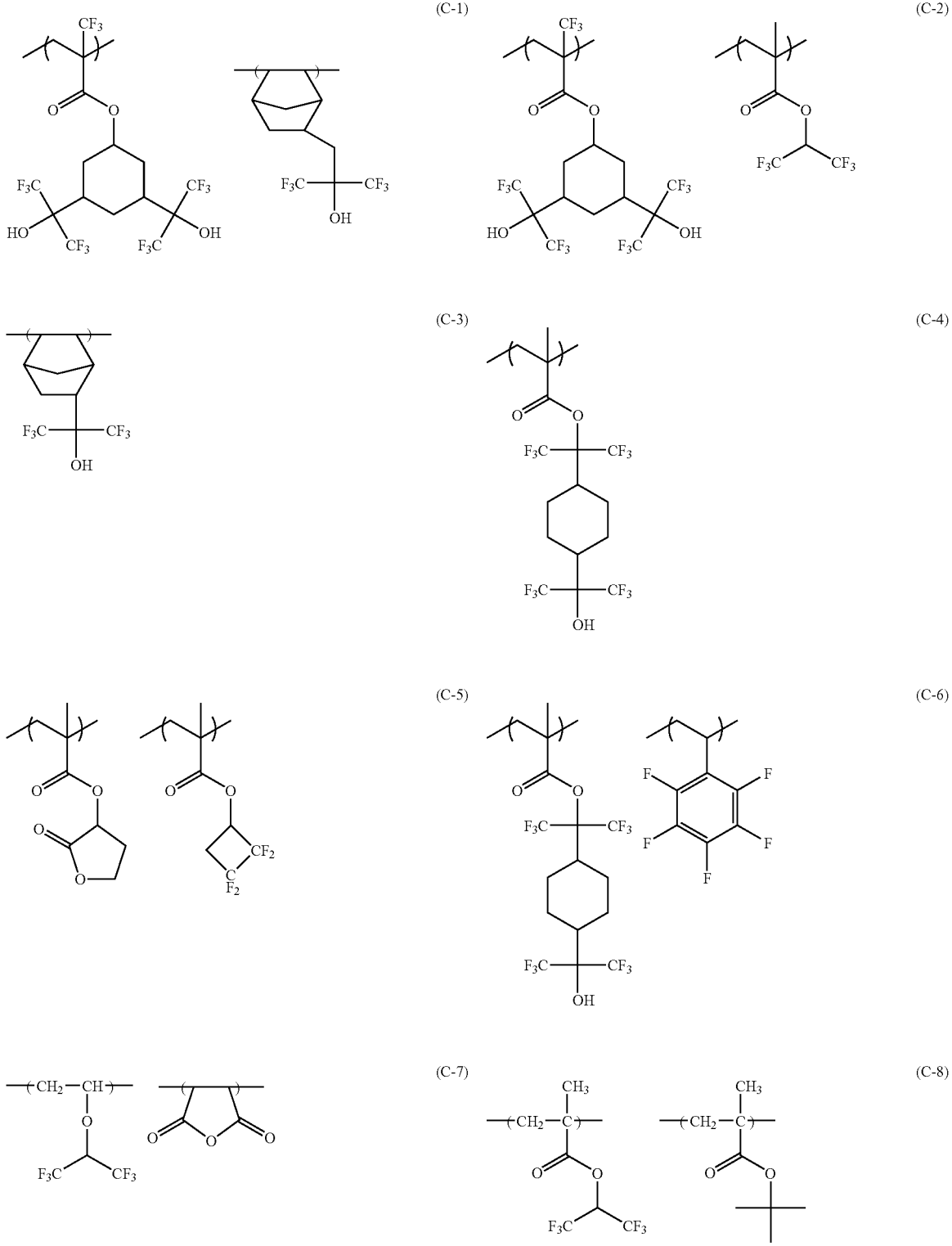

-continued
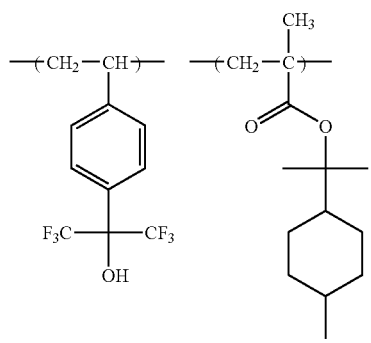 (C-9)
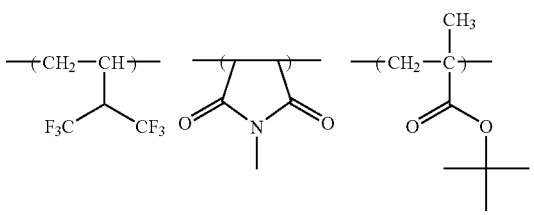 (C-10)
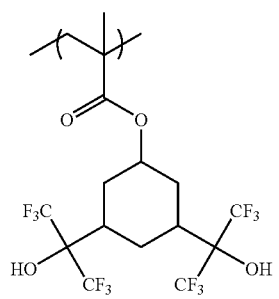 (C-11)
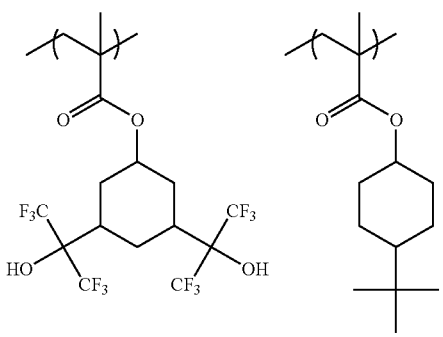 (C-12)
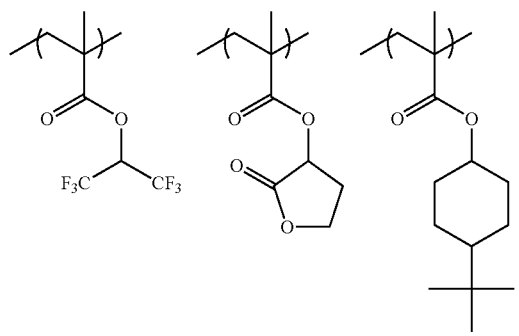 (C-13)
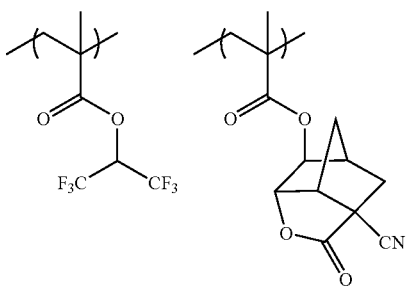 (C-14)
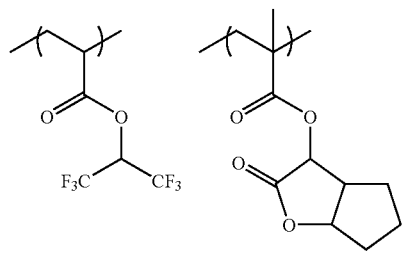 (C-15)
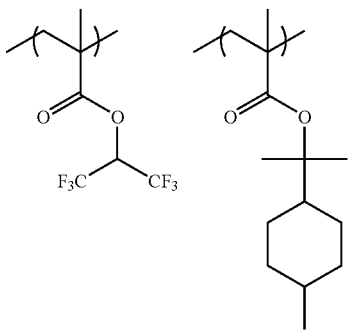 (C-16)

-continued

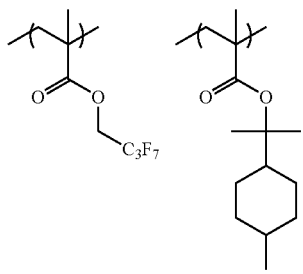
(C-17)

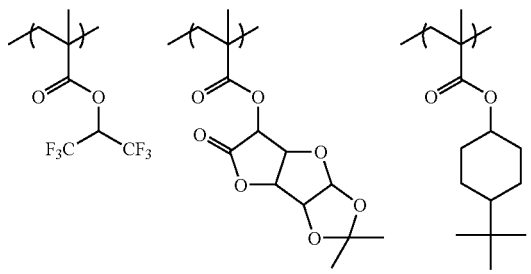
(C-18)

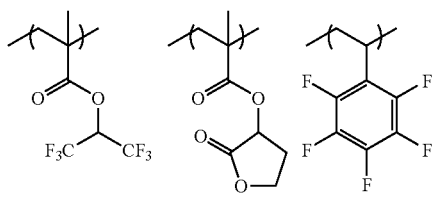
(C-19)

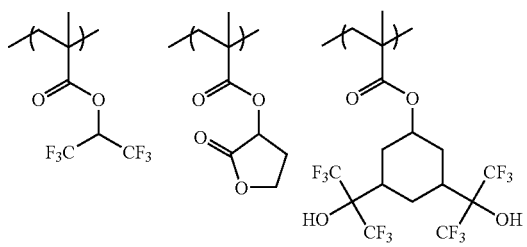
(C-20)

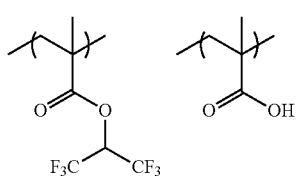
(C-21)

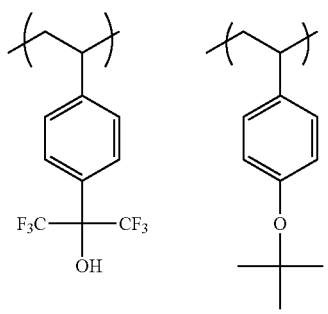
(C-22)

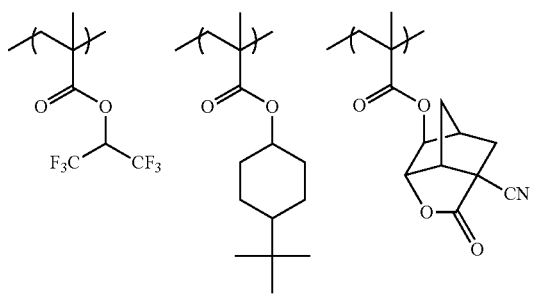
(C-23)

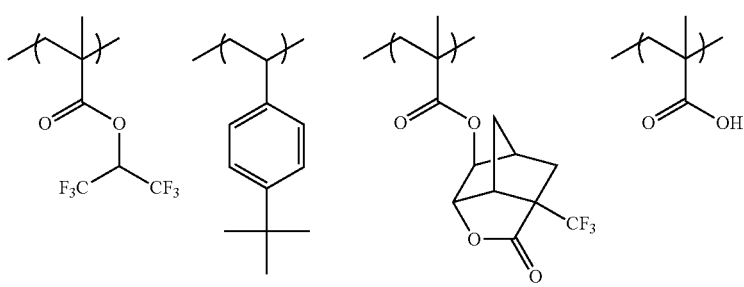
(C-24)

<Resist Preparation>

Each set of components shown in Table 2 was dissolved in the solvent to prepare a solution having a solid concentration of 7% by mass. This solution was filtered through a 0.1-μm polyethylene filter to prepare a positive resist solution. The positive resist compositions prepared were evaluated by the following methods. The results obtained are shown in the following table. In the table, with respect to each component composed of two or more compounds, the proportions of these are shown in terms of ratio by mass.

[Image Performance Test]

(Exposure Conditions (1))

Organic antireflection film ARC29A (manufactured by Nissan Chemical Industries, Ltd.) was applied to a silicon wafer and baked at 205° C. for 60 seconds to form a 78-nm antireflection film. Each of the positive resist compositions prepared was applied on the film and baked at 130° C. for 60 seconds to form a 250-nm resist film. The wafer obtained was pattern-wise exposed with an ArF excimer laser scanner (PAS 5500/1100, manufactured by ASML B.V.; NA, 0.75; $\sigma_0/\sigma_i=0.85/0.55$). Thereafter, the resist film was heated at 120° C. for 90 seconds, subsequently developed with an aqueous solution of tetramethylammonium hydroxide (2.38% by mass) for 30 seconds, rinsed with pure water, and then dried with spinning to obtain a resist pattern.

(Exposure Conditions (2))

Under the conditions (2), a resist pattern is formed by the immersion exposure method using pure water.

Organic antireflection film ARC29A (manufactured by Nissan Chemical Industries, Ltd.) was applied to a silicon wafer and baked at 205° C. for 60 seconds to form a 78-nm antireflection film. Each of the positive resist compositions prepared was applied on the film and baked at 130° C. for 60 seconds to form a 250-nm resist film. The wafer obtained was pattern-wise exposed with an ArF excimer laser immersion scanner (NA, 0.75).

Pure water was used as an immersion liquid. Thereafter, the resist film was heated at 120° C. for 60 seconds, subsequently developed with an aqueous solution of tetramethylammonium hydroxide (2.38% by mass) for 30 seconds, rinsed with pure water, and then dried with spinning to obtain resist pattern.

[Profile]

The profile of each of the patterns obtained was examined with a scanning electron microscope (S-4800, manufactured by Hitachi Ltd.) and evaluated.

[Method of Evaluating Pattern Falling]

An exposure amount necessary for reproducing a 130-nm line-and-space 1:1 mask pattern was taken as an optimal exposure amount. Each resist film was exposed in the optimal exposure amount using line-and-space 1:1 patters with dense lines and line-and-space 1:10 patterns with isolated lines. The line width of the finest mask whose pattern could be reproduced without causing pattern falling was taken as critical line width for pattern falling. The smaller the value thereof, the finer the pattern which can be reproduced without causing pattern falling. Namely, smaller values of the critical line width indicate that pattern falling is less apt to occur.

[Evaluation of Water Following-Up Properties]

Figure 2:
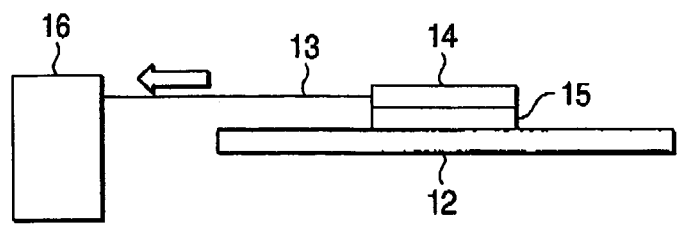
FIG. 2 is a diagrammatic view illustrating the state in which the water's property of following up a quartz plate is being evaluated.

Each resist composition prepared was applied to an 8-inch silicon wafer and baked at 115° C. for 60 seconds to form a 150-nm resist film. Subsequently, 15 mL of distilled water was poured with a pipet onto a central part of the resist-coated wafer obtained. A 10 cm-square quartz plate to which a kite string had been attached was placed on the resultant puddle of distilled water so as to result in a state in which the space between the wafer and the quartz plate was wholly filled with the distilled water. FIG. 2 diagrammatically illustrates a side view of the disposition of the resist-coated wafer, distilled water, and quartz plate which are in that state.

Subsequently, as shown in FIG. 2, the kite string attached to the quartz plate was wound around the rotating part of a motor at a rate of 1 cm/sec, with the wafer kept fixed. The motor was on for 0.5 seconds to move the quartz plate. After the quartz plate movement, the amount of the distilled water remaining under the quartz plate was judged based on the following criteria and used as an index to water following-up properties.

Figure 3A:
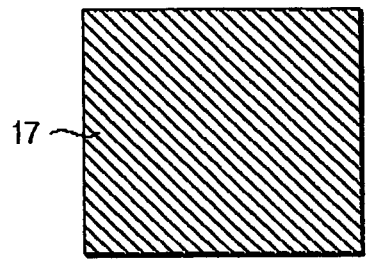
FIG. 3A to 3D are diagrammatic views illustrating the water's property of following up a quartz plate.
Figure 3B:
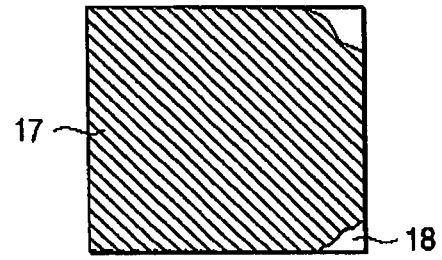
Figure 3C:
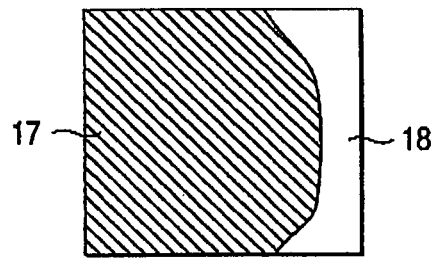
Figure 3D:
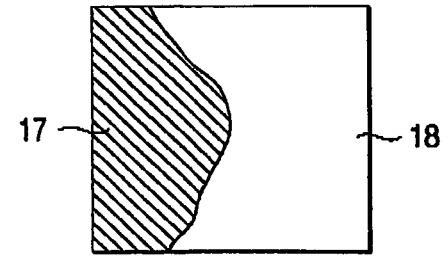

FIG. 3A to 3D diagrammatically show various patterns observed when the quartz plate was viewed from above after the quartz plate movement. Each hatched part is a region where the distilled water remained under the quartz plate, while each blank part is a region where the water was unable to follow up the quartz plate and was replaced by air. The samples in which water remained on the whole substrate surface after the quartz plate movement as shown in FIG. 3A are indicated by A; those in which air came in an area up to about 10% of the whole substrate area as shown in FIG. 3B are indicated by B; and those in which air came in an area more than about 10% of the whole substrate area as shown in FIG. 3C are indicated by C.

[Scum Generation]

Organic antireflection film ARC29A (manufactured by Nissan Chemical Industries, Ltd.) was applied to a silicon wafer and baked at 205° C. for 60 seconds to form a 78-nm antireflection film. Each positive resist solution regulated so as to have a solid concentration of 5.5% was applied on the film and baked at 115° C. for 60 seconds to form a 160-nm resist film. The wafer obtained was pattern-wise exposed with an ArF excimer laser scanner (PAS 5500/1100, manufactured by ASML B.V.; NA, 0.75; $\sigma_0/\sigma_i=0.85/0.55$). Thereafter, the resist film was heated at 120° C. for 60 seconds, subsequently developed with an aqueous solution of tetramethylammonium hydroxide (2.38% by mass) for 30 seconds, rinsed with pure water, and then dried with spinning to form a pattern.

Scum generation was evaluated based on the amount of a development residue (scum) remaining after the formation of a resist pattern having a line width of 0.15 μm. The samples in which no residue was observed are indicated by A; those in which a residue was observed considerably are indicated by C; and those intermediate between these are indicated by B.

[Measurement of Receding Contact Angle]

Each positive resist composition prepared was applied to a silicon wafer and baked at 115° C. for 60 seconds to form a 200-nm resist film. The receding contact angle of a water droplet was measured with a dynamic contact angle meter (manufactured by Kyowa Interface Science Co., Ltd.) by the spreading/contracting method. A droplet having an initial size of 7 μL was sucked for 8 seconds at a rate of 6 μL/sec. The dynamic contact angle which became stable during the suction was taken as the receding contact angle.

TABLE 2

| | | Composition | | | | | Evaluation Results | | | | | | |
|---|---|---|---|---|---|---|---|---|---|---|---|---|---|
| | | Photo- acid gener- ator | Solvent | Basic com- pound | Fluorine con- taining com- pound (C) | Surfac- tant | Ordinary exposure | | | Immersion exposure | | | Receding contact | Water follow- ing-up |
| | Resin (2g) | (mg) | (mass ratio) | (mg) | (mg) | (mg) | Profile | Falling | Scum | Profile | Falling | Scum | angle | property |
| Ex.1 | 1 | z2 (80) | SL-1/SL-2 60/40 | N-5 (7) | C-1 (2) | W-1 (3) | rec- tangular | 55 | A | rec- tangular | 60 | A | 67 | A |

TABLE 2-continued

| | | | Composition | | | | Evaluation Results | | | | | | | |
|---|---|---|---|---|---|---|---|---|---|---|---|---|---|---|
| | | Photo-acid generator | Solvent | Basic compound | Fluorine containing compound (C) | Surfactant | Ordinary exposure | | | Immersion exposure | | | Receding contact angle | Water following-up property |
| | Resin (2g) | (mg) | (mass ratio) | (mg) | (mg) | (mg) | Profile | Falling | Scum | Profile | Falling | Scum | | |
| Ex.2 | 2 | z51 (100) | SL-2/SL-4/SL-6 40/59/1 | N-6 (10) | C-2 (2) | W-4 (3) | rec-tangular | 60 | A | rec-tangular | 60 | A | 65 | A |
| Ex.3 | 3 | z2/z62 (20/100) | SL-2/SL-4 70/30 | N-3 (6) | C-1 (2) | W-6 (3) | rec-tangular | 55 | A | rec-tangular | 55 | A | 67 | A |
| Ex.4 | 4 | z55/z65 (20/100) | SL-2/SL-4 60/40 | — | C-1 (5) | — | T-top | 65 | A | T-top | 65 | A | 67 | A |
| Ex.5 | 5 | z55/z51 (20/80) | SL-3/SL-4 30/70 | N-6 (10) | C-2 (1) | W-6 (4) | rec-tangular | 60 | A | rec-tangular | 60 | A | 66 | A |
| Ex.6 | 6 | z44/z65 (25/80) | SL-2/SL-4/SL-5 40/58/2 | N-1 (7) | C-3 (5) | W-6 (4) | rec-tangular | 55 | A | rec-tangular | 55 | A | 70 | A |
| Ex.7 | 7 | z55/z47 (30/60) | SL-1/SL-2 60/40 | N-4 (13) | C-2 (10) | W-6 (4) | rec-tangular | 60 | A | rec-tangular | 60 | A | 66 | A |
| Ex.8 | 8 | z65 (100) | SL-1/SL-2 60/40 | N-3 (6) | C-4 (3) | W-2 (3) | rec-tangular | 55 | A | rec-tangular | 55 | A | 66 | A |
| Ex.9 | 9 | z44/z65 (50/50) | SL-2/SL-4/SL-6 40/59/1 | N-2 (9) | C-3 (3) | W-3 (3) | T-top | 55 | A | T-top | 55 | A | 70 | A |
| Ex.10 | 10 | z51 (100) | SL-2/SL-4 70/30 | N-5 (7) | C-6 (3) | W-5 (3) | rec-tangular | 65 | A | rec-tangular | 65 | A | 65 | A |
| Ex.11 | 11 | z55/z65 (40/60) | SL-2/SL-4 60/40 | N-1 (7) | C-5 (3) | W-4 (3) | rec-tangular | 70 | A | rec-tangular | 70 | A | 65 | A |
| Ex.12 | 12 | z55/z65 (20/80) | SL-1/SL-2 50/50 | N-3 (6) | C-1 (3) | W-1 (3) | rec-tangular | 55 | A | rec-tangular | 60 | A | 66 | A |
| Ex.13 | 13 | z37 (110) | SL-1/SL-2 30/70 | N-5 (7) | C-5 (2) | W-1 (5) | T-top | 70 | A | round top | 70 | A | 65 | A |
| Ex.14 | 14 | z62 (120) | SL-2/SL-4/SL-6 40/59/1 | N-1 (7) | C-3 (2) | W-4 (5) | T-top | 55 | A | round top | 55 | A | 65 | A |
| Ex.15 | 15 | z55/z51 (40/60) | SL-2/SL-4 60/40 | N-3 (6) | C-2 (2) | W-6 (5) | T-top | 60 | A | round top | 60 | A | 65 | A |
| Ex.16 | 16 | z65/z9 (100/10) | SL-2/SL-4 60/40 | — | C-3 (3) | W-1 (5) | rec-tangular | 55 | B | rec-tangular | 55 | B | 69 | A |
| Ex.17 | 17 | z66 (100) | SL-1/SL-2 60/40 | N-5 (7) | C-1 (2) | W-1 (5) | rec-tangular | 55 | A | rec-tangular | 55 | A | 67 | A |
| Ex.18 | 18 | z16 (90) | SL-2/SL-4/SL-6 40/59/1 | N-6 (10) | C-4 (2) | W-4 (5) | round top | 55 | A | round top | 55 | A | 66 | A |
| Ex.19 | 19 | z55 (80) | SL-2/SL-4 70/30 | N-3 (6) | C-2 (3) | W-6 (5) | round top | 60 | A | round top | 60 | A | 66 | A |
| Ex.20 | 20 | z51 (100) | SL-2/SL-4 70/30 | — | C-1 (2) | — | round top | 55 | B | round top | 55 | B | 67 | A |
| Com. Ex.1 | 1 | z2 (80) | SL-1/SL-2 60/40 | N-5 (7) | — | W-1 (5) | T-top | 100 | C | round top | 100 | C | 55 | C |
| Ex.21 | 1 | z2 (80) | SL-1/SL-2 60/40 | N-5 (7) | C-1 (10) | W-1 (3) | rec-tangular | 57 | A | rec-tangular | 60 | A | 70 | A |
| Ex.22 | 2 | z2 (80) | SL-2/SL-4 70/30 | N-6 (10) | C-7 (10) | W-4 (3) | rec-tangular | | | rec-tangular | 60 | A | 67 | A |
| Ex.23 | 3 | z2/z62 (20/100) | SL-3/SL-4 30/70 | N-1 (7) | C-8 (20) | W-1 (3) | rec-tangular | 62 | A | rec-tangular | 62 | A | 72 | A |
| Ex.24 | 4 | z2/z62 (20/100) | SL-3/SL-4 30/70 | N-1 (7) | C-8 (120) | W-1 (3) | T-top | 75 | A | T-top | 75 | A | 76 | A |
| Ex.25 | 5 | z55/z51 (20/80) | SL-2/SL-4 60/40 | N-5 (7) | C-9 (50) | W-2 (5) | rec-tangular | 55 | A | rec-tangular | 55 | A | 70 | A |
| Ex.26 | 6 | z44/z65 (25/80) | SL-2/SL-4/SL-5 40/58/2 | N-1 (7) | C-10 (10) | W-4 (4) | rec-tangular | 60 | A | rec-tangular | 65 | A | 72 | A |
| Com. Ex.2 | 1 | z2 (80) | SL-1/SL-2 60/40 | N-5 (7) | — | — | T-top | 100 | C | round top | 100 | C | 55 | C |
| Ex.27 | 24 | z23/z55 (10/70) | SL-2/SL-4 60/40 | N-3 (7) | C-11 (40) | W-4 (2) | rec-tangular | 55 | A | rec-tangular | 55 | A | 65 | A |
| Ex.28 | 25 | z17/z55 (15/70) | SL-2/SL-4 60/40 | N-3 (6) | C-12 (30) | W-2 (2) | rec-tangular | 55 | A | rec-tangular | 55 | A | 70 | A |
| Ex.29 | 16 | z12 (70) | SL-1/SL-2 40/60 | N-5/N-1 (7/7) | C-13 (20) | W-1 (2) | rec-tangular | 60 | A | rec-tangular | 60 | A | 69 | A |
| Ex.30 | 22 | z55/z51 (40/50) | SL-1/SL-2 40/60 | N-3 (7) | C-14 (20) | W-2 (3) | rec-tangular | 55 | A | rec-tangular | 55 | A | 70 | A |

TABLE 2-continued

| | | Composition | | | | | Evaluation Results | | | | | | |
|---|---|---|---|---|---|---|---|---|---|---|---|---|---|
| | | Photo-acid generator | Solvent | Basic compound | Fluorine containing compound (C) | Surfactant | Ordinary exposure | | | Immersion exposure | | | Receding contact angle | Water following-up property |
| | Resin (2g) | (mg) | (mass ratio) | (mg) | (mg) | (mg) | Profile | Falling | Scum | Profile | Falling | Scum | | |
| Ex.31 | 3 | z17 (100) | SL-3 100 | N-5/N-1 (7/7) | C-15 (5) | W-1 (2) | rectangular | 60 | A | rectangular | 60 | A | 65 | A |
| Ex.32 | 23 | z23/z55 (5/75) | SL-2/SL-4 60/40 | N-3 (6) | C-16 (20) | W-4 (3) | rectangular | 55 | B | rectangular | 55 | B | 77 | A |
| Ex.33 | 3 | z4 (65) | SL-2/SL-4 60/40 | N-5/N-1 (7/7) | C-17 (20) | W-1 (2) | rectangular | 55 | A | rectangular | 60 | A | 70 | A |
| Ex.34 | 22 | z5 (75) | SL-2/SL-4/SL-6 40/59/1 | N-3 (6) | C-18 (20) | W-2 (2) | rectangular | 55 | A | rectangular | 55 | A | 67 | A |
| Ex.35 | 3 | z17/z55 (15/70) | SL-1/SL-2 40/60 | N-4 (12) | C-19 (20) | W-2 (3) | rectangular | 55 | A | rectangular | 55 | A | 70 | A |
| Ex.36 | 24 | z68 (120) | SL-2/SL-4 60/40 | N-3 (6) | C-20 (40) | W-1 (2) | rectangular | 55 | A | rectangular | 55 | A | 70 | A |
| Ex.37 | 3 | z55 (80) | SL-2/SL-4/SL-6 40/59/1 | N-3 (6) | C-21 (100) | W-4 (2) | rectangular | 55 | A | rectangular | 60 | A | 70 | A |
| Ex.38 | 26 | z2 (80) | SL-2 100 | N-7 (7) | C-22 (10) | W-3 (2) | rectangular | 55 | A | rectangular | 55 | A | 69 | A |
| Ex.39 | 24 | z2 (80) | SL-1 100 | N-7 (7) | C-23 (20) | W-1 (2) | rectangular | 60 | A | rectangular | 60 | A | 70 | A |
| Ex.40 | 27 | z23/z74 (50/50) | SL-2/SL-5 60/40 | N-3 (6) | C-16 (60) | W-1 (2) | rectangular | 60 | A | rectangular | 60 | A | 65 | A |
| Ex.41 | 28 | z2/z42 (50/40) | SL-2/SL-5 60/40 | N-3 (6) | C-24 (40) | W-1 (2) | rectangular | 55 | A | rectangular | 55 | A | 65 | A |
| Ex.42 | 29 | z2 (80) | SL-2/SL-3 60/40 | N-7 (7) | C-11 (100) | W-1 (2) | rectangular | 55 | A | rectangular | 55 | A | 68 | A |
| Ex.43 | 30 | z2/z15 (50/75) | SL-2/SL-3 60/40 | N-4 (6) | C-12 (40) | W-1 (3) | rectangular | 55 | A | rectangular | 55 | A | 70 | A |
| Ex.44 | 31 | z30/z12 (50/75) | SL-2 100 | N-8 (7) | C-24 (40) | W-1 (2) | rectangular | 55 | A | rectangular | 55 | A | 70 | A |

The symbols used in Table 2 have the following meanings.

The acid generators correspond to those shown hereinabove as examples.

N-1: N,N-dibutylaniline
N-2: N,N-dihexylaniline
N-3: 2,6-diisopropylaniline
N-4: tri-n-octylamine
N-5: N,N-dihydroxyethylaniline
N-6: 2,4,5-triphenylimidazole
N-7: tris(methoxyethoxyethyl)amine
N-8: 2-phenylbenzoimidazole
W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
W-3: polysiloxane polymer KP-341 (manufactured by Shin-Etsu Chemical Co., Ltd.) (silicone)
W-4: Troysol S-366 (manufactured by Troy Chemical Co., Ltd.)
W-5: PF 656 (manufactured by OMNOVA Inc.) (fluorochemical)
W-6: PF 6320 (manufactured by OMNOVA Inc.) (fluorochemical)
SL-1: cyclohexanone
SL-2: propylene glycol monomethyl ether acetate
SL-3: ethyl lactate
SL-4: propylene glycol monomethyl ether
SL-5: γ-butyrolactone
SL-6: propylene carbonate Examples 45 to 51 and Comparative Examples 3 and 4

(1) Formation of Lower Resist Layer

To a 6-inch silicon wafer was applied FHi-028DD resist (resist for i-line; manufactured by FujiFilm Olin Co., Ltd.) with spin coater Mark 8, manufactured by Tokyo Electron Ltd. The coating was baked at 90° C. for 90 seconds to obtain an even film having a thickness of 0.55 μm.

This film was further heated at 200° C. for 3 minutes to form a lower resist layer having a thickness of 0.40 μm.

(2) Formation of Upper Resist Layer

Each set of components shown in Table 3 was dissolved in the solvent to prepare a solution having a solid concentration of 11% by mass. This solution was subjected to microfiltration through a membrane filter having an opening diameter of 0.1 μm. Thus, upper-resist compositions were prepared. Each of the upper-resist compositions was applied to the lower resist layer in the same manner as for the lower layer, and the coating was heated at 130° C. for 90 seconds to form an upper resist layer having a thickness of 0.20 μm.

Resins (SI-1) to (SI-5) shown in Table 3 are as follows.

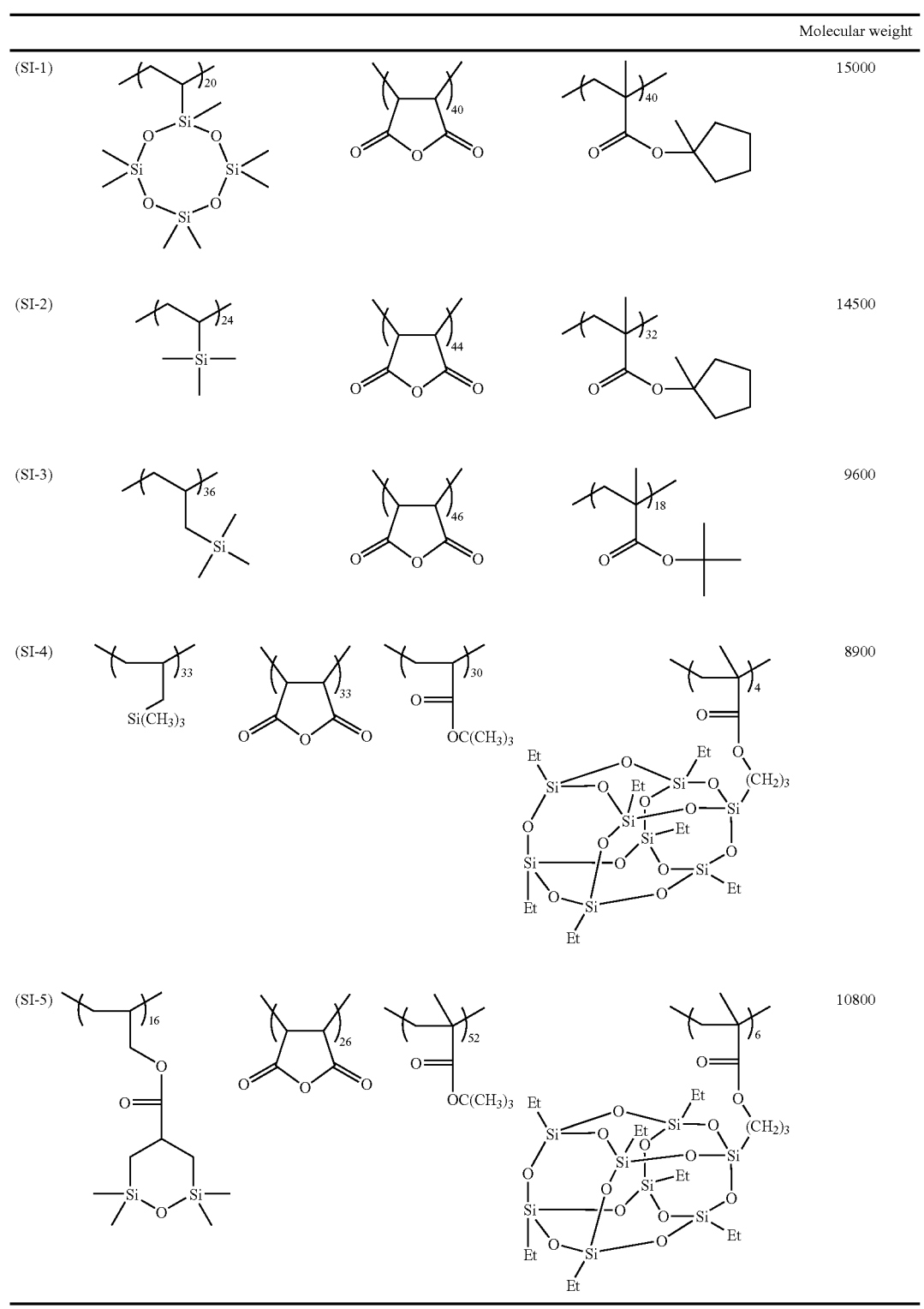

(3) Resist Evaluation

Each of the wafers thus obtained was exposed to light with an ArF excimer stepper 9300, manufactured by ISI, having a resolution mask attached thereto, while changing the exposure amount.

Subsequently, the resist was heated at 120° C. for 90 seconds, thereafter developed with a tetramethylammonium hydroxide developing solution (2.38% by mass) for 60 seconds, rinsed with distilled water, and dried to form an upper-layer pattern.

The pattern obtained was evaluated in the same manners as in Example 1. The evaluation results obtained are shown in Table 3.

TABLE 3

| | Resin (2g) | Photo-acid generator (mg) | Solvent (mass ratio) | Basic compound (mg) | Fluorine-containing compound (C) (mg) | Surfactant (mg) | Ordinary exposure Profile | Ordinary exposure Falling | Ordinary exposure Scum | Immersion exposure Profile | Immersion exposure Falling | Immersion exposure Scum | Receding contact angle | Water following-up property |
|---|---|---|---|---|---|---|---|---|---|---|---|---|---|---|
| Ex.45 | SI-1 | z2 (80) | SL-2/SL-4 70/30 | N-1 (7) | C-1 (2) | W-1 (5) | rectangular | 55 | A | rectangular | 55 | A | 68 | A |
| Ex.46 | SI-2 | z2/z51 (20/100) | SL-2/SL-4/SL-6 40/59/1 | N-3 (6) | C-2 (2) | W-3 (3) | rectangular | 60 | A | rectangular | 60 | A | 67 | A |
| Ex.47 | SI-3 | z65 (100) | SL-2/SL-4 60/40 | N-5 (7) | C-1 (2) | W-1 (5) | rectangular | 55 | A | rectangular | 55 | A | 68 | A |
| Ex.48 | SI-4 | z2 (100) | SL-2/SL-4 60/40 | N-3 (10) | C-3 (3) | W-6 (5) | rectangular | 55 | A | rectangular | 55 | A | 72 | A |
| Ex.49 | SI-5 | z55 (80) | SL-2/SL-4 70/30 | N-1 (7) | C-4 (2) | W-1 (5) | rectangular | 55 | A | rectangular | 55 | A | 71 | A |
| Com. Ex.3 | SI-1 | z2 (80) | SL-1/SL-2 60/40 | N-5 (7) | — | W-1 (5) | T-top | 100 | C | round top | 100 | C | 55 | C |
| Ex.50 | SI-1 | z2 (80) | SL-3/SL-4 30/70 | N-1 (7) | C-8 (50) | W-1 (5) | rectangular | 55 | A | rectangular | 55 | A | 68 | A |
| Ex.51 | SI-4 | z2 (80) | SL-2/SL-4/SL-6 40/59/1 | N-3 (6) | C-10 (5) | W-2 (3) | rectangular | 60 | A | rectangular | 60 | A | 67 | A |
| Com. Ex.4 | SI-1 | z2 (80) | SL-1/SL-2 60/40 | N-5 (7) | — | — | T-top | 100 | C | round top | 100 | C | 55 | C |

It can be seen from those results that the resist compositions of the invention are excellent in profile, unsusceptibility to pattern falling and scum generation, receding contact angle, and water following-up properties with respect to each of ordinary exposure, immersion exposure, and multilayered resists.

The invention can provide a positive resist composition which is satisfactory in pattern profile, pattern falling, and scum performance, is excellent in the receding contact angle of an immersion liquid, and is suitable also for immersion exposure. The invention can further provide a method of pattern formation with the composition.

The entire disclosure of each and every foreign patent application from which the benefit of foreign priority has been claimed in the present application is incorporated herein by reference, as if fully set forth.

What is claimed is:

1. A positive resist composition comprising:
   (A) a resin which comes to have an enhanced solubility in an alkaline developing solution by an action of an acid, wherein the resin (A) has no fluorine atom, wherein the resin (A) does not have an aromatic group;
   (B) a compound which generates an acid upon irradiation with actinic rays or a radiation;
   (C) a fluorine-containing compound, wherein the fluorine-containing compound (C) is a resin, containing at least one group selected from the groups (x) to (z):
   (x) an alkali-soluble group;
   (y) a group which decomposes by an action of an alkaline developing solution to enhance a solubility in an alkaline developing solution; and
   (z) a group which decomposes by an action of an acid; and
   (F) a solvent,
   wherein:
   the amount of the fluorine-containing compound (C) added is from 0.1 to 30% by mass based on all solid components of the positive resist composition;
   the fluorine-containing compound (C) has a structure represented by formula (F3) and the compound (C) is a compound containing a branched alkyl group substituted by at least one fluorine atom:

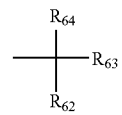

(F3)

wherein $R_{62}$ and $R_{63}$ each independently represents a fluoroalkyl group, provided that $R_{62}$ and $R_{63}$ may be bonded to each other to form a ring; and
$R_{64}$ represents a hydrogen atom, a fluorine atom or an alkyl group; and
the amount of the resin (A) added to the positive resist composition is 50 to 99.7% by mass based on all solid components of the positive resist composition.

2. The positive resist composition according to claim 1, wherein the fluorine-containing compound (C) is an alkali-soluble compound containing an alkyl group having a fluorine atom and 1 to 4 carbon atoms or a cycloalkyl group having a fluorine atom.

3. The positive resist composition according to claim 1, wherein the fluorine-containing compound (C) has an alcoholic hydroxyl group, and an alcohol moiety for the alcoholic hydroxyl group is a fluorinated alcohol.

4. The positive resin composition according to claim 1, wherein the group (y) which decomposes by an action of an alkaline developing solution to enhance a solubility in an alkaline developing solution has a lactone structure.

5. The positive resist composition according to claim 1, wherein the fluorine-containing compound (C) is one of (C-1) to (C-13):
(C-1) a resin comprising:
   a repeating unit (a) having a fluoroalkyl group; and
   a repeating unit (X) containing an alkali-soluble group (x);

(C-2) a resin comprising:
    a repeating unit (a) having a fluoroalkyl group; and
    a repeating unit (Y) containing a group (y) decomposing by an action of an alkaline developing solution to enhance a solubility in an alkaline developing solution;
(C-3) a resin comprising:
    a repeating unit (a) having a fluoroalkyl group; and
    a repeating unit (Z) containing a group (z) decomposing by an action of an acid;
(C-4) a resin comprising:
    a repeating unit (a) having a fluoroalkyl group;
    a repeating unit (X) containing an alkali-soluble group (x); and
    a repeating unit (Y) containing a group (y) decomposing by an action of an alkaline developing solution to enhance a solubility in an alkaline developing solution;
(C-5) a resin comprising:
    a repeating unit (a) having a fluoroalkyl group;
    a repeating unit (X) containing an alkali-soluble group (x); and
    a repeating unit (Z) containing a group (z) decomposing by an action of an acid;
(C-6) a resin comprising:
    a repeating unit (a) having a fluoroalkyl group;
    a repeating unit (Y) containing a group (y) decomposing by an action of an alkaline developing solution to enhance a solubility in an alkaline developing solution; and
    a repeating unit (Z) containing a group (z) decomposing by an action of an acid;
(C-7) a resin comprising:
    a repeating unit (a) having a fluoroalkyl group;
    a repeating unit (X) containing an alkali-soluble group (x);
    a repeating unit (Y) containing a group (y) decomposing by an action of an alkaline developing solution to enhance a solubility in an alkaline developing solution; and
    a repeating unit (Z) containing a group (z) decomposing by an action of an acid;
(C-8) a resin comprising:
    a repeating unit (aX) containing both an alkali-soluble group (x) and a fluoroalkyl group;
(C-9) a resin comprising:
    a repeating unit (bY) containing both a group (y) decomposing by an action of an alkaline developing solution to enhance a solubility in an alkaline developing solution and a fluoroalkyl group;
(C-10) a resin comprising:
    a repeating unit (aX) containing both an alkali-soluble group (x) and a fluoroalkyl group having 1 to 4 carbon atoms; and
    a repeating unit (Y) containing a group (y) decomposing by an action of an alkaline developing solution to enhance a solubility in an alkaline developing solution;
(C-11) a resin comprising:
    a repeating unit (aX) containing both an alkali-soluble group (x) and a fluoroalkyl group; and
    a repeating unit (Z) containing a group (z) decomposing by an action of an acid;
(C-12) a resin comprising:
    a repeating unit (a) having a fluoroalkyl group; and
    a repeating unit (aX) containing both an alkali-soluble group (x) and a fluoroalkyl group; and
(C-13) a resin comprising:
    a repeating unit (a) having a fluoroalkyl group; and
    a repeating unit (aY) containing both a group (y) decomposing by an action of an alkaline developing solution to enhance a solubility in an alkaline developing solution and a fluoroalkyl group.

6. The positive resist composition according to claim 1, wherein the fluorine-containing compound (C) has a molecular weight of from 1,000 to 100,000.

7. The positive resist composition according to claim 1, wherein the amount of the fluorine-containing compound (C) added is from 0.1 to 5% by mass based on all solid components of the positive resist composition.

8. The positive resist composition according to claim 1, which provides a film with which water has a receding contact angle of 65° or larger.

9. The positive resist composition according to claim 1, which provides a film with which water has a receding contact angle of 70° or larger.

10. The positive resist composition according to claim 1, wherein the resin (A) contains a repeating unit having a polycyclic hydrocarbon group substituted by a hydroxyl group or a cyano group.

11. The positive resist composition according to claim 1, wherein the resin (A) is a copolymer comprising at least three components: a (meth)acrylate repeating unit having a lactone ring; a (meth)acrylate repeating unit having an organic group having at least one of a hydroxyl group and a cyano group; and a (meth)acrylate repeating unit having an acid-decomposable group.

12. The positive resist composition according to claim 1, wherein the compound (B) which generates an acid upon irradiation with actinic rays or a radiation is a compound which generates an acid having a fluoroalkyl chain or a benzenesulfonic acid having a fluorine atom upon irradiation with actinic rays.

13. The positive resist composition according to claim 1, wherein the compound (B) which generates an acid upon irradiation with actinic rays or a radiation is a triphenylsulfonium salt compound having an alkyl or cycloalkyl residue which has not been substituted by fluorine in a cation part.

14. The positive resist composition according to claim 1, wherein the solvent (F) is a mixed solvent comprising two or more solvents including propylene glycol monomethyl ether acetate.

15. The positive resist composition according to claim 1, which further comprises at least one of a fluorochemical surfactant and a silicone surfactant.

16. The positive resist composition according to claim 1, which has a total solid concentration of from 1.0 to 6.0% by mass.

17. The positive resist composition according to claim 1, wherein the solvent (F) contains a solvent having no hydroxyl group.

18. The positive resist composition according to claim 17, wherein the solvent (F) contains γ-butyrolactone.

19. The positive resist composition according to claim 1, wherein the solvent (F) contains propylene carbonate.

20. The positive resist composition according to claim 1, wherein the amount of the fluorine-containing compound (C) added is from 0.1 to 10% by mass based on all solid components of the positive resist composition.

21. A method of pattern formation, which comprises:
    forming a resist film from a positive resist composition according to claim 1;
    exposing the resist film to light; and
    developing the resist film.

22. The method of pattern formation according to claim 21, wherein the resist film is exposed to light having a wavelength of from 1 to 200 nm.

23. The method of pattern formation according to claim 21, wherein the exposure is immersion exposure in which the resist film is exposed to light through an immersion liquid.

24. The method of pattern formation according to claim 21, wherein the resist film is exposed to light having a wavelength of 193 nm.

25. A positive resist composition comprising:
(A) a resin which comes to have an enhanced solubility in an alkaline developing solution by an action of an acid, wherein the resin (A) does not have an aromatic group;
(B) a compound which generates an acid upon irradiation with actinic rays or a radiation;
(C) a fluorine-containing compound, wherein the fluorine-containing compound is a resin, containing at least one group selected from the groups (x) to (z):
  (x) an alkali-soluble group;
  (y) a group which decomposes by an action of an alkaline developing solution to enhance a solubility in an alkaline developing solution; and
  (z) a group which decomposes by an action of an acid; and
(F) a solvent,
wherein:
the amount of the fluorine-containing compound (C) added is from 0.1 to 5% by mass based on all solid components of the positive resist composition;
the fluorine-containing compound (C) has a structure represented by formula (F3):

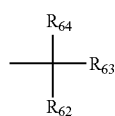

wherein $R_{62}$ and $R_{63}$ each independently represents a fluoroalkyl group, provided that $R_{62}$ and $R_{63}$ may be bonded to each other to form a ring; and
$R_{64}$ represents a hydrogen atom, a fluorine atom or an alkyl group; and
the amount of the resin (A) added to the positive resist composition is 50 to 99.7% by mass based on all solid components of the positive resist composition.

26. The positive resist composition according to claim 25, wherein the fluorine-containing compound (C) is an alkali-soluble compound containing an alkyl group having a fluorine atom and 1 to 4 carbon atoms or a cycloalkyl group having a fluorine atom.

27. The positive resist composition according to claim 25, wherein the fluorine-containing compound (C) has an alcoholic hydroxyl group, and an alcohol moiety for the alcoholic hydroxyl group is a fluorinated alcohol.

28. The positive resin composition according to claim 25, wherein the group (y) which decomposes by an action of an alkaline developing solution to enhance a solubility in an alkaline developing solution has a lactone structure.

29. The positive resist composition according to claim 25, wherein the fluorine-containing compound (C) is one of (C-1) to (C-13):
(C-1) a resin comprising:
  a repeating unit (a) having a fluoroalkyl group; and
  a repeating unit (X) containing an alkali-soluble group (x);
(C-2) a resin comprising:
  a repeating unit (a) having a fluoroalkyl group; and
  a repeating unit (Y) containing a group (y) decomposing by an action of an alkaline developing solution to enhance a solubility in an alkaline developing solution;
(C-3) a resin comprising:
  a repeating unit (a) having a fluoroalkyl group; and
  a repeating unit (Z) containing a group (z) decomposing by an action of an acid;
(C-4) a resin comprising:
  a repeating unit (a) having a fluoroalkyl group;
  a repeating unit (X) containing an alkali-soluble group (x); and
  a repeating unit (Y) containing a group (y) decomposing by an action of an alkaline developing solution to enhance a solubility in an alkaline developing solution;
(C-5) a resin comprising:
  a repeating unit (a) having a fluoroalkyl group;
  a repeating unit (X) containing an alkali-soluble group (x); and
  a repeating unit (Z) containing a group (z) decomposing by an action of an acid;
(C-6) a resin comprising:
  a repeating unit (a) having a fluoroalkyl group;
  a repeating unit (Y) containing a group (y) decomposing by an action of an alkaline developing solution to enhance a solubility in an alkaline developing solution; and
  a repeating unit (Z) containing a group (z) decomposing by an action of an acid;
(C-7) a resin comprising:
  a repeating unit (a) having a fluoroalkyl group;
  a repeating unit (X) containing an alkali-soluble group (x);
  a repeating unit (Y) containing a group (y) decomposing by an action of an alkaline developing solution to enhance a solubility in an alkaline developing solution; and
  a repeating unit (Z) containing a group (z) decomposing by an action of an acid;
(C-8) a resin comprising:
  a repeating unit (aX) containing both an alkali-soluble group (x) and a fluoroalkyl group;
(C-9) a resin comprising:
  a repeating unit (bY) containing both a group (y) decomposing by an action of an alkaline developing solution to enhance a solubility in an alkaline developing solution and a fluoroalkyl group;
(C-10) a resin comprising:
  a repeating unit (aX) containing both an alkali-soluble group (x) and a fluoroalkyl group having 1 to 4 carbon atoms; and
  a repeating unit (Y) containing a group (y) decomposing by an action of an alkaline developing solution to enhance a solubility in an alkaline developing solution;
(C-11) a resin comprising:
  a repeating unit (aX) containing both an alkali-soluble group (x) and a fluoroalkyl group; and
  a repeating unit (Z) containing a group (z) decomposing by an action of an acid;
(C-12) a resin comprising:
  a repeating unit (a) having a fluoroalkyl group; and
  a repeating unit (aX) containing both an alkali-soluble group (x) and a fluoroalkyl group; and (C-13) a resin comprising:
  a repeating unit (a) having a fluoroalkyl group; and
  a repeating unit (aY) containing both a group (y) decomposing by an action of an alkaline developing solution to enhance a solubility in an alkaline developing solution and a fluoroalkyl group.

30. The positive resist composition according to claim 25, wherein the fluorine-containing compound (C) has a molecular weight of from 1,000 to 100,000.

31. The positive resist composition according to claim 25, which provides a film with which water has a receding contact angle of 65° or larger.

32. The positive resist composition according to claim 25, which provides a film with which water has a receding contact angle of 70° or larger.

33. The positive resist composition according to claim 25, wherein the resin (A) contains a repeating unit having a polycyclic hydrocarbon group substituted by a hydroxyl group or a cyano group.

34. The positive resist composition according to claim 25, wherein the resin (A) is a copolymer comprising at least three components: a (meth)acrylate repeating unit having a lactone ring; a (meth)acrylate repeating unit having an organic group having at least one of a hydroxyl group and a cyano group; and a (meth)acrylate repeating unit having an acid-decomposable group.

35. The positive resist composition according to claim 25, wherein the compound (B) which generates an acid upon irradiation with actinic rays or a radiation is a compound which generates an acid having a fluoroalkyl chain or a benzenesulfonic acid having a fluorine atom upon irradiation with actinic rays.

36. The positive resist composition according to claim 25, wherein the compound (B) which generates an acid upon irradiation with actinic rays or a radiation is a triphenylsulfonium salt compound having an alkyl or cycloalkyl residue which has not been substituted by fluorine in a cation part.

37. The positive resist composition according to claim 25, wherein the solvent (F) is a mixed solvent comprising two or more solvents including propylene glycol monomethyl ether acetate.

38. The positive resist composition according to claim 25, which further comprises at least one of a fluorochemical surfactant and a silicone surfactant.

39. The positive resist composition according to claim 25, which has a total solid concentration of from 1.0 to 6.0% by mass.

40. A method of pattern formation, which comprises:
  forming a resist film from a positive resist composition according to claim 25;
  exposing the resist film to light; and
  developing the resist film.

41. The method of pattern formation according to claim 40, wherein the resist film is exposed to light having a wavelength of from 1 to 200 nm.

42. The method of pattern formation according to claim 40, wherein the exposure is immersion exposure in which the resist film is exposed to light through an immersion liquid.

43. The method of pattern formation according to claim 40, wherein the resist film is exposed to light having a wavelength of 193 nm.

44. The positive resist composition according to claim 25, wherein the solvent (F) contains a solvent having no hydroxyl group.

45. The positive resist composition according to claim 44, wherein the solvent (F) contains γ-butyrolactone.

46. The positive resist composition according to claim 25, wherein the solvent (F) contains propylene carbonate.

47. A positive resist composition comprising:
(A) a resin which comes to have an enhanced solubility in an alkaline developing solution by an action of an acid, wherein the resin (A) has no fluorine atom, wherein the resin (A) does not have an aromatic group;
(B) a compound which generates an acid upon irradiation with actinic rays or a radiation;
(C) a fluorine-containing compound, wherein the fluorine-containing compound (C) is a resin, containing at least one group selected from the groups (x) to (z):
  (x) an alkali-soluble group;
  (y) a group which decomposes by an action of an alkaline developing solution to enhance a solubility in an alkaline developing solution; and
  (z) a group which decomposes by an action of an acid; and
(F) a solvent,
wherein:
the amount of the fluorine-containing compound (C) added is from 0.1 to 30% by mass based on all solid components of the positive resist composition;
the fluorine-containing compound (C) is one of (C-3) and (C-5) to (C-13):
(C-3) a resin comprising:
  a repeating unit (a) having a fluoroalkyl group; and
  a repeating unit (Z) containing a group (z) decomposing by an action of an acid;
  a repeating unit (Y) containing a group (y) decomposing by an action of an alkaline developing solution to enhance a solubility in an alkaline developing solution;
(C-5) a resin comprising:
  a repeating unit (a) having a fluoroalkyl group;
  a repeating unit (X) containing an alkali-soluble group (x); and
  a repeating unit (Z) containing a group (z) decomposing by an action of an acid;
(C-6) a resin comprising:
  a repeating unit (a) having a fluoroalkyl group;
  a repeating unit (Y) containing a group (y) decomposing by an action of an alkaline developing solution to enhance a solubility in an alkaline developing solution; and
  a repeating unit (Z) containing a group (z) decomposing by an action of an acid;
(C-7) a resin comprising:
  a repeating unit (a) having a fluoroalkyl group;
  a repeating unit (X) containing an alkali-soluble group (x);
  a repeating unit (Y) containing a group (y) decomposing by an action of an alkaline developing solution to enhance a solubility in an alkaline developing solution; and
  a repeating unit (Z) containing a group (z) decomposing by an action of an acid;
(C-8) a resin comprising:
  a repeating unit (aX) containing both an alkali-soluble group (x) and a fluoroalkyl group;
(C-9) a resin comprising:
  a repeating unit (bY) containing both a group (y) decomposing by an action of an alkaline developing solution to enhance a solubility in an alkaline developing solution and a fluoroalkyl group;

(C-10) a resin comprising:
- a repeating unit (aX) containing both an alkali-soluble group (x) and a fluoroalkyl group having 1 to 4 carbon atoms; and
- a repeating unit (Y) containing a group (y) decomposing by an action of an alkaline developing solution to enhance a solubility in an alkaline developing solution;

(C-11) a resin comprising:
- a repeating unit (aX) containing both an alkali-soluble group (x) and a fluoroalkyl group; and
- a repeating unit (Z) containing a group (z) decomposing by an action of an acid;

(C-12) a resin comprising:
- a repeating unit (a) having a fluoroalkyl group; and
- a repeating unit (aX) containing both an alkali-soluble group (x) and a fluoroalkyl group; and (C-13) a resin comprising:
- a repeating unit (a) having a fluoroalkyl group; and
- a repeating unit (aY) containing both a group (y) decomposing by an action of an alkaline developing solution to enhance a solubility in an alkaline developing solution and a fluoroalkyl group; and
- the amount of the resin (A) added to the positive resist composition is 50 to 99.7% by mass based on all solid components of the positive resist composition.

48. The positive resist composition according to claim 47, wherein the fluorine-containing compound (C) has a molecular weight of from 1,000 to 100,000.

49. The positive resist composition according to claim 47, wherein the amount of the fluorine-containing compound (C) added is from 0.1 to 10% by mass based on all solid components of the positive resist composition.

50. A method of pattern formation, which comprises:
forming a resist film from a positive resist composition according to claim 47;
exposing the resist film to light; and
developing the resist film.

51. The method of pattern formation according to claim 50, wherein the exposure is immersion exposure in which the resist film is exposed to light through an immersion liquid.

52. A positive resist composition comprising:
(A) a resin which comes to have an enhanced solubility in an alkaline developing solution by an action of an acid, wherein the resin (A) has no fluorine atom, wherein the resin (A) does not have an aromatic group;
(B) a compound which generates an acid upon irradiation with actinic rays or a radiation;
(C) a fluorine-containing compound, wherein the fluorine-containing compound (C) is a resin, containing at least one group (z):
  (z) a group which decomposes by an action of an acid; and
(F) a solvent,
wherein:
the amount of the fluorine-containing compound (C) added is from 0.1 to 30% by mass based on all solid components of the positive resist composition;
the positive resist composition has a total solid concentration of from 1.0 to 6.0% by mass; and
the amount of the resin (A) added to the positive resist composition is 50 to 99.7% by mass based on all solid components of the positive resist composition.

53. The positive resist composition according to claim 52, wherein the fluorine-containing compound (C) has a molecular weight of from 1,000 to 100,000.

54. The positive resist composition according to claim 52, wherein the amount of the fluorine-containing compound (C) added is from 0.1 to 10% by mass based on all solid components of the positive resist composition.

55. A method of pattern formation, which comprises:
forming a resist film from a positive resist composition according to claim 52;
exposing the resist film to light; and
developing the resist film.

56. The method of pattern formation according to claim 55, wherein the exposure is immersion exposure in which the resist film is exposed to light through an immersion liquid.

57. A positive resist composition comprising:
(A) a resin which comes to have an enhanced solubility in an alkaline developing solution by an action of an acid, wherein the resin (A) has no fluorine atom, wherein the resin (A) does not have an aromatic group;
(B) a compound which generates an acid upon irradiation with actinic rays or a radiation;
(C) a fluorine-containing compound, wherein the fluorine-containing compound (C) is a resin, containing at least one group (z):
  (z) a group which decomposes by an action of an acid; and
(F) a solvent,
wherein:
the amount of the fluorine-containing compound (C) added is from 0.1 to 30% by mass based on all solid components of the positive resist composition;
the degree of dispersion of the resin (C) is 2.2 or less; and
the amount of the resin (A) added to the positive resist composition is 50 to 99.7% by mass based on all solid components of the positive resist composition.

58. The positive resist composition according to claim 57, wherein the fluorine-containing compound (C) has a molecular weight of from 1,000 to 100,000.

59. The positive resist composition according to claim 57, wherein the amount of the fluorine-containing compound (C) added is from 0.1 to 10% by mass based on all solid components of the positive resist composition.

60. A method of pattern formation, which comprises:
forming a resist film from a positive resist composition according to claim 57;
exposing the resist film to light; and
developing the resist film.

61. The method of pattern formation according to claim 60, wherein the exposure is immersion exposure in which the resist film is exposed to light through an immersion liquid.

62. A positive resist composition comprising:
(A) a resin which comes to have an enhanced solubility in an alkaline developing solution by an action of an acid, wherein the resin (A) has no fluorine atom, wherein the resin (A) does not have an aromatic group;
(B) a compound which generates an acid upon irradiation with actinic rays or a radiation;
(C) a fluorine-containing compound, wherein the fluorine-containing compound (C) is a resin, containing at least one group selected from the groups (x) to (z):
  (x) an alkali-soluble group;
  (y) a group which decomposes by an action of an alkaline developing solution to enhance a solubility in an alkaline developing solution; and
  (z) a group which decomposes by an action of an acid; and (F) a solvent,
wherein:
the amount of the fluorine-containing compound (C) added is from 0.1 to 30% by mass based on all solid components of the positive resist composition;
the fluorine-containing compound (C) is an alkali-soluble compound containing an alkyl group having a fluorine atom and 1 to 4 carbon atoms, a cycloalkyl group having a fluorine atom or an aryl group having a fluorine atom;
the resin (C) has a repeating unit of the following structure:

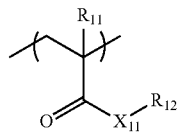

wherein:
$R_{11}$ represents a hydrogen atom, a halogen atom, or an alkyl group;
$X_{11}$ represents an oxygen atom or a group represented by —N($R_{13}$)— where $R_{13}$ represents a hydrogen atom, a linear or branched alkyl group, or a cycloalkyl group;
$R_{12}$ represents an alkyl group of 1 to 4 carbon atoms having a fluorine atom, a cycloalkyl group having a fluorine atom, or an aryl group having a fluorine atom; and
the amount of the resin (A) added to the positive resist composition is 50 to 99.7% by mass based on all solid components of the positive resist composition.

63. The positive resist composition according to claim 62, wherein the fluorine-containing compound (C) has a molecular weight of from 1,000 to 100,000.

64. The positive resist composition according to claim 62, wherein the amount of the fluorine-containing compound (C) added is from 0.1 to 10% by mass based on all solid components of the positive resist composition.

65. A method of pattern formation, which comprises:
forming a resist film from a positive resist composition according to claim 62;
exposing the resist film to light; and
developing the resist film.

66. The method of pattern formation according to claim 65, wherein the exposure is immersion exposure in which the resist film is exposed to light through an immersion liquid.

\* \* \* \* \*